(12) United States Patent
Castaneda et al.

(10) Patent No.: US 9,570,420 B2
(45) Date of Patent: Feb. 14, 2017

(54) WIRELESS COMMUNICATING AMONG VERTICALLY ARRANGED INTEGRATED CIRCUITS (ICS) IN A SEMICONDUCTOR PACKAGE

(75) Inventors: Jesus Alfonso Castaneda, Los Angeles, CA (US); Arya Reza Behzad, Poway, CA (US); Ahmadreza Rofougaran, Newport Coast, CA (US); Sam Ziqun Zhao, Irvine, CA (US); Michael Boers, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 302 days.

(21) Appl. No.: 13/248,745

(22) Filed: Sep. 29, 2011

(65) Prior Publication Data

US 2013/0082403 A1   Apr. 4, 2013

(51) Int. Cl.
*H01L 23/02* (2006.01)
*H01L 25/065* (2006.01)
(Continued)

(52) U.S. Cl.
CPC ........ *H01L 25/0657* (2013.01); *G02B 6/12002* (2013.01); *G02B 6/43* (2013.01);
(Continued)

(58) Field of Classification Search
CPC ................. H01L 25/0657; H01L 2924/15311; H01L 2224/48091; H01L 25/0652; H01L 25/0655; H01P 3/00; H01P 3/12; H01P 3/121
(Continued)

(56) References Cited

U.S. PATENT DOCUMENTS 3,562,608 A   2/1971   Gallagher et al.
4,701,763 A   10/1987  Yamamoto et al.
(Continued)

FOREIGN PATENT DOCUMENTS

CN   1585123 A   2/2005
CN   1620652 A   6/2005
(Continued)

OTHER PUBLICATIONS

European Search Report for EP Patent Application No. EP I2005567.8, European Patent Office, Munich, Germany, mailed on Nov. 5, 2012.
(Continued)

*Primary Examiner* — Yu Chen
(74) *Attorney, Agent, or Firm* — Sterne, Kessler, Goldstein & Fox P.L.L.C.

(57) ABSTRACT

Methods and apparatus are disclosed for wirelessly communicating among integrated circuits and/or functional modules within the integrated circuits. A semiconductor device fabrication operation uses a predetermined sequence of photographic and/or chemical processing steps to form one or more functional modules onto a semiconductor substrate. The functional modules are coupled to an integrated waveguide that is formed onto the semiconductor substrate and/or attached thereto to form an integrated circuit. The functional modules communicate with each other as well as to other integrated circuits using a multiple access transmission scheme via the integrated waveguide. One or more integrated circuits may be coupled to an integrated circuit carrier to form Multichip Module. The Multichip Module may be coupled to a semiconductor package to form a packaged integrated circuit.

18 Claims, 27 Drawing Sheets

(51) Int. Cl.
  *H01P 3/12*     (2006.01)
  *H01L 25/10*    (2006.01)
  *G02B 6/43*     (2006.01)
  *G02B 6/12*     (2006.01)
  *H01L 23/66*    (2006.01)
  *H01L 23/522*   (2006.01)
  *H04L 7/00*     (2006.01)
  *H01P 3/00*     (2006.01)

(52) U.S. Cl.
  CPC .......... *H01L 23/5222* (2013.01); *H01L 23/66* (2013.01); *H01L 25/0652* (2013.01); *H01L 25/0655* (2013.01); *H01L 25/105* (2013.01); *H01P 3/12* (2013.01); *H01P 3/121* (2013.01); *H04L 7/0091* (2013.01); *H01L 2223/6627* (2013.01); *H01L 2223/6677* (2013.01); *H01L 2224/16225* (2013.01); *H01L 2225/06517* (2013.01); *H01L 2225/06531* (2013.01); *H01L 2225/06572* (2013.01); *H01L 2225/1005* (2013.01); *H01L 2924/1461* (2013.01); *H01P 3/00* (2013.01)

(58) Field of Classification Search
  USPC ........ 257/E23.142, 685, 686, 723, 724, 777, 257/786; 438/108, 109, 614, 612, 666
  See application file for complete search history.

(56) References Cited

U.S. PATENT DOCUMENTS

| | | | |
|---|---|---|---|
| 5,138,436 A | 8/1992 | Koepf | |
| 5,300,875 A | 4/1994 | Tuttle | |
| 5,363,075 A | 11/1994 | Fanucchi | |
| 5,387,885 A | 2/1995 | Chi | |
| 5,568,107 A | 10/1996 | Buuck et al. | |
| 5,638,468 A | 6/1997 | Tokano et al. | |
| 5,694,134 A | 12/1997 | Barnes | |
| 5,717,943 A | 2/1998 | Barker et al. | |
| 5,760,478 A | 6/1998 | Bozso et al. | |
| 5,900,843 A | 5/1999 | Lee | |
| 5,912,598 A | 6/1999 | Stones et al. | |
| 6,005,520 A | 12/1999 | Nalbandian | |
| 6,037,743 A | 3/2000 | White et al. | |
| 6,049,639 A | 4/2000 | Paniccia et al. | |
| 6,127,799 A | 10/2000 | Krishnan | |
| 6,184,833 B1 | 2/2001 | Tran | |
| 6,236,223 B1 | 5/2001 | Brady et al. | |
| 6,285,325 B1 | 9/2001 | Nalbandian | |
| 6,340,951 B1 | 1/2002 | Sheen | |
| 6,353,264 B1 | 3/2002 | Coronel et al. | |
| 6,404,390 B2 | 6/2002 | Sheen | |
| RE38,072 E | 4/2003 | Kondo et al. | |
| 6,542,558 B1 | 4/2003 | Saitou et al. | |
| 6,597,323 B2 | 7/2003 | Teshirogi et al. | |
| 6,603,915 B2 | 8/2003 | Glebov et al. | |
| 6,661,408 B2 | 12/2003 | Chen | |
| 6,693,736 B1 | 2/2004 | Yoshimura et al. | |
| 6,700,550 B2 | 3/2004 | Crowley | |
| 6,706,546 B2* | 3/2004 | Yoshimura et al. | 438/31 |
| 6,735,630 B1 | 5/2004 | Gelvin et al. | |
| 6,771,935 B1 | 8/2004 | Leggett | |
| 6,774,867 B2 | 8/2004 | Diaz et al. | |
| 6,785,430 B2 | 8/2004 | Paniccia | |
| 6,841,842 B2 | 1/2005 | Li | |
| 6,841,981 B2 | 1/2005 | Smith et al. | |
| 6,859,114 B2 | 2/2005 | Eleftheriades et al. | |
| 6,882,239 B2 | 4/2005 | Miller | |
| 6,954,236 B1 | 10/2005 | Russell | |
| 6,983,023 B2 | 1/2006 | Osaka et al. | |
| 6,995,441 B2 | 2/2006 | Geusic et al. | |
| 7,002,517 B2 | 2/2006 | Noujeim | |
| 7,003,192 B2 | 2/2006 | Blair et al. | |
| 7,020,701 B1 | 3/2006 | Gelvin et al. | |
| 7,058,245 B2 | 6/2006 | Farahi | |
| 7,070,207 B2 | 7/2006 | Asai | |
| 7,071,888 B2 | 7/2006 | Sievenpiper | |
| 7,109,730 B2 | 9/2006 | Slupsky | |
| 7,126,554 B2 | 10/2006 | Mohamadi | |
| 7,164,156 B2* | 1/2007 | Geusic et al. | 257/84 |
| 7,199,713 B2 | 4/2007 | Barink et al. | |
| 7,209,621 B2* | 4/2007 | Glebov et al. | 385/129 |
| 7,238,548 B2 | 7/2007 | Kurita et al. | |
| 7,245,269 B2 | 7/2007 | Sievenpiper et al. | |
| 7,245,796 B2* | 7/2007 | Ouchi | 385/14 |
| 7,253,780 B2 | 8/2007 | Sievenpiper | |
| 7,259,454 B2 | 8/2007 | Tanida et al. | |
| 7,263,248 B2* | 8/2007 | Windover | H05K 1/0274 385/14 |
| 7,268,517 B2 | 9/2007 | Rahmel et al. | |
| 7,271,683 B2 | 9/2007 | Hayes et al. | |
| 7,317,342 B2 | 1/2008 | Saint-Laurent | |
| 7,324,824 B2 | 1/2008 | Smith et al. | |
| 7,330,090 B2 | 2/2008 | Itoh et al. | |
| 7,348,928 B2 | 3/2008 | Ma et al. | |
| 7,369,098 B2 | 5/2008 | Chen | |
| 7,373,133 B2 | 5/2008 | Mickle et al. | |
| 7,394,288 B1 | 7/2008 | Agarwal | |
| 7,430,127 B2 | 9/2008 | Uchida | |
| 7,486,270 B2 | 2/2009 | Shih | |
| 7,489,514 B2 | 2/2009 | Hamasaki et al. | |
| 7,535,958 B2 | 5/2009 | Best | |
| 7,592,957 B2 | 9/2009 | Achour et al. | |
| 7,620,424 B2 | 11/2009 | Cetiner et al. | |
| 7,653,272 B2 | 1/2010 | Cham et al. | |
| 7,656,182 B2 | 2/2010 | Bickford et al. | |
| 7,675,465 B2 | 3/2010 | Doan et al. | |
| 7,724,988 B2 | 5/2010 | Dellmann et al. | |
| 7,733,265 B2 | 6/2010 | Margomenos et al. | |
| 7,764,232 B2 | 7/2010 | Achour et al. | |
| 7,786,867 B2 | 8/2010 | Hamel et al. | |
| 7,791,167 B1 | 9/2010 | Rofougaran | |
| 7,838,997 B2* | 11/2010 | Trezza | 257/778 |
| 7,851,811 B2* | 12/2010 | Dutta | 257/84 |
| 7,851,918 B2* | 12/2010 | Kwon et al. | 257/758 |
| 7,852,323 B2 | 12/2010 | Parkinson et al. | |
| 7,855,696 B2 | 12/2010 | Gummalla et al. | |
| 7,863,728 B2 | 1/2011 | Beer et al. | |
| 7,904,768 B2 | 3/2011 | Wu et al. | |
| 7,920,827 B2 | 4/2011 | Huomo | |
| 7,974,587 B2 | 7/2011 | Rofougaran | |
| 7,979,089 B2 | 7/2011 | Nghiem et al. | |
| 7,997,576 B2 | 8/2011 | Curina et al. | |
| 8,034,664 B2* | 10/2011 | Kwon et al. | 438/118 |
| 8,040,286 B2 | 10/2011 | Matsuo et al. | |
| 8,059,443 B2 | 11/2011 | McLaren et al. | |
| 8,138,623 B2* | 3/2012 | Rofougaran | 307/3 |
| 8,267,583 B2* | 9/2012 | Yao et al. | 384/31 |
| 8,295,788 B2 | 10/2012 | Rofougaran et al. | |
| 8,299,971 B2 | 10/2012 | Talty et al. | |
| 8,400,361 B2 | 3/2013 | Rofougaran | |
| 8,415,777 B2* | 4/2013 | Rofougaran | 257/666 |
| 8,426,720 B2* | 4/2013 | Liu et al. | 136/205 |
| 8,451,175 B2 | 5/2013 | Gummalla et al. | |
| 8,467,637 B2 | 6/2013 | Fujikata et al. | |
| 8,508,029 B2 | 8/2013 | Boers et al. | |
| 8,521,222 B2 | 8/2013 | Erceg et al. | |
| 8,570,172 B2 | 10/2013 | Al-Mahdawi | |
| 8,670,638 B2 | 3/2014 | Rofougaran et al. | |
| 8,784,189 B2 | 7/2014 | Miller et al. | |
| 8,855,786 B2 | 10/2014 | Derbas et al. | |
| 9,103,902 B2 | 8/2015 | Lohninger et al. | |
| 9,184,632 B2 | 11/2015 | Kirby et al. | |
| 2002/0074605 A1 | 6/2002 | Gamand et al. | |
| 2003/0044104 A1 | 3/2003 | Tabata | |
| 2003/0098632 A1 | 5/2003 | Takeuchi et al. | |
| 2005/0134579 A1 | 6/2005 | Hsieh | |
| 2005/0245063 A1 | 11/2005 | Chinthakindi et al. | |
| 2006/0019611 A1 | 1/2006 | Mages | |
| 2006/0041309 A1 | 2/2006 | Massen et al. | |
| 2007/0152307 A1 | 7/2007 | Mizuno | |
| 2007/0171076 A1 | 7/2007 | Stevens et al. | |
| 2007/0229270 A1 | 10/2007 | Rofougaran | |

(56) References Cited

U.S. PATENT DOCUMENTS

| | | | |
|---|---|---|---|
| 2007/0287403 A1 | 12/2007 | Sjoland | |
| 2008/0159243 A1* | 7/2008 | Rofougaran | 370/338 |
| 2008/0237831 A1 | 10/2008 | Hsu et al. | |
| 2009/0010316 A1 | 1/2009 | Rofougaran | |
| 2009/0019250 A1 | 1/2009 | Rofougaran et al. | |
| 2009/0103345 A1 | 4/2009 | McLaren et al. | |
| 2009/0125746 A1 | 5/2009 | Rofougaran | |
| 2009/0218407 A1 | 9/2009 | Rofougaran | |
| 2009/0315637 A1 | 12/2009 | Rofougaran | |
| 2010/0015732 A1 | 1/2010 | Bose et al. | |
| 2010/0309073 A1 | 12/2010 | Rofougaran et al. | |
| 2010/0309078 A1* | 12/2010 | Rofougaran et al. | H01Q 1/248 343/776 |
| 2010/0311369 A1* | 12/2010 | Rofougaran et al. | H01Q 1/2283 455/129 |
| 2011/0022113 A1 | 1/2011 | Zdeblick et al. | |
| 2011/0077716 A1 | 3/2011 | Rofougaran | |
| 2011/0084399 A1 | 4/2011 | Furumiya et al. | |
| 2011/0091157 A1 | 4/2011 | Yao et al. | |
| 2011/0313710 A1 | 12/2011 | Behzad et al. | |
| 2011/0313711 A1 | 12/2011 | Behzad et al. | |
| 2012/0289338 A1 | 11/2012 | Chen et al. | |
| 2013/0082379 A1 | 4/2013 | Boers et al. | |
| 2013/0082403 A1 | 4/2013 | Castaneda et al. | |
| 2013/0082730 A1 | 4/2013 | Castaneda et al. | |
| 2013/0082767 A1 | 4/2013 | Boers et al. | |
| 2013/0082800 A1 | 4/2013 | Rofougaran et al. | |
| 2013/0142211 A1 | 6/2013 | Doany et al. | |
| 2015/0276856 A1 | 10/2015 | Castaneda et al. | |

FOREIGN PATENT DOCUMENTS

| | | |
|---|---|---|
| CN | 101385190 A | 3/2009 |
| CN | 202996826 | 6/2013 |
| CN | 202996830 U | 6/2013 |
| EP | 0325034 | 7/1989 |
| EP | 0476675 | 3/1992 |
| EP | 1 465 282 A1 | 10/2004 |
| EP | 1732238 | 12/2006 |
| EP | 1 939 986 A2 | 7/2008 |
| JP | 10284929 A | 10/1998 |
| JP | 2004-297532 A | 10/2004 |
| JP | 2010-022008 A | 1/2010 |
| KR | 10-2008-0063212 A | 7/2008 |
| TW | 200733284 A1 | 9/2007 |
| TW | 200839984 A1 | 10/2008 |
| TW | 201034500 A1 | 9/2010 |
| WO | WO 2005/064739 A1 | 7/2005 |

OTHER PUBLICATIONS

European Search Report directed to related EP Patent Application No. 13 00 1728.8-1552, European Patent Office, mailed Aug. 1, 2013; 3 pages.

U.S. Appl. No. 13/935,164, Boers et al., "Semiconductor Package Including an Integrated Waveguide," filed Jul. 3, 2013.

Office Action directed to related Taiwanese Patent Application No. 101131867, mailed Apr. 9, 2014; 5 pages.

English-language Abstract for Taiwanese Patent Application Publication No. 200733284 A1; 1 page.

Office Action for Korean Patent Application No. 10-2012-0101571, mailed May 2, 2014; 5 pages.

Chinese Office Action from the State Intellectual Property Office of the P.R.C. (SIPO), directed toward related Chinese Application No. 201210366306.X, dated Oct. 31, 2014; 7 pages.

Iyer et al., "Wireless chip to chip interconnection for multichip modules using leaky wave antennas", Nov. 1993, pp. 2030-2031.

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1505.

Floyd et al., "Wireless Interconnects for Clock Distribution", 2002, pp. 105-108.

Zvolensky et al., "Leaky-Wave antenna based on micro-electromechanical systems-loaded microstrip line", 2011, pp. 357-363.

Feresidis et al., "Flat Plate Millimetre Wave Antenna Based on Partially Reflective FSS", 11th International Conference on Antennas and Propagation, 2001, pp. 33-36.

Brown W C et al., "Beamed Microwave Power Transmission and its Application to Space," IEEE Transactions on Microwave Theory and Techniques IEEE Service Center, Piscataway, NJ, US LKND-DOI; 10.1109/22.141357. vol. 40 No. 6, Jun. 1, 1992, pp. 1239-1250.

EPO Communication dated Oct. 28, 2010 in Application 100058673.6-2220.

EPO Communication dated Feb. 2, 2016 in related Application No. 12005674.2-1552.

Grant of Patent for Korean Patent Application No. 10-2012-0101570, mailed Dec. 20, 2013 with English Language Machine Translation.

Grant of Patent for Korean Patent Application No. 10-2012-0108073, mailed Nov. 20, 2013 with English Language Machine Translation.

Grant of Patent for Korean Patent Application No. 10-2012-0101571, mailed Nov. 12, 2014 with English Language Machine Translation.

English-language Abstract for Japanese Patent Application Publication No. 10284929A; 2 pages.

\* cited by examiner

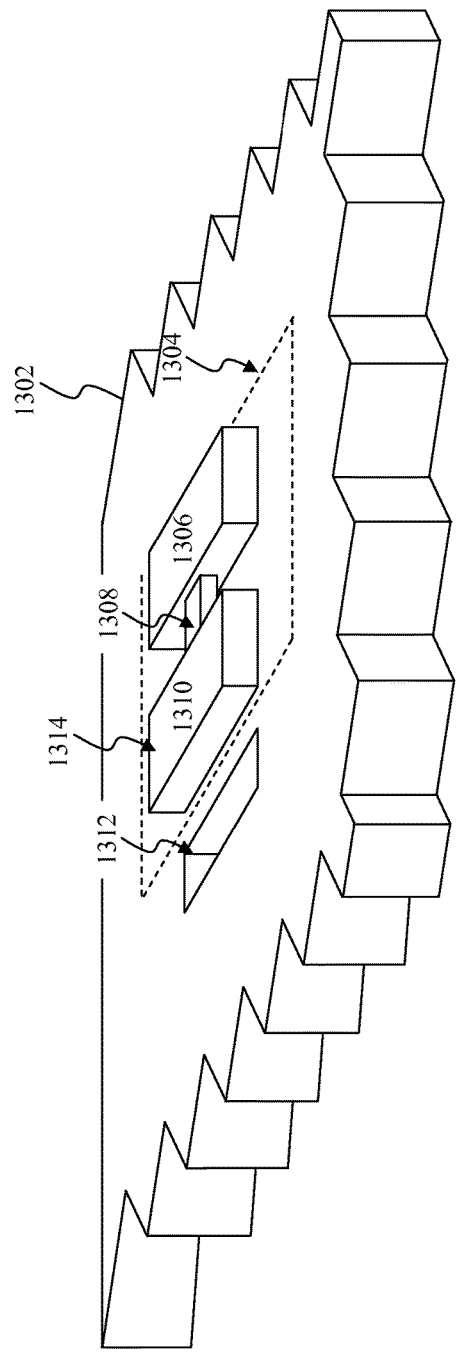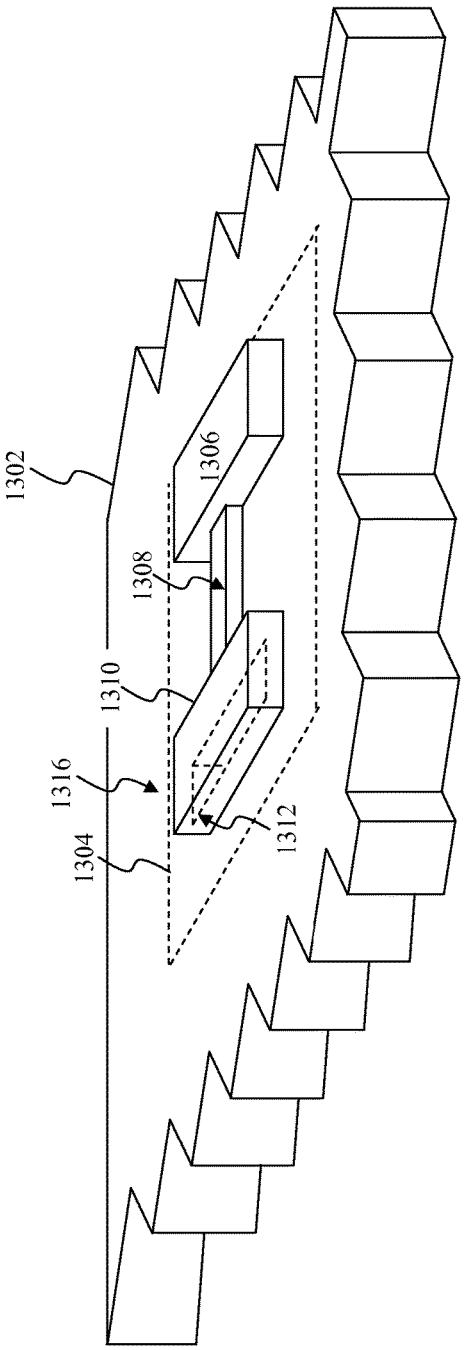
FIG. 13A
FIG. 13B

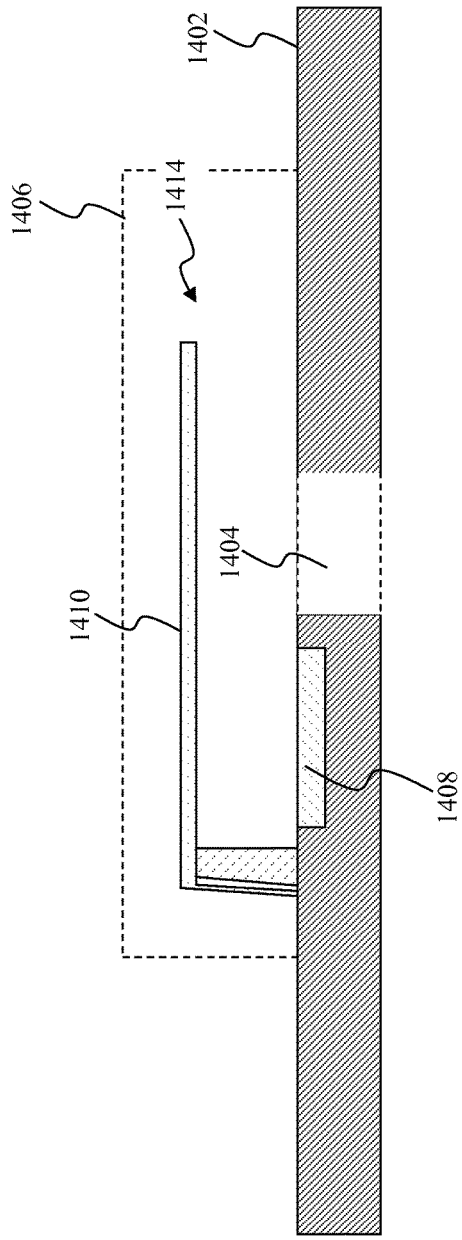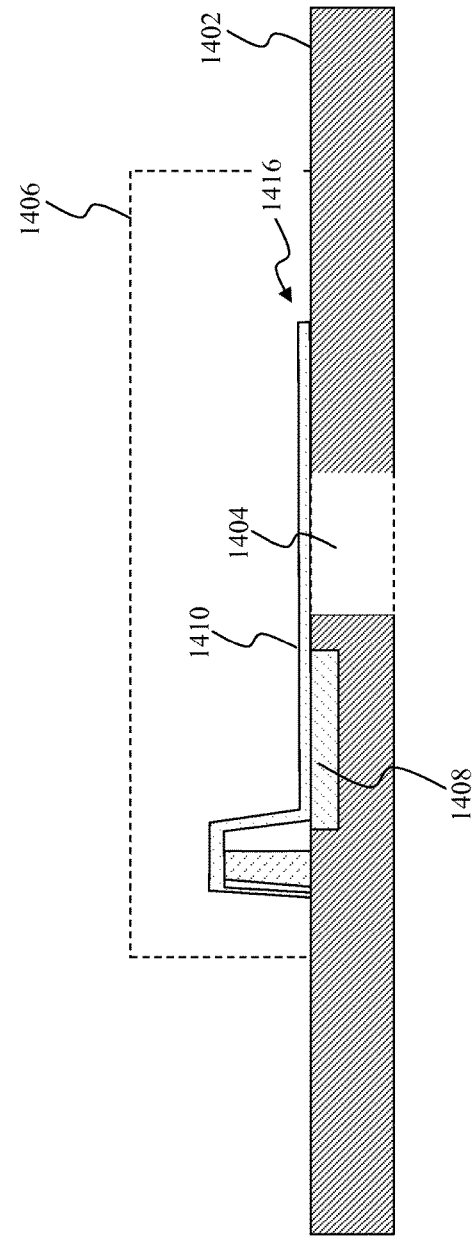

WIRELESS COMMUNICATING AMONG VERTICALLY ARRANGED INTEGRATED CIRCUITS (ICS) IN A SEMICONDUCTOR PACKAGE

BACKGROUND

Field of Invention

Generally, the present invention relates to wireless communication among functional modules of an integrated circuit, and specifically, to integrating a waveguide with the functional modules to wirelessly communicate using a multiple access transmission scheme.

Related Art

A semiconductor device fabrication operation is commonly used to manufacture integrated circuits onto a semiconductor substrate to form a semiconductor wafer. Integrated circuits from among various semiconductor wafers are often packaged together to form an electronic device, such as a mobile device or a personal computing device to provide some examples. These integrated circuits are often interconnected to each other using conductive wires and/or traces and communicate among themselves using these conductive wires and/or traces.

Typically, the conductive wires and/or traces are suitable for communication among the integrated circuits when low data rates and/or low frequencies are used to communicate over relatively short distances. However, as the data rates, the frequencies, and/or the distances increase, physical properties of the conductive wires and/or traces may degrade communication among the integrated circuits. For example, an undesirable or a parasitic capacitance and/or inductance of the conductive wires and/or traces may degrade communication among the integrated circuits at these increased data rates, frequencies, and/or distances.

Electronic designers are creating new electronic devices that include more integrated circuits that communicate at increased data rates and/or frequencies and over longer distances thereby making the use of conductive wires and/or traces for communication problematic. Thus, there is a need for interconnecting integrated circuits over longer distances at increased data rates and/or frequencies that overcomes the shortcomings described above. Further aspects and advantages of the present invention will become apparent from the Detailed Description that follows.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identifies the drawing in which the reference number first appears.

FIG. 13A illustrates a first exemplary configuration of a first electro-mechanical device that may be used to dynamically configure operating characteristics of the second integrated waveguide according to an exemplary embodiment of the present invention;

FIG. 13B illustrates a second exemplary configuration of the first electro-mechanical device according to an exemplary embodiment of the present invention;

FIG. 14A illustrates a first exemplary configuration of a second electro-mechanical device that may be used to dynamically configure operating characteristics of the second integrated waveguide according to an exemplary embodiment of the present invention;

FIG. 14B illustrates a second exemplary configurations of the second electro-mechanical device according to an exemplary embodiment of the present invention;

Figure 26:
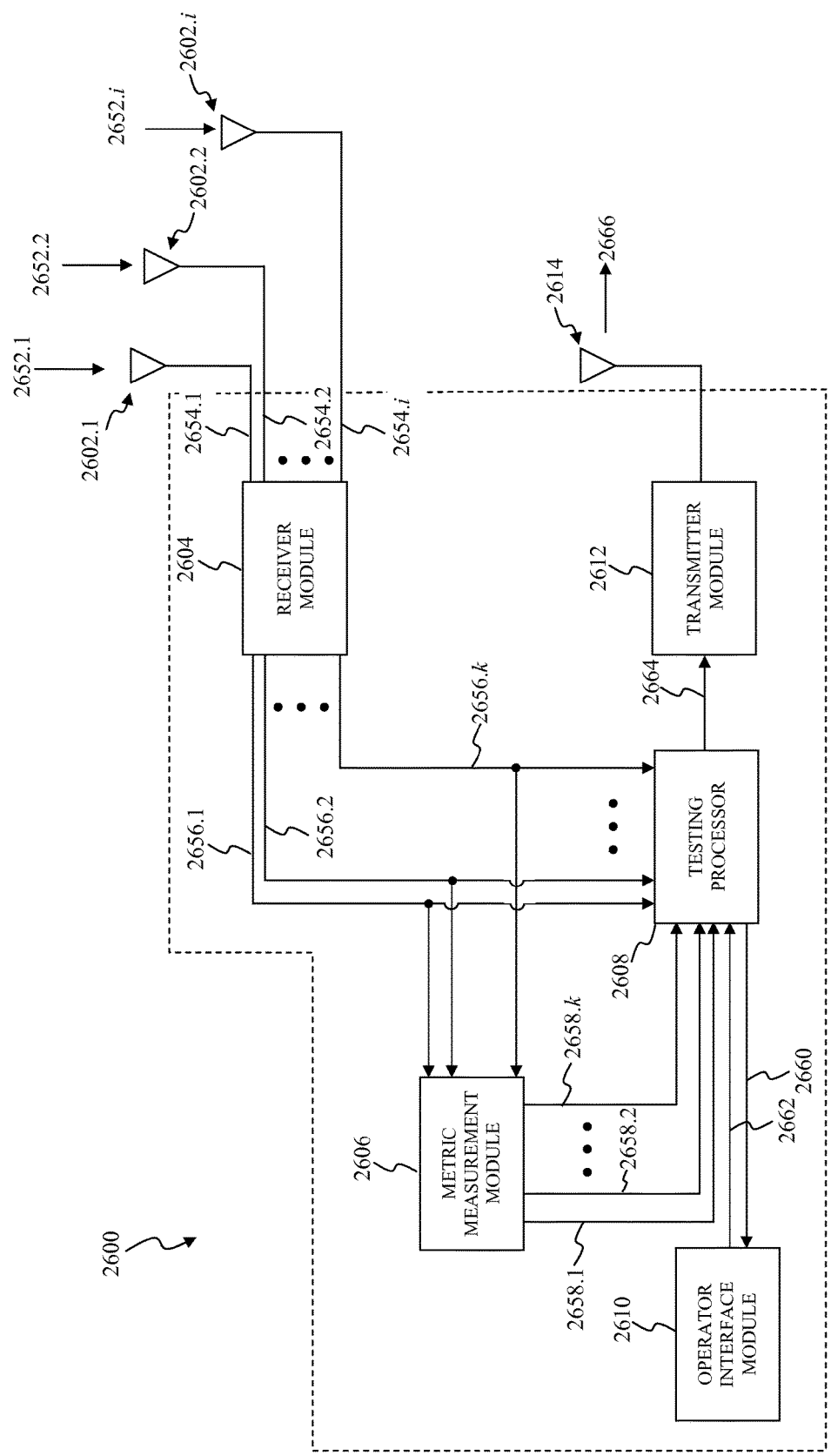
Figure 27:
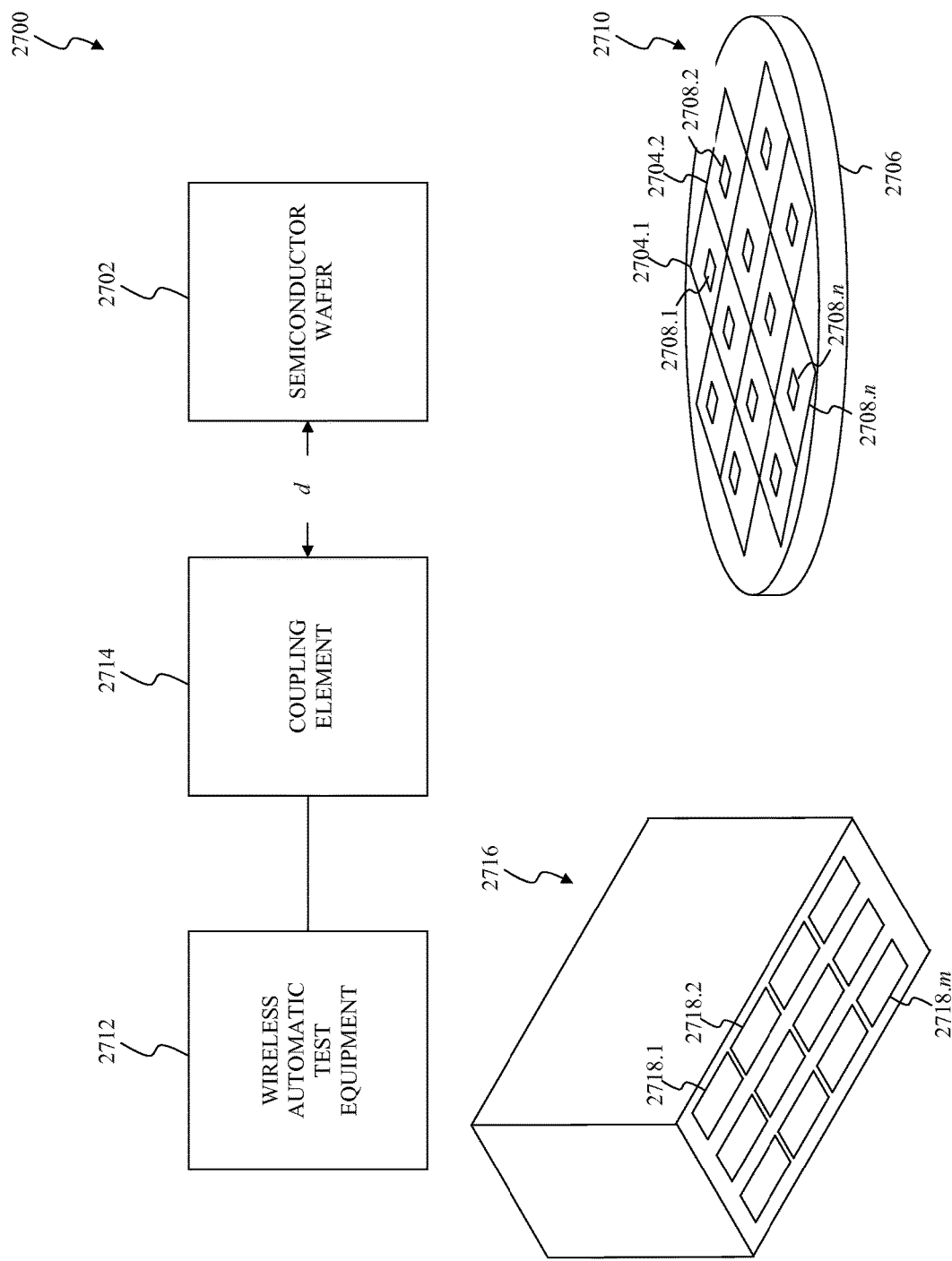

FIG. 26 illustrates a schematic block diagram of wireless automatic test equipment that is implemented within the wireless integrated circuit testing environment according to an exemplary embodiment of the present invention; and FIG. 27 illustrates block diagram of receiving antennas that are implemented as part of the wireless automatic test equipment to an exemplary embodiment of the present invention.

Embodiments of the invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Embodiments of the invention may be implemented in hardware, firmware, software, or any combination thereof. Embodiments of the invention may additionally be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Exemplary Semiconductor Wafer

Figure 1:
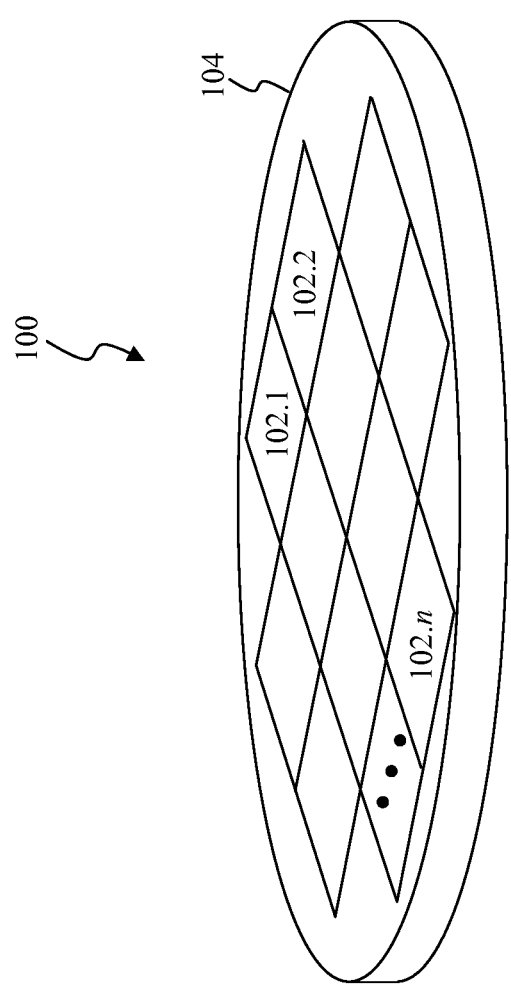
FIG. 1 illustrates a schematic block diagram of a semiconductor wafer according to an exemplary embodiment of the present invention.

FIG. 1 illustrates a schematic block diagram of a semiconductor wafer according to an exemplary embodiment of the present invention. A semiconductor device fabrication operation is commonly used to manufacture integrated circuits onto a semiconductor substrate to form a semiconductor wafer. The semiconductor device fabrication operation uses a predetermined sequence of photographic and/or chemical processing steps to form the integrated circuits onto the semiconductor substrate.

A semiconductor wafer 100 includes integrated circuits 102.1 through 102.$n$ that are formed onto a semiconductor substrate 104. The semiconductor substrate 104 is typically a thin slice of semiconductor material, such as a silicon crystal, but may include other materials, or combinations of materials, such as sapphire or any other suitable material that will be apparent to those skilled in the relevant art(s) without departing from the spirit and scope of the present invention.

Typically, the integrated circuits 102.1 through 102.$n$ are formed onto the semiconductor substrate 104 using a first series of fabrication steps, referred to as front-end-of-line processing, and a second series of fabrication steps, referred to as back-end-of-line processing. The front-end-of-line processing represents a first series of photographic and/or chemical processing steps to form components of the integrated circuits 102.1 through 102.$n$ onto the semiconductor substrate 104. The components of the integrated circuits 102.1 through 102.$n$ may include any suitable combination of electrical components, mechanical components, electro-mechanical components, or other suitable components that will be apparent to those skilled in the relevant art(s). The integrated circuits 102.1 through 102.$n$ may be similar and/or dissimilar to each other. The back-end-of-line processing represents a second series of photographic and/or chemical processing steps to form interconnections between these components to form the integrated circuits 102.1 through 102.$n$ onto the semiconductor substrate 104.

Figure 2:
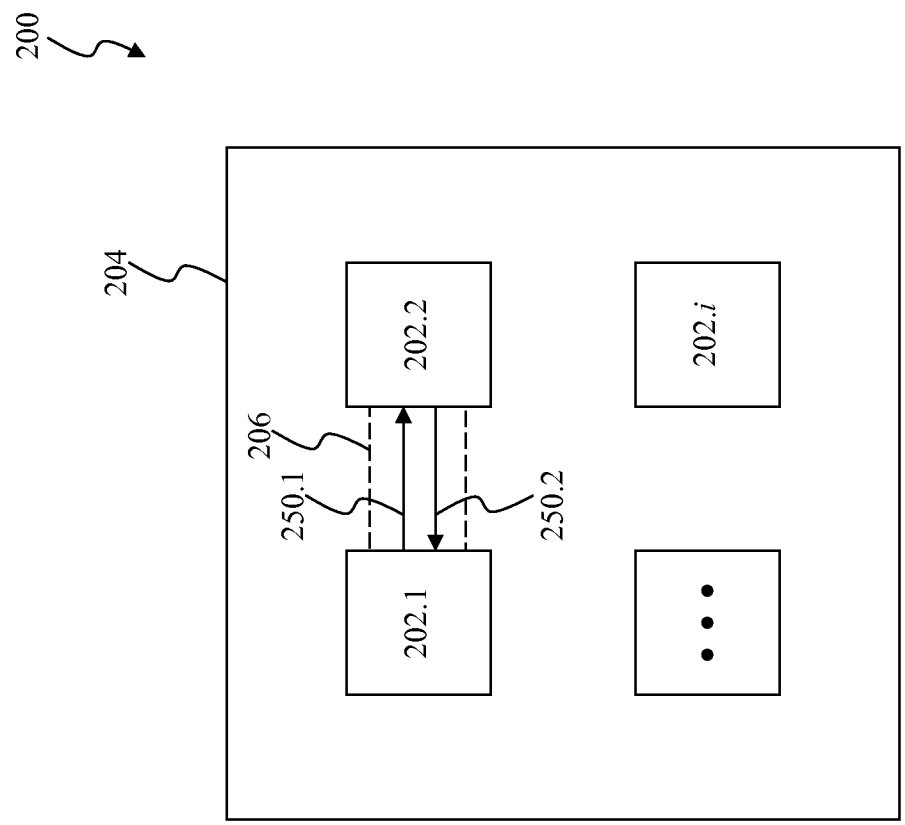
FIG. 2 illustrates a first block diagram of an integrated circuit that is formed onto a semiconductor substrate according to an exemplary embodiment of the present invention.

First Exemplary Integrated Circuit that is Formed onto a Semiconductor Substrate FIG. 2 illustrates a first block diagram of an integrated circuit that is formed onto a semiconductor substrate according to an exemplary embodiment of the present invention. The semiconductor device fabrication operation is commonly used to manufacture an integrated circuit 200 onto a semiconductor substrate 204. The integrated circuit 200 includes any suitable combination of electrical components, mechanical components, electro-mechanical components, or any other suitable components that will be apparent to those skilled in the relevant art(s) that are configured and arranged to form one or more functional modules 202.1 through 202.*i*. Each of the functional modules 202.1 through 202.*i* may be communicatively coupled to other functional modules 202.1 through 202.*i* within the integrated circuit 200. The integrated circuit 200 may represent an exemplary embodiment of one or more of the integrated circuits 102.1 through 102.*n*.

The functional module 202.1 may be communicatively coupled to the functional module 202.2 via a dedicated communications channel 206 formed onto the semiconductor substrate 204. The dedicated communications channel 206 may include, but is not limited to, a microwave radio link, a fiber optic link, a hybrid fiber optic link, a copper link, or a concatenation of any combination of these to provide some examples. For example, the dedicated communications channel 206 may be formed using a copper link to allow for communication between the functional module 202.1 and the functional module 202.2. In an exemplary embodiment, the copper link may be configured and arranged to form a differential signaling link to allow for differential communications between the functional module 202.1 and the functional module 202.2. As another example, the dedicated communications channel 206 may be implemented using a waveguide to guide electromagnetic waves for communication between the functional module 202.1 and the functional module 202.2.

The functional module 202.1 provides a transmitted communications signal 250.1 to the dedicated communications channel 206. The transmitted communications signal 250.1 passes through the dedicated communications channel 206 where it is observed by the functional module 202.2. Similarly, the functional module 202.1 observes a received communications signal 250.2 from the dedicated communications channel 206. Specifically, the functional module 202.2 provides a transmitted communications signal to the dedicated communications channel 206. This transmitted communications signal passes through the dedicated communications channel 206 where it is observed by the functional module 202.1 as the received communications signal 250.2.

Second Exemplary Integrated Circuit that is Formed onto the Semiconductor Wafer

Figure 3:
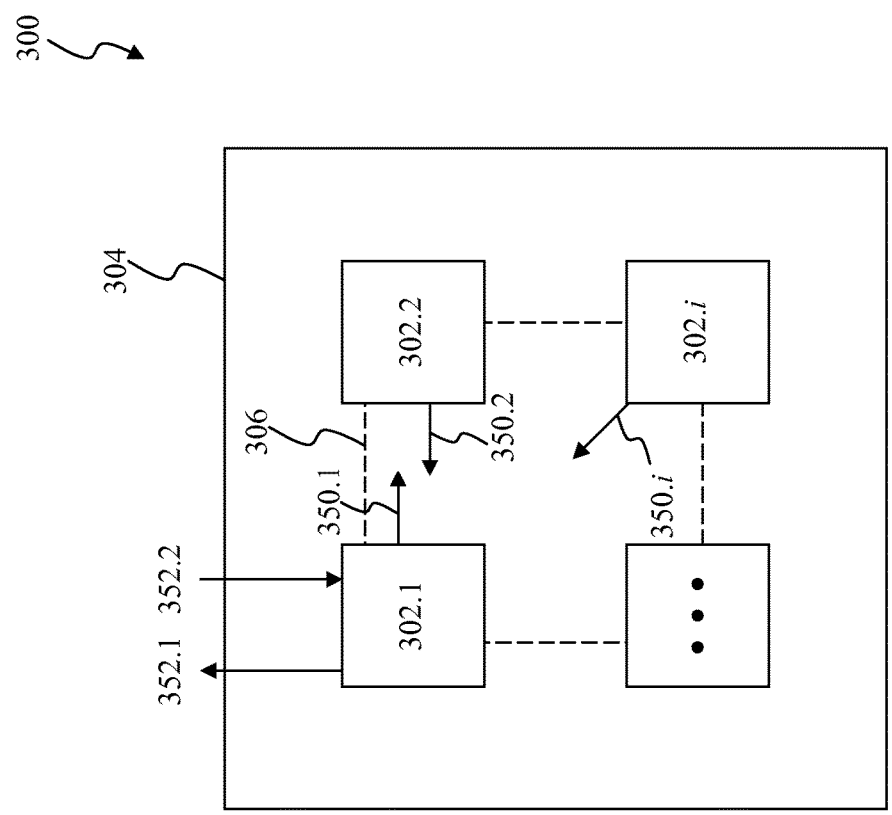
FIG. 3 illustrates a second block diagram of the integrated circuit that is formed onto the semiconductor wafer according to an exemplary embodiment of the present invention.

FIG. 3 illustrates a second block diagram of the integrated circuit that is formed onto the semiconductor wafer according to an exemplary embodiment of the present invention. The semiconductor device fabrication operation is commonly used to manufacture an integrated circuit 300 onto a semiconductor substrate 304. The integrated circuit 300 includes any suitable combination of electrical components, mechanical components, electro-mechanical components, or any other suitable components that will be apparent to those skilled in the relevant art(s) that are configured and arranged to form one or more functional modules 302.1 through 302.*i*. Each of the functional modules 302.1 through 302.*i* may be communicatively coupled to other functional modules 302.1 through 302.*i* within the integrated circuit. The integrated circuit 300 may represent an exemplary embodiment of one or more of the integrated circuits 102.1 through 102.*n*.

The functional module 302.1 may be communicatively coupled to other functional modules 302.2 through 302.*i* via a common communications channel 306 formed onto the semiconductor substrate 304. Typically, the common communications channel 306 represents a communications channel, such as a microwave radio link, a fiber optic link, a hybrid fiber optic link, a copper link, or a concatenation of any combination of these to provide some examples, which is shared among more than one of the functional modules 302.1 through 302.*i*. For example, the common communications channel 306 may be formed using a common copper link to allow for communication between the functional modules 302.1 through 302.*i*. In an exemplary embodiment, the copper link may be configured and arranged to form a differential signaling link to allow for differential communications between the functional modules 302.1 through 302.*i*. As another example, the common communications channel 306 may be implemented using a waveguide to guide electromagnetic waves for communication between the functional modules 302.1 through 302.*i*.

Each of the functional modules 302.1 through 302.*i* may communicate with other functional modules 302.1 through 302.*i* using the common communications channel 306, referred to as on-chip communication. Collectively, the functional modules 302.1 through 302.*i* communicate using a multiple access transmission scheme. The multiple access transmission scheme may include any single carrier multiple access transmission scheme such as code division multiple access (CDMA), frequency division multiple access (FDMA), time division multiple access (TDMA), and/or any other suitable single carrier multiple access transmission scheme that will be apparent by those skilled in the relevant art(s) without departing from the spirit and scope of the present invention. Alternatively, the multiple access transmission scheme may include any multiple carrier multiple access transmission scheme such as discrete multi-tone (DMT) modulation, orthogonal frequency division multiplexing (OFDM), coded OFDM (COFDM), and/or any other suitable multiple carrier multiple access transmission scheme that will be apparent by those skilled in the relevant art(s) without departing from the spirit and scope of the present invention. In another alternate, the multiple access transmission scheme may include any combination of the single carrier multiple access transmission scheme and the multiple carrier multiple access transmission scheme.

Typically, the functional modules 302.1 through 302.*i* that are communicatively coupled to the common communications channel 306 may be characterized by unique identifiers. For example, these unique identifiers may represent unique spreading codes that is used in a code division multiple access (CDMA) scheme, unique time slot allocations in a time division multiple access (TDMA) scheme, unique addresses that are stored within the functional module, or any other suitable identifiers that will be apparent to those skilled in the relevant art(s) without departing from the spirit and scope of the present invention. In an exemplary embodiment, the unique identifiers are unique among the functional modules 302.1 through 302.*i* to provide unicast transmission. In another exemplary embodiment, the unique identifiers may share some commonality between identifiers to provide multicast transmission. In this exemplary embodiment, the unique identifiers are characterized as being unique among multiple functional modules 302.1 through 302.*i*.

Each of the functional modules 302.1 through 302.*i* operate upon information, such as data and/or one or more commands, in accordance with unique identifiers of other functional modules 302.1 through 302.*i* provide its transmitted communication signal 350.1 through 350.*i* to selectively communicate with these other functional modules. For example, the functional module 302.1 may spread information for transmission to the functional module 302.2 using a spreading code that corresponds to the unique identifier of the functional module 302.2 to provide the transmitted communications signal 350.1. As another example, the functional module 302.1 may provide selectively place the information in a time slot that corresponds to the unique identifier of the functional module 302.2 to provide the transmitted communications signal 350.1. As a further example, the functional module 302.1 may append the unique identifier of the functional module 302.2 to the information to provide the transmitted communications signal 350.

The functional modules 302.1 through 302.*i* operate upon the transmitted communication signals 350.1 through 350.*i* using their unique identifiers. The functional modules 302.1 through 302.*i* recover and/or process the information within those transmitted communication signals which have been provided using their unique identifiers and/or disregard or ignore those transmitted communication signals that have been provided in accordance with other unique identifiers of other functional modules 302.1 through 302.*i*. For example, the functional modules 302.1 through 302.*i* may de-spread the transmitted communication signals 350.1 through 350.*i* using spreading code that corresponds to their unique identifiers. As another example, the functional modules 302.1 through 302.*i* may selectively observe time slots that correspond to their unique identifiers. As a further example, the functional modules 302.1 through 302.*i* may compare the unique identifier embedded within the transmitted communication signals 350.1 through 350.*i* to their unique identifiers.

Each of the functional modules 302.1 through 302.*i* associate their respective transmitted communication signals 350.1 through 350.*i* with unique identifiers of other functional modules from among the functional modules 302.1 through 302.*i* to communicate with these other functional modules. For example, the functional module 302.1 may operate upon information in accordance with the unique identifier of the functional module 302.2 to provide the transmitted communication signal 350.1. The functional module 302.2 operates upon the transmitted communication signal 350.1 using its unique identifier. Because the transmitted communication signal 350.1 has been provided using the unique identifier of the functional module 302.2, the functional module 302.2 recovers and/or processes the information within the transmitted communication signal 350.1. However, other functional modules 302.3 through 302.*i* also operate upon the transmitted communication signal 350.1 using their unique identifiers. In this situation, since the unique identifiers of these other functional modules 302.3 through 302.*i* are different from the unique identifier of the functional module 302.2, the transmitted communication signal 350.1 is disregarded or ignored by these other functional modules.

The functional modules 302.1 through 302.*i* may, optionally, communicate with other electrical, mechanical, and/or electro-mechanical circuits that are communicatively coupled to the integrated circuit 300, referred to as off-chip communication. The other circuits may be formed onto the same semiconductor substrate as the integrated circuit 300 and/or onto other semiconductor substrates. For example, the functional module 302.1 may provide a transmitted communications signal 352.1 to these other circuits and/or observe a received communications signal 352.2 from these other circuits. However, this example is not limiting, each of the functional modules 302.1 through 302.*i* may, optionally, communicate with the circuits in a substantially similar manner without departing from the spirit and scope of the present invention. The functional modules 302.1 through 302.*i* may be communicatively coupled to the other circuits using the common communications channel 306. In this situation, these other circuits may be characterized by unique identifiers and communicate with the functional modules 302.1 through 302.*i* using the multiple access transmission scheme as described above. Alternatively, the functional modules 302.1 through 302.*i* may be communicatively coupled to the other circuits using a dedicated communication channel as described in FIG. 2.

Figure 4:
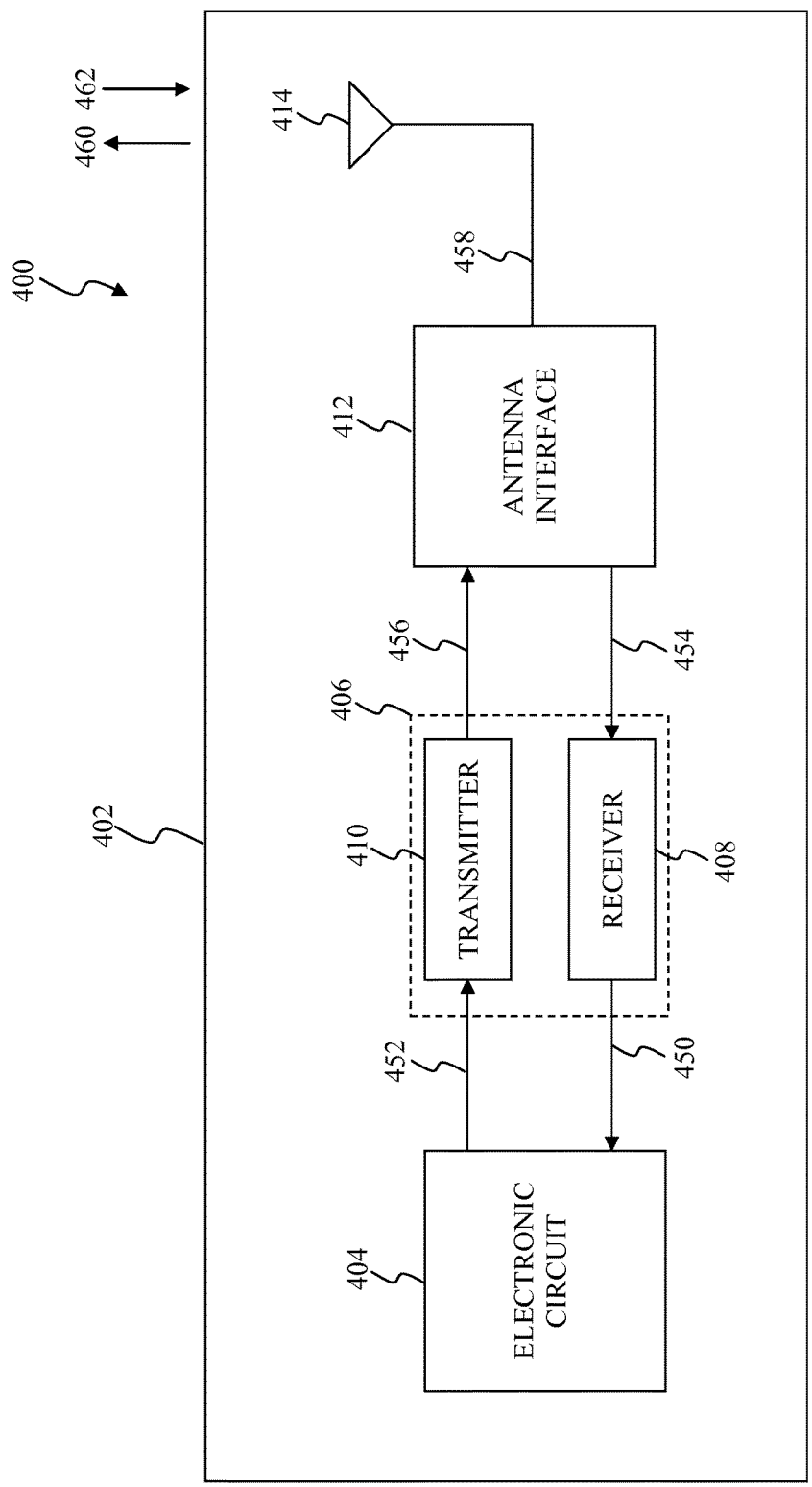
FIG. 4 illustrates a block diagram of a functional module that may be implemented as part of the integrated circuit according to an exemplary embodiment of the present invention.

Exemplary Functional Module that May be Implemented as Part of the First Exemplary Integrated Circuit and/or the Second Exemplary Integrated Circuit FIG. 4 illustrates a block diagram of a functional module that may be implemented as part of the integrated circuit according to an exemplary embodiment of the present invention. A functional module 400 includes any suitable combination of electrical components, mechanical components, electro-mechanical components, or any other suitable components that will be apparent to those skilled in the relevant art(s). The functional module 400 includes an electronic circuit 404, a transceiver module 406, and an interface that are formed onto a semiconductor substrate 402. The functional module 400 also includes an antenna 414 that may be formed onto the semiconductor substrate 402 or formed onto another substrate which is communicatively coupled to the modules of the semiconductor substrate 402. The functional module 400 may represent an exemplary embodiment of one or more of the functional modules 202.1 through 202.*i* and/or one or more of the functional modules 302.1 through 302.*i*.

The electronic circuit 404 includes any suitable combination of components that are connected by conductive wires and/or traces formed onto the semiconductor substrate 402. Typically, these components may include electrical components that are configured and arranged to form one or more analog circuits, one or more digital circuits, and/or any combination of analog and digital circuits, commonly referred to as a mixed-signal circuit. However, these components may additionally include mechanical components, electro-mechanical components, or any other suitable components that will be apparent to those skilled in the relevant art(s) without departing from the spirit and scope of the present invention.

The combinations of these components of the electronic circuit 404 allow the electronic circuit 404 to perform various operations. The electronic circuit 404 may receive an input communication signal 450 from the transceiver module 406. The input communication signal 450 may include information and/or one or more commands. The electronic circuit 400 may perform various operations upon the information and/or execute the one or more commands to provide an output communication signal 452.

The transceiver module 406 operates upon the received communications signal 454 in accordance with the multiple access transmission scheme to provide the input communication signal 450 and operates upon the output communication signal 452 in accordance with multiple access transmission scheme to provide a transmitted communications signal 456. More specifically, the transceiver module 406 includes a receiver module 408 and a transmitter module 410. The receiver module 408 downconverts, demodulates, and/or decodes the received communications signal 454 in accordance with the multiple access transmission scheme using a unique identifier assigned to the functional module 400. The receiver module 408 provides the input communication signal 450 when the unique identifier assigned to the functional module 400 is substantially similar to a unique identifier used to provide the transmitted communications signal 456. Otherwise, the receiver module 408 disregards or ignores the transmitted communications signal 456 when the unique identifier assigned to the functional module 400 is different from the unique identifier used to provide the transmitted communications signal 456.

The transmitter module 410 encodes, modulates, and/or upconverts the an output communication signal 452 in accordance with the multiple access transmission scheme using a unique identifier assigned to another functional module to provide the transmitted communications signal 456. The transmitter module 410 may include a look-up table stored in a memory within the functional module 400 that includes the unique identifiers of the functional modules and/or integrated circuits that are communicatively coupled to a common communications channel, such as the common communications channel 306 to provide an example. The functional module 400 may store the look-up table into one or more memory devices such as any suitable non-volatile memory, any suitable volatile memory, or any combination of non-volatile and volatile memory that will be apparent by those skilled in the relevant art(s) without departing from the spirit and scope of the present invention. The look-up table may represent a static table that is programmed into the one or more memory devices during manufacture or testing of the functional module 400 and/or a dynamic table that may be updated as more or less functional modules and/or integrated circuits become communicatively coupled to the common communications channel.

The antenna interface 412 receives a bidirectional communications signal 412 from the antenna module 414 and/or provides the bidirectional communications signal 412 to the antenna module 414. The antenna interface may operate in a transmission mode of operation and/or a reception mode of operation. In the transmission mode of operation, the antenna interface 412 provides the bidirectional communications signal 412 to the antenna module 414. The antenna interface 412 receives the bidirectional communications signal 412 from the antenna module 414 in the reception mode of operation. Typically, the antenna interface 412 is configurable to operate in either the transmission mode of operation or the reception mode of operation; however, the antenna interface 412 may additionally simultaneously operate on both modes of operation.

The antenna module 414 provides a transmitted communications signal 460 based upon the bidirectional communications signal 412 and/or observes a received communications signal 462 to provide the bidirectional communications signal 412. The antenna module 414 may be implemented using a monopole antenna, a dipole antenna, a phased array, a patch antenna, a waveguide and/or any other suitable device which converts electric currents into electromagnetic waves that will be apparent to those skilled in the relevant art(s) without departing from the spirit and scope of the present invention.

In some situations, the functional module 400 may include more than one transceiver module 406, more than one antenna interface 412 and/or more than one antenna module 414. Typically, these situations arise when the functional module 400 communicates with other functional modules and/or other circuits using a dedicated communication channel as described in FIG. 2 and/or FIG. 3. In other situations, the functional module 400 may share the one antenna interface 412 and/or the one antenna module 414 with other functional modules.

First Exemplary Configuration and Arrangement of the Integrated Circuit

Figure 5:
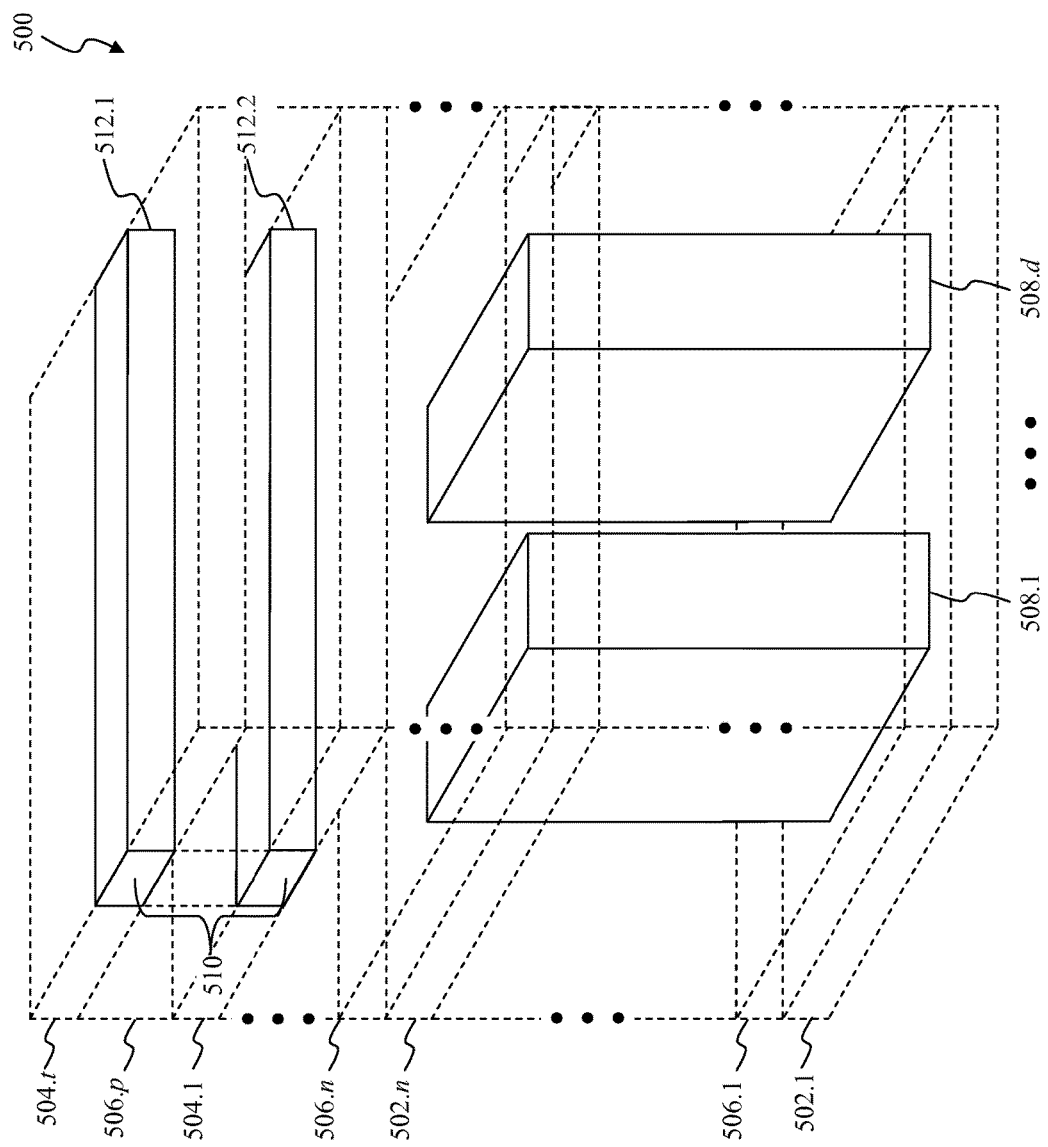
FIG. 5 illustrates a first exemplary configuration and arrangement of the integrated circuit according to an exemplary embodiment of the present invention.

FIG. 5 illustrates a first exemplary configuration and arrangement of the integrated circuit according to an exemplary embodiment of the present invention. A semiconductor device fabrication operation uses a predetermined sequence of photographic and/or chemical processing steps to form one or more functional modules onto a semiconductor substrate and an integrated waveguide onto the semiconductor substrate to communicatively couple these functional modules to form an integrated circuit 500 onto the semiconductor substrate. The integrated circuit 500 may represent an exemplary embodiment of the integrated circuit 200 and/or the integrated circuit 300.

The semiconductor device fabrication operation forms the integrated circuit 500 onto an arrangement of useable fabrication layers from among the semiconductor substrate. As shown in FIG. 5, the semiconductor substrate includes a first group of useable fabrication layers 502.1 through 502.$n$ and a second group of useable fabrication layers 504.1 through 504.$t$. The first group of the useable fabrication layers 502.1 through 502.$n$ and the second group of useable fabrication layers 504.1 through 504.$t$ are interdigitated with insulation layers 506.1 through 506.$p$, such as silicon dioxide ($SiO_2$) though any other suitable dielectric material may be used for the insulation layers that will be apparent to those skilled in the relevant art(s) without departing from the spirit and scope of the present invention.

Typically, one or more functional modules 508.1 through 508.$d$ are formed onto the first group of useable fabrication layers 502.1 through 502.$n$ and an integrated antenna, such as an integrated waveguide 510, are formed onto the second group of useable fabrication layers 504.1 through 504.$t$. However, those skilled in the relevant art(s) will recognize that the integrated antenna may be implemented using a monopole antenna, a dipole antenna, a phased array, a patch antenna, a waveguide and/or any other suitable device which converts electric currents into electromagnetic waves that will be apparent to those skilled in the relevant art(s) without departing from the spirit and scope of the present invention. The configuration and arrangement of the integrated circuit 500 as shown in FIG. 5 is for illustrative purposes only. Those skilled in the relevant art(s) will recognize that the functional modules 508.1 through 508.$d$ may be configured and arranged within the first group of useable fabrication layers 502.1 through 502.$n$ and/or the integrated waveguide 510 may be configured and arranged within the second group of useable fabrication layers 504.1 through 504.$t$ differently without departing from the spirit and scope of the present invention.

The first group of the useable fabrication layers 502.1 through 502.$n$ include one or more n-diffusion and/or p-diffusion layers and/or one or more polysilicon layers that is used to form various components, such as electrical components, mechanical components, and/or electro-mechanical components to provide some examples, of the functional modules 508.1 through 508.$d$. The first group of the useable fabrication layers 502.1 through 502.$n$ also includes one or more conductive layers to form interconnections between the various components of the functional modules 508.1 through 508.$d$. Those skilled in the relevant art(s) will recognize that the each of the functional modules 508.1 through 508.$d$ may be formed using a similar number or a different number fabrication layers from among the first group of the useable fabrication layers 502.1 through 50 without departing from the spirit and scope of the present invention.

The first group of the useable fabrication layers 502.1 through 502.n may be separated from the second group of useable fabrication layers 504.1 through 504.t by the insulation layer 506.n. Alternatively, the first group of the useable fabrication layers 502.1 through 502.n may be separated from the second group of useable fabrication layers 504.1 through 504.t by a third group, not illustrated in FIG. 5, of usable fabrication layers from among the semiconductor substrate interdigitated with the insulation layers 506.1 through 506.p.

The second group of useable fabrication layers 504.1 through 504.t includes one or more conductive layers to form the various components of the integrated waveguide 510. Those skilled in the relevant art(s) will recognize that the each of the functional modules 508.1 through 508.d may be formed using a similar number or a different number fabrication layers from among the first group of the useable fabrication layers 502.1 through 50 without departing from the spirit and scope of the present invention. The integrated waveguide 510 includes a first conductive element 512.1 formed onto a first useable fabrication layer from among the second group of useable fabrication layers 504.1 through 504.t and a second conductive element 512.2 formed onto a second useable fabrication layer from among the second group of useable fabrication layers 504.1 through 504.t. The first useable fabrication layer may be separated from the second useable fabrication layer by the insulation layer 506.p, one or more usable fabrication layers from among the semiconductor substrate interdigitated with the insulation layers 506.1 through 506.p, not illustrated in FIG. 5, and/or a free space region that is free from useable fabrication layers and insulation layers, not illustrated in FIG. 5.

In an exemplary embodiment, the first conductive element 512.1 includes a first parallel plate formed onto the useable fabrication layer 504.t and the second conductive element 512.2 includes a second parallel plated formed onto the useable fabrication layer 504.1 that are configured and arranged to form a parallel plate waveguide, commonly referred to as a Fabry-Perot Cavity (FPC). In another exemplary embodiment, the first parallel plate and/or the second parallel plate may include one or more static phase openings to form a leaky waveguide. However, these examples are not limiting, those skilled in the relevant art(s) will recognize that other configurations and arrangements of the integrated waveguide 510 are possible without departing from the spirit and scope of the present invention. For example, the first conductive element 512.1 and the second conductive element 512.2 may be configured and arranged to form any other suitable multi-conductor waveguide. As another example, the first conductive element 512.1 may be coupled to the second conductive element 512.2 to form a single conductor waveguide, such as a rectangular waveguide, a circular waveguide, or an elliptical waveguide to provide some examples.

Additionally, the configuration and arrangement of the integrated waveguide 510 as shown in FIG. 5 is for illustrative purposes only. Those skilled in the relevant art(s) will recognize that the integrated waveguide 510 may traverse any suitable path through the useable fabrication layers 504.1 through 504.t) to communicatively couple the functional modules 508.1 through 508.d without departing from the spirit and scope of the present invention. For example, the integrated waveguide 510 may traverse along any suitable linear and/or non-linear path to communicatively couple the functional modules 508.1 through 508.d. As another example, some the integrated waveguide 510 may be formed onto the first group of the useable fabrication layers 502.1 through 502.n to communicatively couple the functional modules 508.1 through 508.d.

Figure 6:
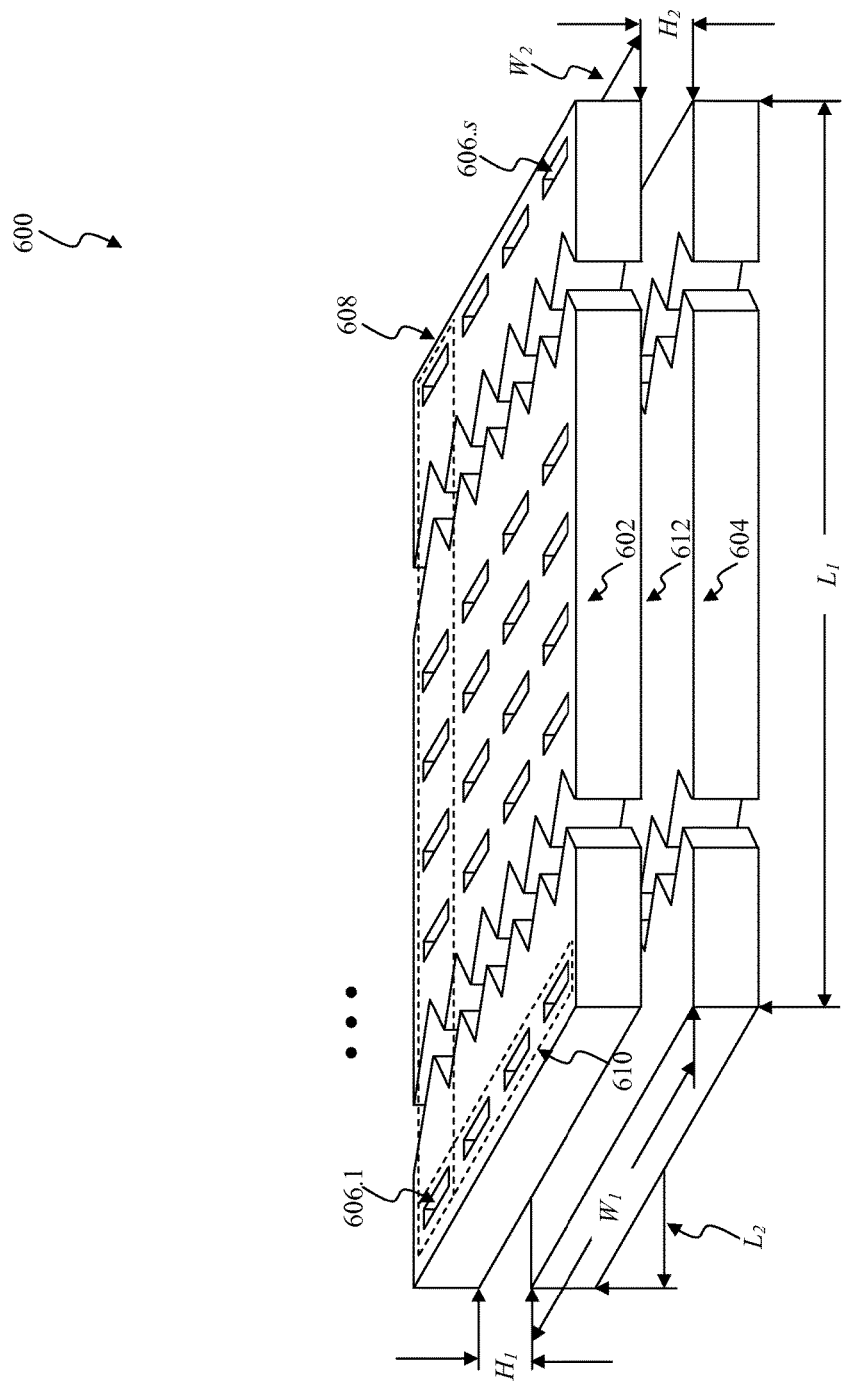
FIG. 6 illustrates a first integrated waveguide that is implemented as part of the first exemplary configuration and arrangement of the integrated circuit according to an exemplary embodiment of the present invention.

FIG. 6 illustrates a first integrated waveguide that is implemented as part of the first exemplary configuration and arrangement of the integrated circuit according to an exemplary embodiment of the present invention. An integrated waveguide 600 communicatively couples functional modules, such as the functional modules 508.1 through 508.d to provide an example, of an integrated circuit to each other as well as to other electrical, mechanical, and/or electro-mechanical circuits that are communicatively coupled to the integrated circuit. The integrated waveguide 600 may represent an exemplary embodiment of the integrated waveguide 510.

The integrated waveguide 600 includes a first conductive element 602 and a second conductive element 604 that are configured and arranged to form a parallel plate waveguide. The first conductive element 602 and/or the second conductive element 604 may be implemented using a conductive material, such as copper or copper-based materials to provide some examples, or any other suitable material that may reflect a cavity wave that propagates through the integrated waveguide 600 that will be apparent to those skilled in the relevant art(s) without departing from the spirit and scope of the present invention.

The first conductive element 602 and the second conductive element 604 may be characterized by a first length $L_1$ that is greater than, less than, or equal to a second length $L_2$. Similarly, the first conductive element 602 and the second conductive element 604 may be characterized by a first width $W_1$ that is greater than, less than, or equal to a second width $W_2$. In an exemplary embodiment, the first length $L_1$, the second length $L_2$, the first width $W_1$ and the second width $W_2$ are approximately proportional to a wavelength ($\lambda$) of a cavity wave that propagates through the integrated waveguide 600; however, those skilled in the relevant art(s) will recognize that other lengths and/or widths are possible without departing from the spirit and scope of the present invention.

The first conductive element 602 and the second conductive element 604 may be additionally characterized as being separated by a cavity region 612. The cavity region 612 may be characterized by a first height $H_1$ that is greater than, less than, or equal to a second height $H_2$. In an exemplary embodiment, the first height $H_1$ and the second height $H_2$ are approximately proportional to the wavelength ($\lambda$) of the cavity wave that propagates through the integrated waveguide 600; however, those skilled in the relevant art(s) will recognize that other heights are possible without departing from the spirit and scope of the present invention.

The cavity region 612 may represent a hollow region between the first conductive element 602 and the second conductive element 604. The hollow region represents a region approximating free space between the first conductive element 602 and the second conductive element 604. Alternatively, the cavity region 612 may represent a dielectric region between the first conductive element 602 and the second conductive element 604 having one or more dielectric materials that are characterized by one or more dielectric constants. For example, the dielectric region may include a first dielectric material having a first dielectric constant. As another example, a first portion of the dielectric region may include a first portion having the first dielectric material and a second portion of the dielectric region may include a second dielectric material having a second dielectric constant.

The first conductive element 602 and/or the second conductive element 604 may include static phase openings 606.1 through 606.s. The static phase openings 606.1 through 606.s represent regions within the first conductive element 602 and/or the second conductive element 604 that are free of conductive material. The static phase openings 606.1 through 606.s may be characterized as including one or more linear segments that are configured and arranged to form rectangular shapes. However, those skilled in the relevant art(s) will recognize that other closed geometric shapes that are formed using linear and/or non-linear segments are possible without departing from the spirit and scope of the present invention. These other closed geometric shapes may include regular or irregular polygons that are constructed of linear segments, closed curves that are constructed of non-linear segments, or any other geometric shape that may be constructed using any suitable combination of linear and non-linear segments that will be apparent to those skilled in the relevant art(s) without departing from the spirit and scope of the present invention. Additionally, those skilled in the relevant art(s) will recognize that each static phase opening from among the static phase openings 606.1 through 606.s may be similar to and/or dissimilar from other static phase openings from among the static phase openings 606.1 through 606.s without departing from the spirit and scope of the present invention.

The static phase openings 606.1 through 606.s are configured and arranged in a series of rows 608 and a series of columns 610 to form a rectangular shape. However, those skilled in the relevant art(s) will recognize the series of rows 608 and the series of columns 610 may be configured and arranged to form other geometric shapes without departing from the spirit and scope of the present invention. These other geometric shapes may include regular or irregular polygons, and/or closed curves to provide some examples. Typically, locations of the static phase openings 606.1 through 606.s are dependent upon a wavelength ($\lambda$) of the cavity wave that propagates through the integrated waveguide 600. For example, a larger wavelength ($\lambda$) results in a greater distance between the static phase openings 606.1 through 606.s within each row from among the series of rows 608 and each column from among the series of columns 610. As another example, each of the static phase openings 606.1 through 606.s are located at various positions within the first conductive element 602 where a current of the cavity wave that propagates through the integrated waveguide 600 may be characterized as being at maximum and/or a voltage of the cavity wave that propagates through the integrated waveguide 600 may be characterized as being at a minimum.

Figure 7:
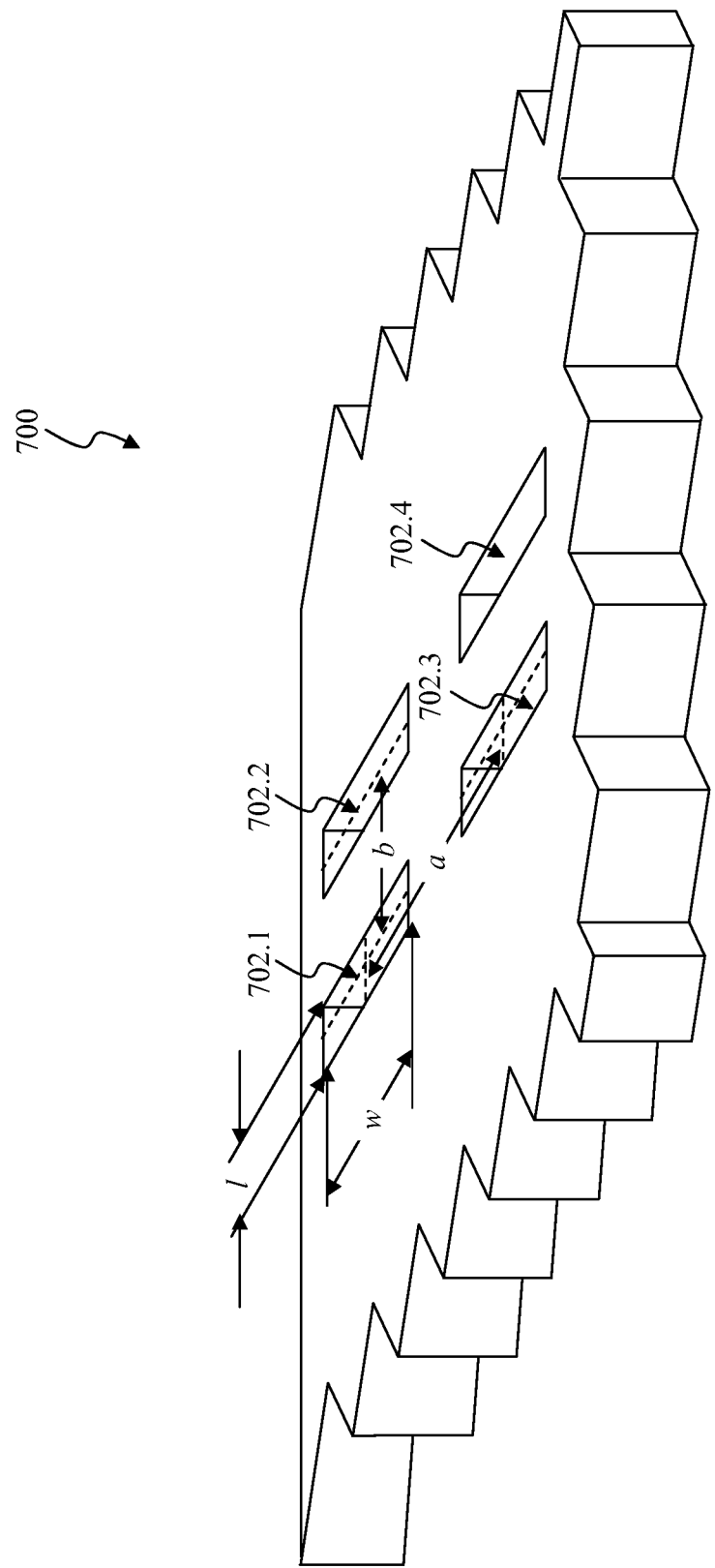
FIG. 7 illustrates a first conductive element that may be used in the integrated waveguide according to an exemplary embodiment of the present invention.

FIG. 7 illustrates a first conductive element that may be used in the integrated waveguide according to an exemplary embodiment of the present invention. An integrated waveguide, such as the integrated waveguide 600 to provide an example, includes at least one conductive element 700 that may be implemented using a conductive material, such as copper or copper-based materials to provide some examples, or any other suitable material that may reflect a cavity wave that propagates through the integrated waveguide that will be apparent to those skilled in the relevant art(s) without departing from the spirit and scope of the present invention. The conductive element 700 includes static phase openings 702.1 through 702.4 that represent regions within the conductive element 700 that are free of conductive material.

The static phase openings 702.1 through 702.4 may include one or more linear segments that are configured and arranged to form a rectangular shape that is characterized by a length l and a width w. In an exemplary embodiment, the length l and the width w are approximately proportional to a wavelength ($\lambda$) of the cavity wave that propagates through the integrated waveguide. These rectangular shapes are configured and arranged in a series of rows and a series of columns to form a grid pattern. As shown in FIG. 7, the static phase openings 702.1 and 702.2 represent a first row from among the series of rows and the static phase openings 702.3 and 702.4 represent a second row from among the series of rows. The first row and the second row are separated by a distance a. Similarly, the static phase openings 702.1 and 702.3 represent a first column from among the series of columns and the static phase openings 702.2 and 702.4 represent a second column from among the series of columns. The first column and the second column are separate by a distance b. In an exemplary embodiment, the distance a and the distance b are approximately proportional to the wavelength ($\lambda$) of the cavity wave that propagates through the integrated waveguide; however, those skilled in the relevant art(s) will recognize that other distances are possible without departing from the spirit and scope of the present invention.

Figure 8:
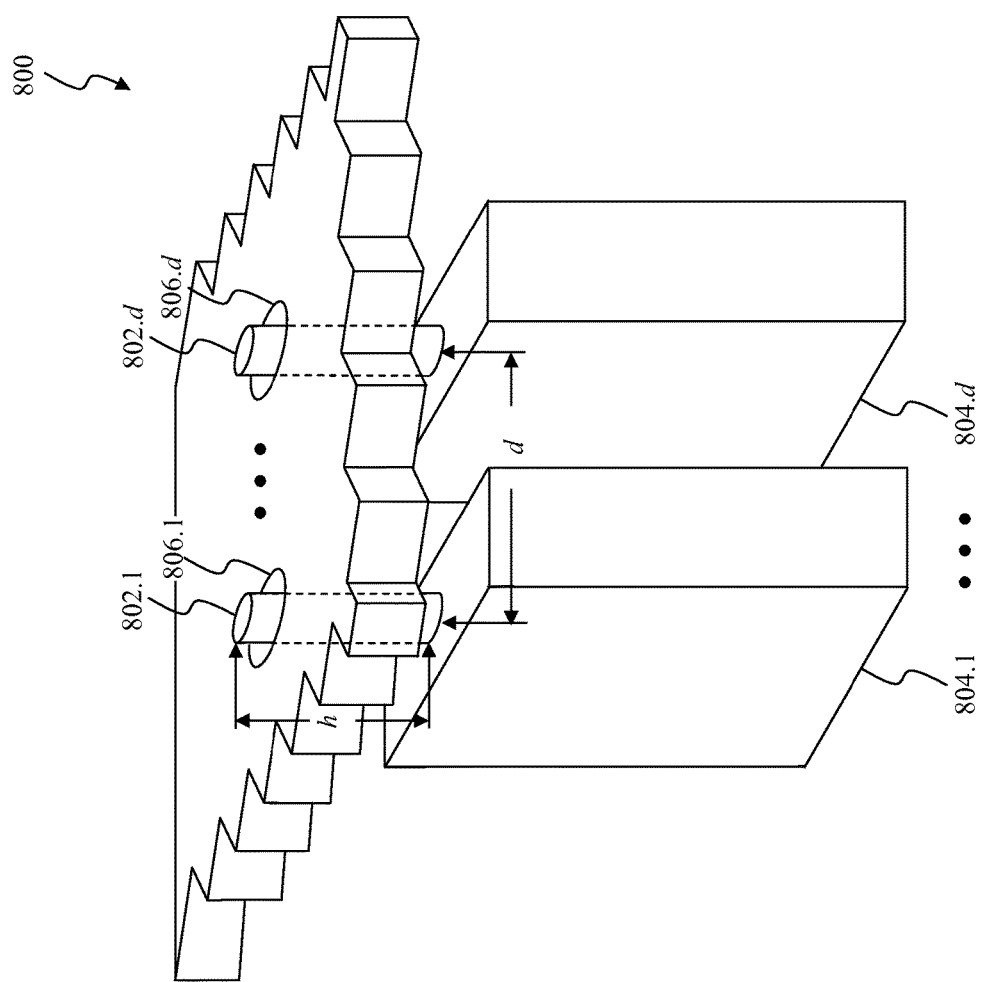
FIG. 8 illustrates a second conductive element that may be used in the first integrated waveguide according to an exemplary embodiment of the present invention.

FIG. 8 illustrates a second conductive element that may be used in the first integrated waveguide according to an exemplary embodiment of the present invention. An integrated waveguide, such as the integrated waveguide 600 to provide an example, includes at least one conductive element 800 that may be implemented using a conductive material, such as copper or copper-based materials to provide some examples, or any other suitable material that may reflect a cavity wave that propagates through the integrated waveguide that will be apparent to those skilled in the relevant art(s) without departing from the spirit and scope of the present invention. The conductive element 800 includes radiating elements 802.1 through 802.d that are formed within the conductive element 800 to provide the cavity wave to the integrated waveguide and/or receive the cavity wave from the integrated waveguide.

The radiating elements 802.1 through 802.d are formed within the conductive element 800. The radiating elements 802.1 through 802.d are separated from each other by a distance d. In an exemplary embodiment, the distance d is approximately proportional to a wavelength ($\lambda$) of the cavity wave that propagates through the integrated waveguide. The radiating elements 802.1 through 802.d may be formed by placing three dimensional geometric shapes of the conductive material, which may be similar or dissimilar to the conductive material of the conductive element 800, within non-conductive regions 806.1 through 806.d. The non-conductive regions 806.1 through 806.d represent regions within the conductive element 800 that are free from the conductive material to prevent the radiating elements 802.1 through 802.d from being in substantial contact with the conductive element 800. For example, the radiating elements 802.1 through 802.d may be formed by placing cylindrical shapes of the conductive material within the non-conductive regions 806.1 through 806.d. However, this example is not limiting, those skilled in the relevant art(s) will recognize that the other three dimensional geometric shapes may be used to form the radiating elements 802.1 through 802.d without departing from the spirit and scope of the present invention. These other three dimensional geometric shapes may include a polyhedra, a cone, a pyramid, a prism, or any other suitable three dimensional geometric shapes that will be apparent to those skilled in the relevant art(s). Those skilled in the relevant art(s) will also recognize that the radiating elements 802.1 through 802.d may be similar and/or dissimilar to each other without departing from the spirit and scope of the present invention.

The radiating elements 802.1 through 802.d are communicatively coupled to functional modules 804.1 through 804.d. Generally, the radiating elements 802.1 through 802.d are configured and arranged to match input and/or output impedances of the functional modules 804.1 through 804.d. For example, heights h of the radiating elements 802.1 through 802.d may be selected such that impedances of the radiating elements 802.1 through 802.d substantially match input and/or output impedances of the functional modules 804.1 through 804.d. The radiating elements 802.1 through 802.d may be characterized as extending above the conductive element 800 such that the impedances of the radiating elements 802.1 through 802.d substantially match the input and/or the output impedances of the functional modules 804.1 through 804.d. Alternatively, the radiating elements 802.1 through 802.d may be substantially planar with the conductive element 800 and/or the conductive element 800 may extend above the radiating elements 802.1 through 802.d.

Figure 9:
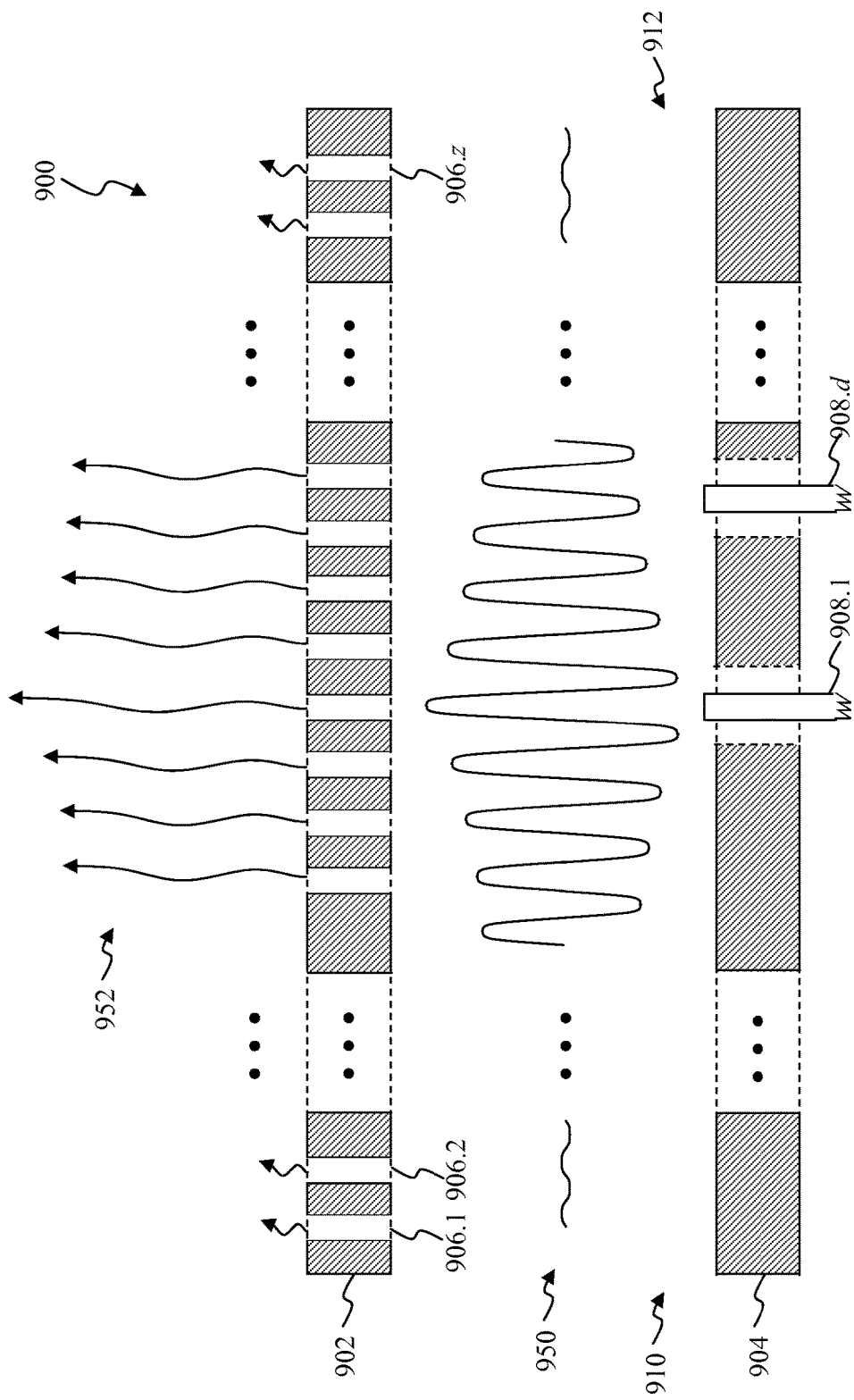
FIG. 9 illustrates a transmit mode of operation of the first integrated waveguide according to an exemplary embodiment of the present invention.

FIG. 9 illustrates a transmit mode of operation of the first integrated waveguide according to an exemplary embodiment of the present invention. One or more functional modules, such as one or more of the functional modules 202.1 through 202.i, one or more of the functional modules 302.1 through 302.i, and/or one or more of the functional modules 508.1 through 508.d to provide some examples, provide transmitted cavity waves to an integrated waveguide 900. The integrated waveguide 900 may represent an exemplary embodiment of the integrated waveguide 600.

The one or more functional modules each include a corresponding radiating element from among radiating elements 908.1 through 908.d for providing the transmitted cavity waves to the integrated waveguide 900. As shown in FIG. 9, a function module 908.1 provides a transmitted cavity wave 950 to the integrated waveguide 900. The transmitted cavity wave 950 may be observed by other radiating elements from among the radiating elements 908.1 through 908.d to allow for communication between the one or more functional modules. The transmitted cavity wave 950 may be encoded, modulated, and/or upconverted in accordance with the multiple access transmission scheme to allow for simultaneous and/or near simultaneous communication between functional modules.

The integrated waveguide 900 is configured and arranged to guide the transmitted cavity wave 950 between a first conductive element 902 and a second conductive element 904. Some of the transmitted cavity wave 950 leaks through confines of the first conductive element 902 and the second conductive element 904 via static phase openings 906.1 through 906.z as the transmitted cavity wave 950 propagates through the integrated waveguide 900. As a result, an amplitude of the transmitted cavity wave 950 decreases as it propagates through the integrated waveguide 900. For example, the amplitude of the transmitted cavity wave 950 at a distance x within the integrated waveguide 900 may be approximated as:

$$y(x)=e^{-\alpha x}, \qquad (1)$$

where y(x) represents the amplitude of the transmitted cavity wave 950 at a distance x from the radiating element 908 toward a first end 910 or a second end 912 of the integrated waveguide 900 and α represents a leakage constant. In an exemplary embodiment, the leakage constant α is of sufficient value such that the amplitude of the transmitted cavity wave 950 is negligible at the first end 910 or the second end 912.

Each portion of the transmitted cavity wave 950 that leaks through each of the static phase openings 906.1 through 906.z may be characterized as being substantially in phase with other portions of the transmitted cavity wave 950 that leak through other static phase openings 906.1 through 906.z. As a result, these portions of the transmitted cavity wave 950 that leak through the static phase openings 906.1 through 906.z may constructively combine to form a transmitted communication signal 952 to communicatively couple the functional module to other electrical, mechanical, and/or electro-mechanical circuits.

Each of the other function modules from among the one or more functional modules that are coupled to the radiating elements 908.1 through 908.d may provide other transmitted cavity waves that are substantially similar to the transmitted cavity wave 950. These other transmitted cavity waves may be encoded, modulated, and/or upconverted in accordance with the multiple access transmission scheme to allow for simultaneous and/or near simultaneous communication between functional modules and/or other electrical, mechanical, and/or electro-mechanical circuits that are communicatively coupled to the integrated waveguide 900.

Figure 10:
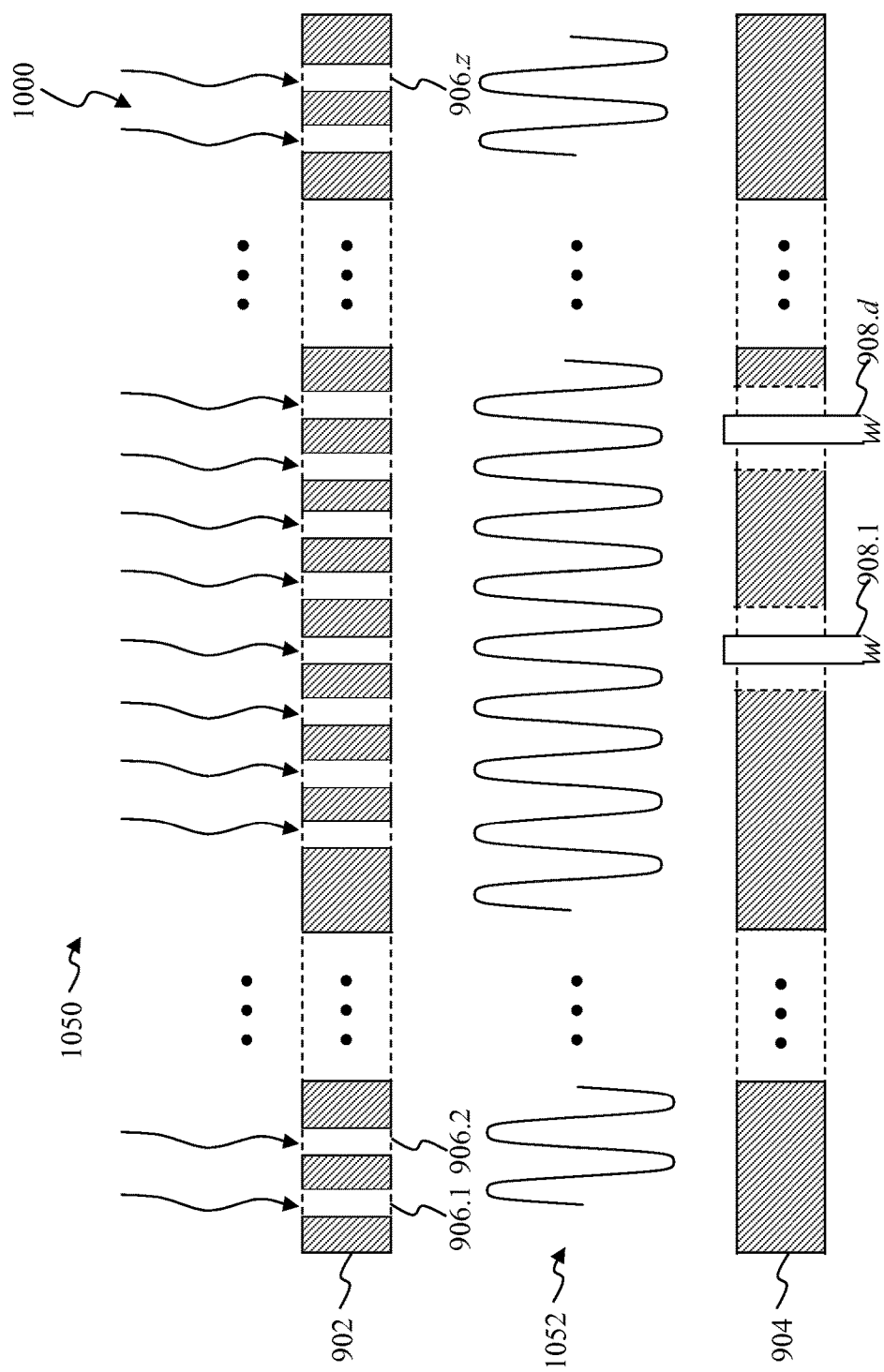
FIG. 10 illustrates a receive mode of operation of the first integrated waveguide according to an exemplary embodiment of the present invention.

FIG. 10 illustrates a receive mode of operation of the first integrated waveguide according to an exemplary embodiment of the present invention. Other electrical, mechanical, and/or electro-mechanical circuits may provide received communication signals to an integrated waveguide 1000. The integrated waveguide 1000 may represent an exemplary embodiment of the integrated waveguide 600. The integrated waveguide 1000 shares many substantially similar features with the integrated waveguide 900; therefore, only differences between the integrated waveguide 900 and the integrated waveguide 1000 are to be discussed in further detail below.

These other electrical, mechanical, and/or electro-mechanical circuits may provide received communications signals to communicate with one or more of one or more functional modules. As shown in FIG. 10, an electrical, mechanical, and/or electro-mechanical circuit provides a received communication signal 1050 to the integrated waveguide 900. The received communication signal 1050 leaks through the static phase openings 906.1 through 906.z to provide a received cavity wave 1052. The received cavity wave 1052 propagates through the integrated waveguide 1000 whereby it is observed by the radiating elements 908.1 through 908.d.

Each of the other electrical, mechanical, and/or electro-mechanical circuits that are communicatively coupled to the integrated waveguide 1000 may provide other received communication signals that are substantially similar to the received communication signal 1050. These other received communication signals and the received communication signal 1050 may be encoded, modulated, and/or upconverted in accordance with the multiple access transmission scheme to allow for simultaneous and/or near simultaneous communication between the one or more functional modules and the electrical, mechanical, and/or electro-mechanical circuits that are communicatively coupled to the integrated waveguide 1000

Second Exemplary Configuration and Arrangement of the Integrated Circuit

Figure 11:
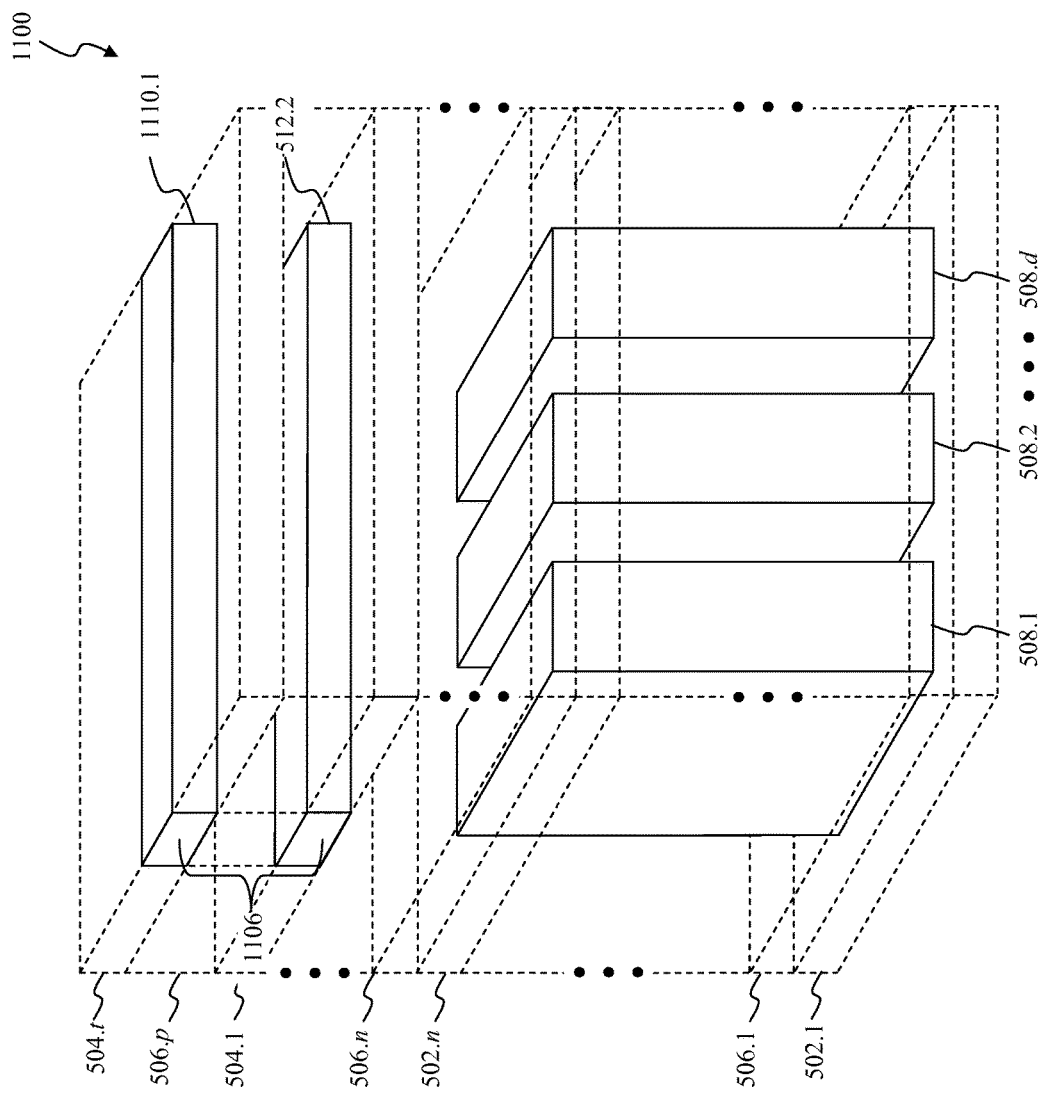
FIG. 11 illustrates a second exemplary configuration and arrangement of the integrated circuit according to an exemplary embodiment of the present invention.

FIG. 11 illustrates a second exemplary configuration and arrangement of the integrated circuit according to an exemplary embodiment of the present invention. A semiconductor device fabrication operation uses a predetermined sequence of photographic and/or chemical processing steps to form one or more functional modules onto a semiconductor substrate and an integrated waveguide onto the semiconductor substrate to communicatively couple these functional modules to form an integrated circuit 1100 onto the semiconductor substrate. The integrated circuit 1100 may represent an exemplary embodiment of the integrated circuit 200 and/or the integrated circuit 300. The integrated circuit 1100 shares many substantially similar features with the integrated circuit 500; therefore, only differences between the integrated circuit 500 and the integrated circuit 1100 are to be discussed in further detail below.

The semiconductor device fabrication operation forms the integrated circuit 1100 onto the arrangement of useable fabrication layers from among the semiconductor substrate. As shown in FIG. 11, the semiconductor substrate includes the first group of useable fabrication layers 502.1 through 502.$n$ and the second group of useable fabrication layers 504.1 through 504.$t$.

The first group of the useable fabrication layers 502.1 through 502.$n$ is used to form various components, such as electrical components, mechanical components, and/or electro-mechanical components to provide some examples, of the functional modules 508.1 through 508.$d$. At least one of the functional modules from among the functional modules 508.1 through 508.$d$, such as the functional module 508.1 to provide an example, is configured and arranged to form a waveguide controller module to configure and/or operate the integrated waveguide 1106. For example, the integrated waveguide 1106 may include one or more dynamic phase openings that, in response to commands from the waveguide controller module, may be opened and/or closed to dynamically configure its operating characteristics. The waveguide controller module may be coupled to the integrated waveguide 1106 using conductive traces that are formed within the second group of useable fabrication layers 504.1 through 504.$t$ or any other suitable means that will be apparent to those skilled in the relevant art(s) without departing from the spirit and scope of the present invention.

The second group of useable fabrication layers 504.1 through 504.$t$ is used form the various components of the integrated waveguide 1106. The integrated waveguide 1110 includes a first conductive element 1110.1 formed onto a first useable fabrication layer from among the second group of useable fabrication layers 504.1 through 504.$t$ and the second conductive element 512.2 formed onto the second useable fabrication layer from among the second group of useable fabrication layers 504.1 through 504.$t$. The first useable fabrication layer may be separated from the second useable fabrication layer by the insulation layer 506.$p$, one or more usable fabrication layers from among the semiconductor substrate interdigitated with the insulation layers 506.1 through 506.$p$, not illustrated in FIG. 11, and/or a free space region that is free from useable fabrication layers and insulation layers, not illustrated in FIG. 11.

Figure 12:
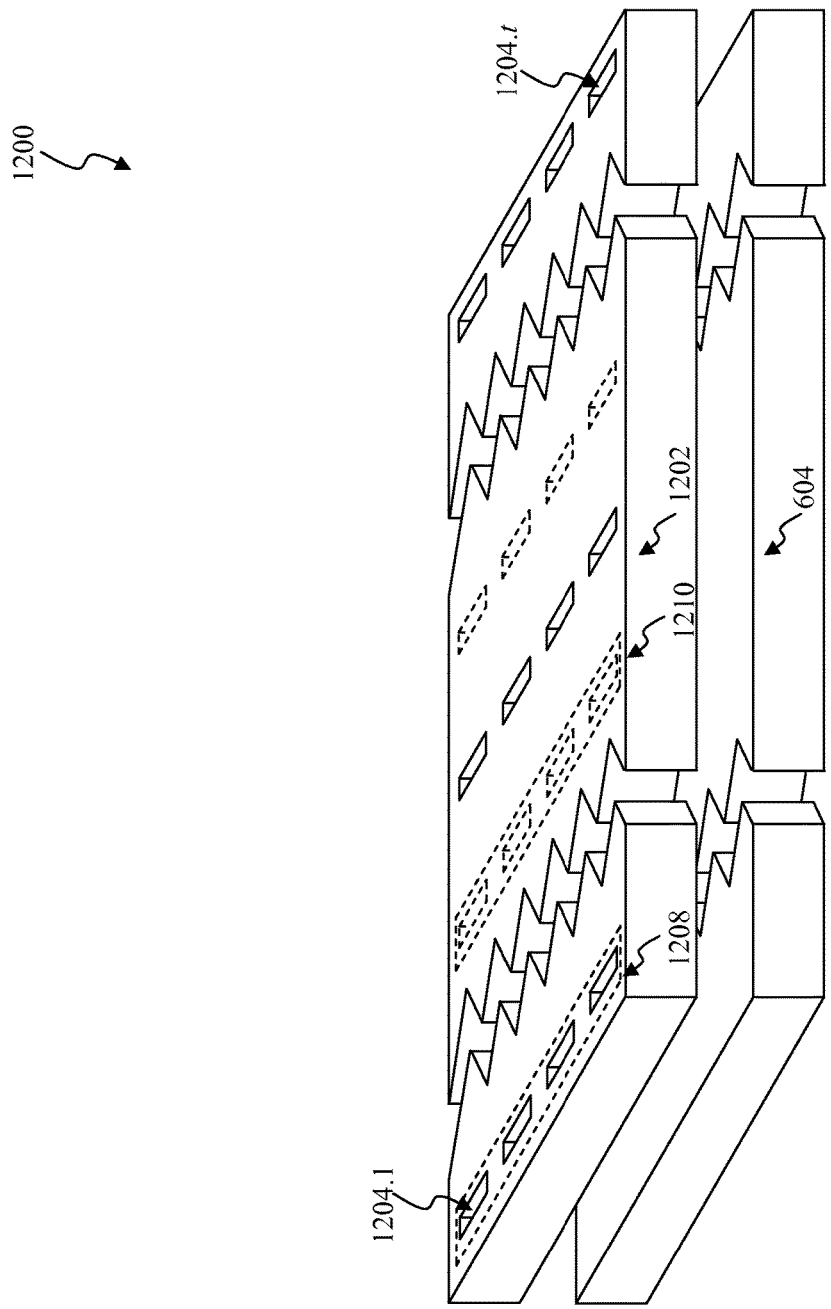
FIG. 12 illustrates a second integrated waveguide that is implemented as part of the second exemplary configuration and arrangement of the integrated circuit according to an exemplary embodiment of the present invention.

FIG. 12 illustrates a second integrated waveguide that is implemented as part of the second exemplary configuration and arrangement of the integrated circuit according to an exemplary embodiment of the present invention. An integrated waveguide 1200 communicatively couples functional modules, such as the functional modules 508.1 through 508.$d$ to provide an example, of an integrated circuit to each other as well as to other electrical, mechanical, and/or electro-mechanical circuits that are communicatively coupled to the integrated circuit. The integrated waveguide 1200 may represent an exemplary embodiment of the integrated waveguide 1006. The integrated waveguide 1200 shares many substantially similar features with the integrated waveguide 600; therefore, only differences between the integrated waveguide 600 and the integrated waveguide 1200 are to be discussed in further detail below.

The integrated waveguide 1200 includes a first conductive element 1202 and the second conductive element 604 that are configured and arranged to form the parallel plate waveguide. The first conductive element 1202 is shares substantially similar to the first conductive element 602; however, the integrated waveguide 1200 includes dynamic phase openings 1204.1 through 1204.$t$. Unlike the static phase openings 606.1 through 606.$s$ which are always open, the dynamic phase openings 1204.1 through 1204.$t$ may be configurable to be either opened or closed to dynamically configure operating characteristics of the integrated waveguide 1200. Those dynamic phase openings 1204.1 through 1204.$t$ that are characterized as being opened allow a cavity wave that is propagating through the integrated waveguide 1200 to substantially leak; whereas, those dynamic phase openings 1204.1 through 1204.$t$ that are characterized as being closed substantially prevent the cavity wave from substantially leaking.

As discussed above, each of the static phase openings 606.1 through 606.$s$ are located at various positions along the integrated waveguide 600 where a current of the cavity wave that propagates through the integrated waveguide 600 is at maximum and/or a voltage of the cavity wave is at a minimum. However, the maximum of the current and/or the minimum of the voltage are dependent upon a wavelength ($\lambda$) of the cavity wave and their locations within the integrated waveguide 1200 may be different for different cavity waves having different wavelengths. The dynamic phase openings 1204.1 through 1204.$t$ may be opened and/or closed to accommodate for these different locations of the maximum of the current and/or the minimum of the voltage for different cavity waves.

For example, a first column 1208 of the dynamic phase openings 1204.1 through 1204.$t$ may be configured to be opened and a second column 1210 of the dynamic phase openings 1204.1 through 1204.$t$ may be configured to be closed to allow a cavity wave that is characterized by a first wavelength to optimally leak through the first column 1208. As another example, the first column 1208 may be configured to be closed and the second column 1210 may be configured to be opened to allow a second cavity wave that is characterized by a second wavelength to optimally leak through the second column 1210. However, these examples are not limiting those skilled in the relevant art(s) will recognize that the dynamic phase openings 1204.1 through 1204.$t$ may be independently opened and/or closed without departing from the spirit and scope of the present invention.

Additionally, the dynamic phase openings 1204.1 through 1204.$t$ may be opened and/or closed to dynamically achieve different radiation characteristics, such as direction to provide an example, for the cavity wave that is propagating through the integrated waveguide 1200.

FIG. 13A and FIG. 13B illustrate first and second exemplary configurations of a first electro-mechanical device that may be used to dynamically configure operating characteristics of the second integrated waveguide according to an exemplary embodiment of the present invention. An integrated waveguide, such as the integrated waveguide 1100 to provide an example, includes at least one conductive element 1302 that may be implemented using a conductive material, such as copper or copper-based materials to provide some examples, or any other suitable material that may reflect a cavity wave that propagates through the integrated waveguide that will be apparent to those skilled in the relevant art(s) without departing from the spirit and scope of the present invention. The conductive element 1302 includes at least one a dynamic phase opening 1312 that represent regions within the conductive element 1302 that are free of conductive material. The dynamic phase opening 1312 may represent an exemplary embodiment of one or more of the dynamic phase openings 1204.1 through 1204.t.

A micro-electro-mechanical system (MEMS) actuator, such as a piezoelectric actuator 1304 or any other suitable linear actuator, converts an electrical signal that is received from a waveguide controller module that is communicatively coupled to the integrated waveguide to a mechanical actuation. The mechanical actuation may displace a conductive patch from a first location 1314 to a second location 1316 over the dynamic phase opening 1312 to close the dynamic phase opening 1312. Alternatively, the mechanical actuation may displace the conductive patch from the second location 1316 to the first location 1314 to open the dynamic phase opening 1312. In another alternate, the mechanical actuation may displace the conductive patch from either the first location 1314 or the second location 1316 to a third location between the first location 1314 and the second location 1316 to partially open or partially close the dynamic phase opening 1312.

The piezoelectric actuator 1304 is configurable to open and/or to close the dynamic phase opening 1312 to dynamically configure the operating characteristics of the integrated waveguide. The piezoelectric actuator 1304 includes an actuator control module 1306, a piezoelectric element 1308, and a conductive patch 1310. The actuator control module 1304 receives a command from the waveguide controller module to open and/or to close the dynamic phase opening 1312. The actuator control module 1304 may receive a command from the waveguide controller module which indicates that the dynamic phase opening 1312 is to be opened, to be closed, or to be partially opened or partially closed. The command may represent a simple electrical signal, such as a voltage, indicating whether the dynamic phase opening 1312 is to be opened and/or to be closed. Alternatively, the command may represent an encoded electrical signal indicating a distance from the first location 1314 and/or the second location 1316 that the conductive patch 1310 is to be displaced. The actuator control module 1304 provides a displacement voltage to the piezoelectric element 1308 to displace the conductive patch 1310 in accordance with the command.

The piezoelectric element 1308 expands and/or contracts in response to the displacement voltage to provide the mechanical actuation to displace the conductive patch 1310. For example, the piezoelectric element 1308 converts the displacement voltage to the mechanical actuation to displace the conductive patch 1310 from the second location 1316 to the first location 1314 as shown in FIG. 13A. As another example, the piezoelectric element 1308 converts the displacement voltage to the mechanical actuation to displace the conductive patch 1310 from the first location 1314 to the second location 1316 as shown in FIG. 13B. As a further example, the piezoelectric element 1308 converts the displacement voltage to the mechanical actuation to displace the conductive patch 1310 from the first location 1314 or the second location 1316 to any other suitable location between the first location 1314 and the second location 1316 that will be apparent to those skilled in the relevant art(s) without departing from the spirit and scope of the present invention.

The piezoelectric element 1308 may be implemented using aluminum nitride, apatite, barium titanate, bismuth ferrite, gallium phosphate, lanthanum gallium silicate, lead scandium tantalate, lead zirconate titanate, lithium tantalite, polyvinylidene fluoride, potassium sodium tartrate, quartz, or any suitable material that expands and/or contracts in response to a voltage that will be apparent to those skilled in the relevant art(s) without departing from the spirit and scope of the present invention.

The conductive patch 1310 is coupled to the piezoelectric element 1308 such its expansion and/or contraction of the piezoelectric element 1308 displaces the conductive patch 1310. Typically, the conductive patch 1310 is implemented using a conductive material which may be substantially similar or dissimilar to the conductive material used to implement the conductive element 1302. This allows the conductive patch 1310 to be in substantial contact with the conductive element 1302 when the conductive patch 1310 is at and/or near the second location 1316.

FIG. 14A and FIG. 14B illustrate first and second exemplary configurations of a second electro-mechanical device that may be used to dynamically configure operating characteristics of the second integrated waveguide according to an exemplary embodiment of the present invention. An integrated waveguide includes at least one conductive element 1402 that includes a dynamic phase opening 1404. The dynamic phase opening 1404 may represent an exemplary embodiment of one or more of the dynamic phase openings 1204.1 through 1204.t.

As shown in FIG. 14A and FIG. 14B, a micro-electro-mechanical system (MEMS) switch, such as a cantilever switch 1406 or any other suitable MEMS switch, converts an electrical signal that is received from a waveguide controller module to a mechanical actuation. The mechanical actuation may displace an actuator from a first location 1414 to a second location 1416 over the dynamic phase opening 1404 to close the dynamic phase opening 1404. Alternatively, the mechanical actuation may displace the actuator from the second location 1416 to the first location 1414 to open the dynamic phase opening 1404. In another alternate, the mechanical actuation may displace the actuator from either the first location 1414 or the second location 1416 to a third location between the first location 1414 and the second location 1416 to partially open or partially close the dynamic phase opening 1404.

The cantilever switch 1406 is configurable to open and/or to close the dynamic phase opening 1404 to dynamically configure the operating characteristics of the integrated waveguide. The cantilever switch 1406 includes an electrode 1408 and a cantilever 1410. The waveguide controller module provides a command, typically, in the form of a bias voltage, to the electrode 1408. The command indicates that the dynamic phase opening 1404 is to be opened, to be closed, or to be partially opened or partially closed.

The bias voltage produces an electrostatic force between the electrode 1408 and the cantilever 1410. When a voltage of the bias voltage reaches a sufficient threshold value, the electrostatic force is sufficient to cause the mechanical actuation. The mechanical actuation displaces the cantilever 1410 from the first location 1414 to the second location 1416 to close the dynamic phase opening 1404. Alternatively, when a voltage of the command is reduced below the sufficient threshold value, the electrostatic force is no longer sufficient to cause the mechanical actuation. As a result, the cantilever 1410 is displaced from the second location 1416 to the first location 1414 to open the dynamic phase opening 1404.

Third Exemplary Configuration and Arrangement of the Integrated Circuit

Figure 15:
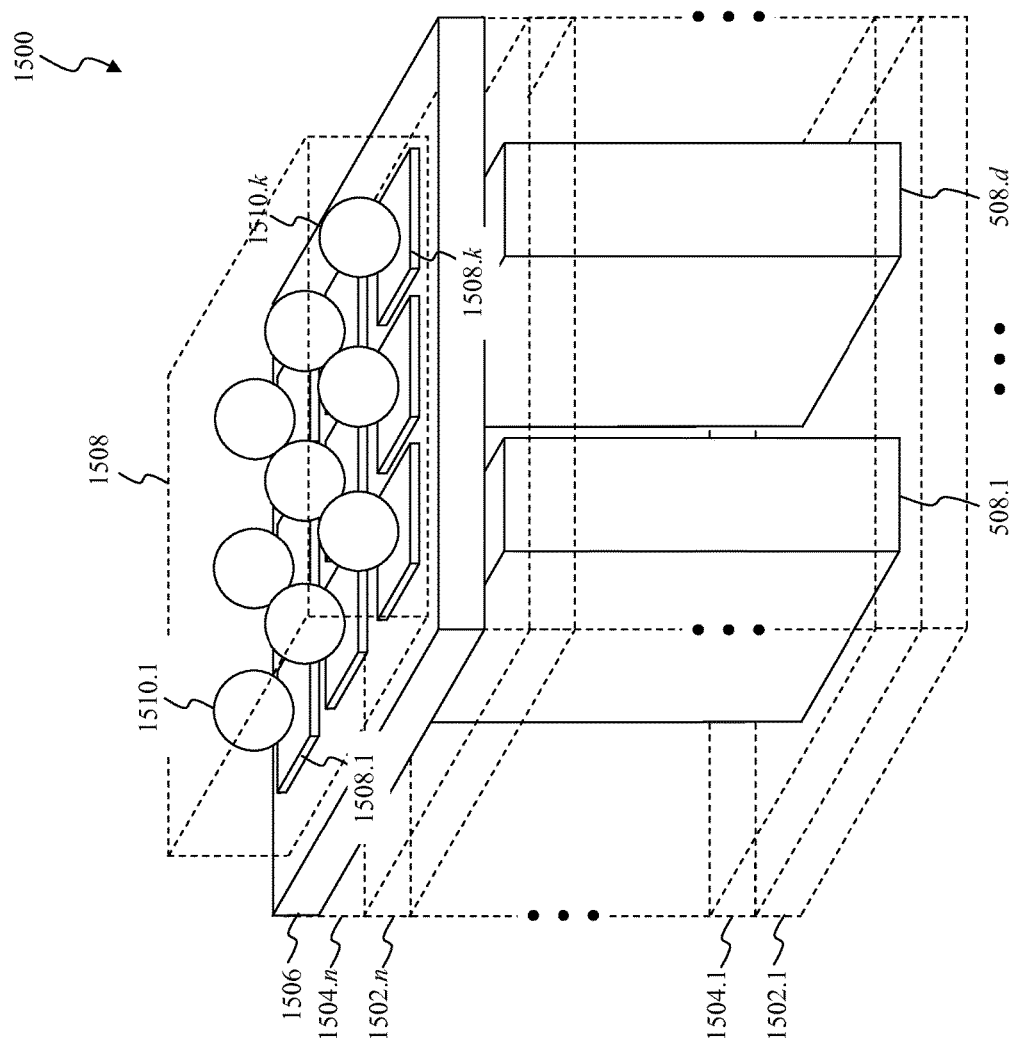
FIG. 15 illustrates a flip chip configuration of functional modules of the integrated circuit according to an exemplary embodiment of the present invention.

FIG. 15 illustrates a flip chip configuration of functional modules of the integrated circuit according to an exemplary embodiment of the present invention. A semiconductor device fabrication operation uses a predetermined sequence of photographic and/or chemical processing steps to form one or more functional modules onto a semiconductor substrate to form a flip chip package 1500. The flip chip package 1500 may represent an exemplary configuration and arrangement of the one or more functional modules 202.1 through 202.$i$, the one or more functional modules 302.1 through 302.$i$, and/or the functional module 400.

Typically, the one or more functional modules 508.1 through 508.$d$ are formed onto useable fabrication layers 1502.1 through 1502.$n$ interdigitated insulation layers 1504.1 through 1504.$n$. The useable fabrication layers 1502.1 through 1502.$n$ and the insulation layers 1504.1 through 1504.$n$ are substantially similar to the first group of useable fabrication layers 502.1 through 502.$n$ and the insulation layers 506.1 through 506.$p$, respectively, and will not be described in further detail.

The semiconductor device fabrication operation form an integrated circuit interface 1508 onto a useable fabrication layer 1506 to communicatively couple the one or more functional modules 508.1 through 508.$d$ to other electrical, mechanical, and/or electro-mechanical circuits. The integrated circuit interface 1504 includes chip pads 1508.1 through 1508.$k$ that are formed onto the useable fabrication layer 1506. The configuration and arrangement of the chip pads 1508.1 through 1508.$k$ as shown in FIG. 15 are for illustrative purposes only. Those skilled in the relevant art(s) will recognize that the chip pads 1508.1 through 1508.$k$ may be configured and arranged differently without departing from the spirit and scope of the present invention. Those skilled in relevant art(s) will also recognize that the integrated circuit interface 1504 may include more or less chip pads than illustrated in FIG. 15 without departing from the spirit and scope of the present invention.

The chip pads 1508.1 through 1508.$k$ are coupled to one or more of the functional modules 508.1 through 508.$d$ to form interconnections between these functional modules and other electrical, mechanical, and/or electro-mechanical circuits. For example, these interconnections may be used to route information, such as data and/or one or more commands, power, ground, or any other suitable electrical signal that will be apparent to those skilled in the relevant art(s) without departing from the spirit and scope of the present invention. As another example, one or more of the chip pads 1508.1 through 1508.$k$ may be used to form interconnections between the functional modules 508.1 through 508.$d$ and a communication channel, such as the integrated waveguide 600 and/or the integrated waveguide 1200 to provide some examples.

The chip pads 1508.1 through 1508.$k$ are metalized with a conductive material, such as copper or copper-based materials to provide some examples, or any other suitable material that will be apparent to those skilled in the relevant art(s), for coupling of these chip pads to solder bumps 1510.1 through 1510.$k$. The solder bumps 1510.1 through 1510.$k$ allow the chip pads 1508.1 through 1508.$k$ to form interconnections between the flip chip package 1500 and other electrical, mechanical, and/or electro-mechanical circuits when melted.

Figure 16:
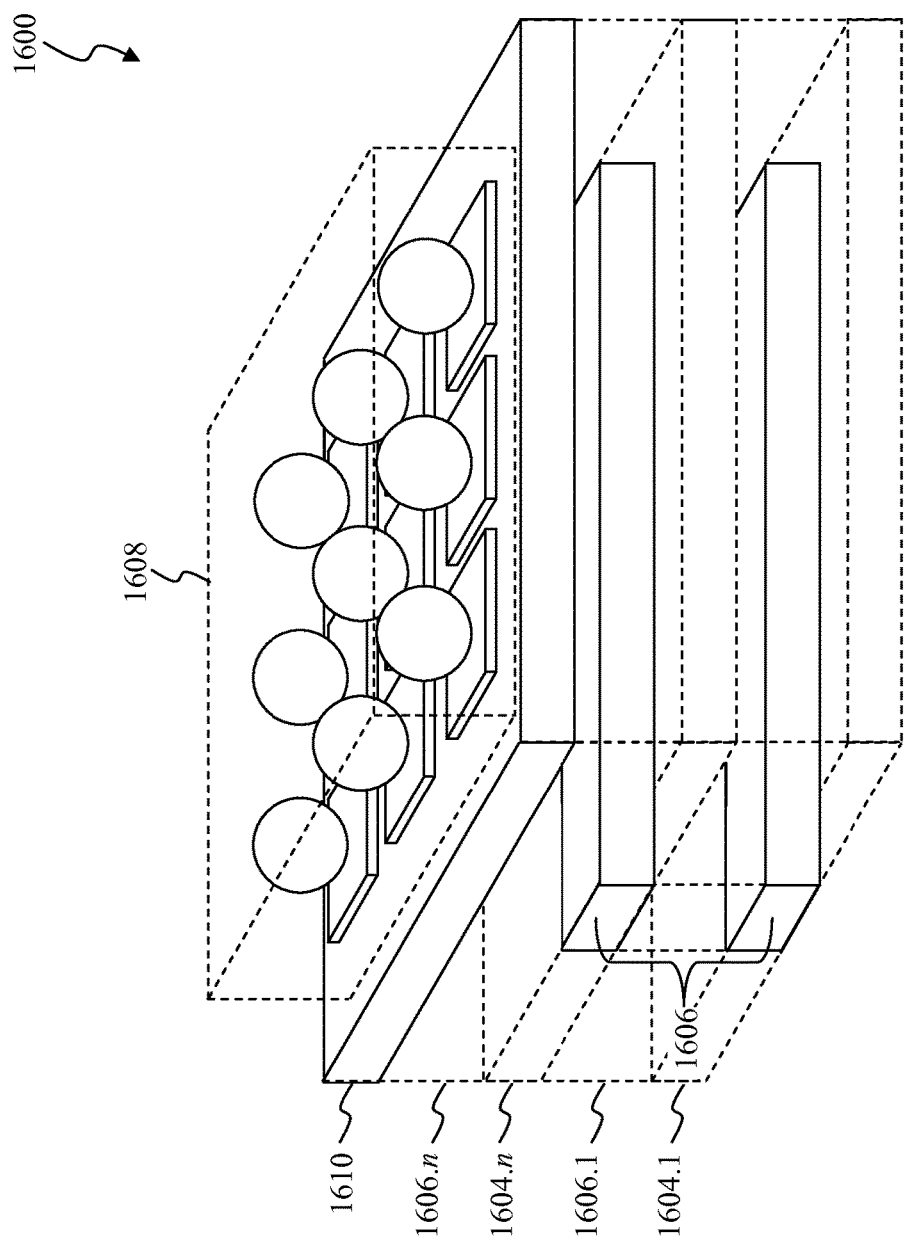
FIG. 16 illustrates a flip chip configuration of an integrated waveguide that is implemented as part of the integrated circuit according to an exemplary embodiment of the present invention.

FIG. 16 illustrates a flip chip configuration of an integrated waveguide that is implemented as part of the integrated circuit according to an exemplary embodiment of the present invention. A semiconductor device fabrication operation uses a predetermined sequence of photographic and/or chemical processing steps to form an integrated waveguide 1602 onto a semiconductor substrate to form a flip chip package 1600. The flip chip package 1600 may represent an exemplary embodiment of the dedicated communications channel 206 and/or the common communications channel 306.

Typically, the integrated waveguide 1602 is formed onto useable fabrication layers 1604.1 through 1604.$n$ interdigitated insulation layers 1606.1 through 1606.$n$. The fabrication layers 1604.1 through 1604.$n$ and the insulation layers 1606.1 through 1606.$n$ are substantially similar to the second group of useable fabrication layers 504.1 through 504.$t$ and the insulation layers 506.1 through 506.$p$, respectively, and will not be described in further detail.

The semiconductor device fabrication operation form an integrated circuit interface 1608 onto a useable fabrication layer 1610 to communicatively couple the integrated waveguide 1602 to other electrical, mechanical, and/or electro-mechanical circuits. The integrated circuit interface 1608 is substantially similar to the integrated circuit interface 1504 and will not be described in further detail.

Figure 17:
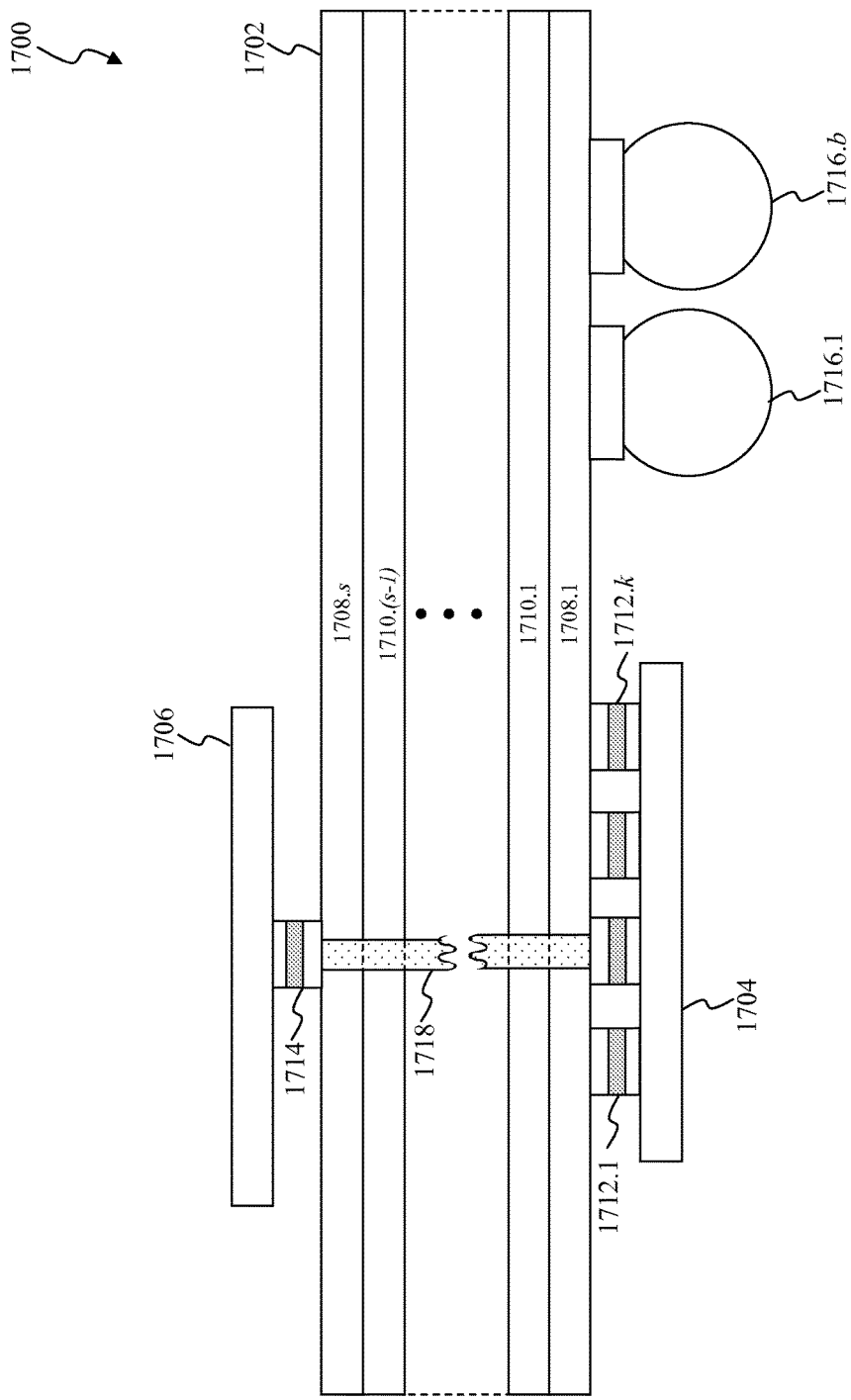
FIG. 17 illustrates a third exemplary configuration and arrangement of the integrated circuit according to an exemplary embodiment of the present invention.

FIG. 17 illustrates a third exemplary configuration and arrangement of the integrated circuit according to an exemplary embodiment of the present invention. One or more functional modules of the integrated circuit are configured and arranged onto a first flip chip package and an integrated antenna is configured and arranged onto a second flip chip package. The first flip chip package and the second flip chip package are coupled to a substrate to form an integrated circuit 1700. The substrate provides power signals and/or information, such as data and/or one or more commands, between the first flip chip package and the second flip chip package. The integrated circuit 1700 may represent an exemplary embodiment of the integrated circuit 200 and/or the integrated circuit 300.

The integrated circuit 1700 includes a substrate 1702, a first flip chip package 1704, and a second flip chip package 1706. The substrate 1702 forms interconnections between the first flip chip package 1704 and the second flip chip package 1706 to communicatively couple these flip chip packages. For example, the substrate 1702 provides power signals to the first flip chip package 1704 and/or the second flip chip package 1706. As another example, the substrate 1702 routes information, such as data and/or one or more commands, between the first flip chip package 1704 and the second flip chip package 1706.

The substrate 1702 represents a semiconductor substrate that includes useable fabrication layers 1708.1 through 1708.$s$ interdigitated with insulation layers 1710.1 through 1710.($s-1$). Alternatively, the useable fabrication layers 1708.1 through 1708.$s$ and the insulation layers 1710.1 through 1710.$q$ may represent layers of a printed circuit board (PCB) also referred to as a printed circuit substrate. Typically, electrical components, mechanical components, electro-mechanical components, or any other suitable components that will be apparent to those skilled in the relevant art(s) may be formed onto one or more of the useable fabrication layers 1708.1 through 1708.$s$. For example, the useable fabrication layers 1708.1 through 1708.$s$ may include a power source, such as an internal battery to provide an example, to provide the power signals to the first flip chip package 1704 and/or the second flip chip package 1706. As another example, the useable fabrication layers 1708.1 through 1708.$s$ may include one or more voltage regulators to regulate this power source or any other suitable power source to provide the power signals to the first flip chip package 1704 and/or the second flip chip package 1706. As a further example, the useable fabrication layers 1708.1 through 1708.*s* may include a controller module, such as the waveguide controller module, for controlling overall operation of the first flip chip package 1704 and/or the second flip chip package 1706.

The substrate 1702 includes interconnections 1712.1 through 1712.*k* and interconnection 1714 to form a first group of interconnections between the first flip chip package 1704 and the substrate 1702 and the second group of interconnections between the second flip chip package 1706 and the substrate 1702, respectively. However, those skilled in the relevant art(s) will recognize that the first group of interconnections and/or the second group of interconnections may include any suitable number of interconnections without departing from the spirit and scope of the present invention. Typically, the first group of interconnections includes a first group of chip pads that are formed onto the first flip chip package 1704 that are coupled to a second group of chip pads that are formed onto the substrate 1702 with melted solder bumps. Similarly, the second group of interconnections includes a first group of chip pads that are formed onto the second flip chip package 1706 that are coupled to a second group of chip pads that are formed onto the substrate 1702 with melted solder bumps.

The substrate 1702 additionally includes interconnections 1716.1 through 1716.*b* to form interconnections between other electrical, mechanical, and/or electro-mechanical circuits. The interconnections 1716.1 through 1716.*b* include chip pads that may be coupled to corresponding chip pads that are formed on these other circuits by melting their corresponding solder bumps. In an exemplary embodiment, the interconnections 1716.1 through 1716.*b* route information, such as data and one or more commands, and/or power signals between the integrated circuit 1700 and the these other circuits.

The substrate 1702 further includes a transmission line 1718 formed within the substrate 1702 to form an interconnection between the first flip chip package 1704 and the second flip chip package 1706. Those skilled in the relevant art(s) will recognize that the substrate 1702 may include more than one transmission line 1718 to form other interconnection between the first flip chip package 1704 and the second flip chip package 1706 without departing from the spirit and scope of the present invention. Specifically, the transmission line 1718 forms the interconnection between a first interconnection, namely one of the interconnections 1712.1 through 1712.*k*, from among the first group of interconnections and a second interconnection, namely the interconnection 1714, from among the second group of interconnections. The configuration and arrangement of the transmission line 1718 as shown in FIG. 17 is for illustrative purposes only. Those skilled in the relevant art(s) will recognize that the transmission line 1718 may traverse any suitable path through the substrate 1702 without departing from the spirit and scope of the present invention. For example, the transmission line 1718 may traverse along any suitable linear and/or non-linear path to communicatively couple the first flip chip package 1704 and the second flip chip package 1706.

The first flip chip package 1704 includes one or more functional modules that are communicatively coupled to the substrate 1702 and/or the second flip chip package 1706. The first flip chip package 1704 may represent an exemplary embodiment of the flip chip package 1500.

The second flip chip package 1706 includes one or more antennas for transmitting communications signals to other electrical, mechanical, and/or electro-mechanical circuits that are communicatively coupled to the integrated circuit 1700 and/or for receiving other communications signals from these other circuits. The one or more antennas may be implemented using one or more monopole antennas, one or more dipole antennas, one or more phased arrays, one or more patch antennas, one or more waveguides or any other suitable device which converts electric currents into electromagnetic waves that will be apparent to those skilled in the relevant art(s) without departing from the spirit and scope of the present invention. Alternatively, the second flip chip package 1706 may represent an exemplary embodiment of the flip chip package 1600.

Fourth Exemplary Configuration and Arrangement of the Integrated Circuit

Figure 18:
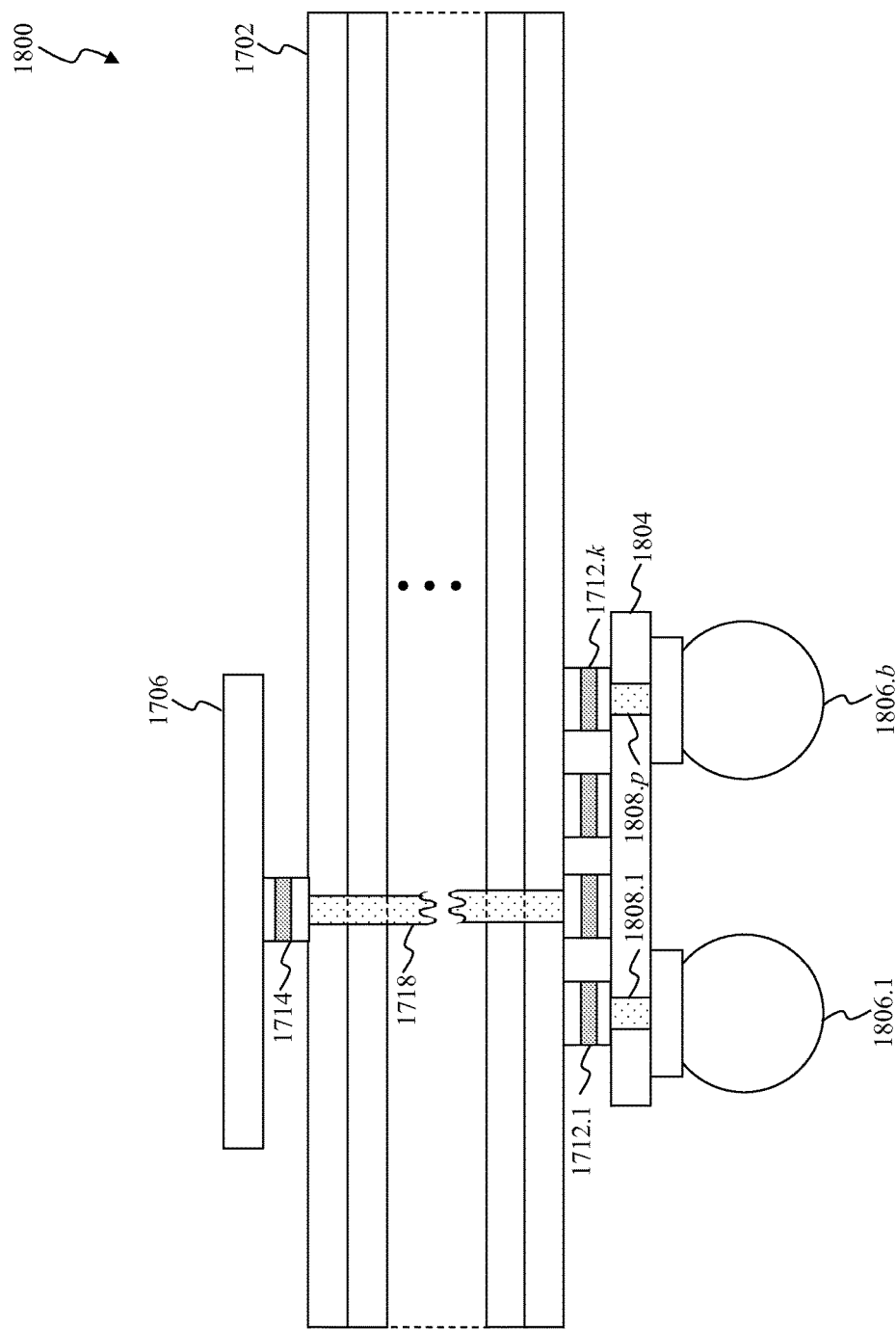
FIG. 18 illustrates a fourth exemplary configuration and arrangement of the integrated circuit according to an exemplary embodiment of the present invention.

FIG. 18 illustrates a fourth exemplary configuration and arrangement of the integrated circuit according to an exemplary embodiment of the present invention. One or more functional modules of the integrated circuit are configured and arranged onto a first flip chip package and an integrated antenna is configured and arranged onto a second flip chip package. The first flip chip package and the second flip chip package are coupled to a substrate to form an integrated circuit 1800. The other electrical, mechanical, and/or electro-mechanical circuits that are communicatively coupled to the integrated circuit 1800 may provide power signals and/or information, such as data and/or one or more commands, to the first flip chip package. The first flip chip package may route the power signals and/or the information to the substrate where it is then routed to the second flip chip package. The integrated circuit 1800 may represent an exemplary embodiment of the integrated circuit 200 and/or the integrated circuit 300. The integrated circuit 1800 shares many substantially similar features with the integrated circuit 1700; therefore, only differences between the integrated circuit 1700 and the integrated circuit 1800 are to be discussed in further detail below.

The integrated circuit 1800 includes the substrate 1702, the second flip chip package 1706, and a first flip chip package 1804. The first flip chip package 1804 is substantially similar to the first flip chip package 1704; however, the first flip chip package 1804 may additionally include transmission lines 1808.1 through 1808.*p* for routing the information and/or the power from the other electrical, mechanical, and/or electro-mechanical circuits that are communicatively coupled to the integrated circuit 1800 to the substrate 1702. The transmission lines 1808.1 through 1808.*p* may additionally be used to route the information and/or the power from these electrical, mechanical, and/or electro-mechanical circuits to the first flip chip package 1804. The configuration and arrangement of the transmission lines 1808.1 through 1808.*p* as shown in FIG. 18 is for illustrative purposes only. Those skilled in the relevant art(s) will recognize that the transmission lines 1808.1 through 1808.*p* may traverse any suitable path through the first flip chip package 1804 without departing from the spirit and scope of the present invention. Those skilled in the relevant art(s) will also recognize that the first flip chip package 1804 may include a different number of transmission lines 1808.1 through 1808.*p* than illustrated in FIG. 18 for routing other power signals and/or other information to the substrate 1702 without departing from the spirit and scope of the present invention.

The substrate 1702 may route the power signals and/or the information to the second flip chip package 1706. The first flip chip package 1804 further includes interconnections 1806.1 through 1806.*b* to form interconnections between other electrical, mechanical, and/or electro-mechanical circuits. The interconnections 1806.1 through 1806.*b* are substantially similar to the interconnections 1716.1 through 1716.*b* and will not be described in further detail.

Fifth Exemplary Configuration and Arrangement of the Integrated Circuit

Figure 19:
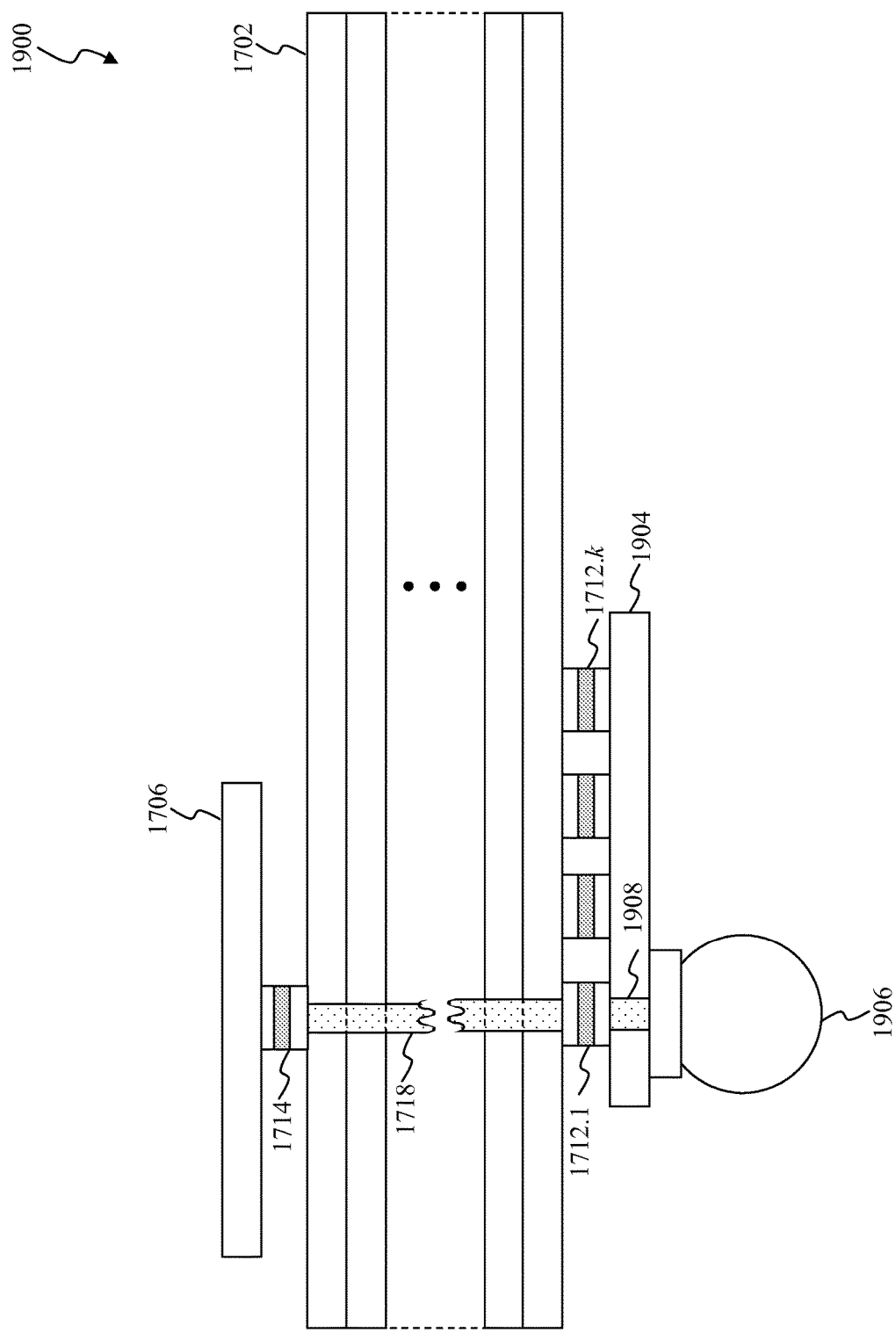
FIG. 19 illustrates a fifth exemplary configuration and arrangement of the integrated circuit according to an exemplary embodiment of the present invention.

FIG. 19 illustrates a fifth exemplary configuration and arrangement of the integrated circuit according to an exemplary embodiment of the present invention. One or more functional modules of the integrated circuit are configured and arranged onto a first flip chip package and an integrated antenna is configured and arranged onto a second flip chip package. The first flip chip package and the second flip chip package are coupled to a substrate to form an integrated circuit 1900. The other electrical, mechanical, and/or electro-mechanical circuits that are communicatively coupled to the integrated circuit 1900 may provide power signals and/or information, such as data and/or one or more commands, to the second flip chip package. The second flip chip package may route the power signals and/or the information to the substrate where it is then routed to the first flip chip package. The integrated circuit 1900 may represent an exemplary embodiment of the integrated circuit 200 and/or the integrated circuit 300. The integrated circuit 1900 shares many substantially similar features with the integrated circuit 1700; therefore, only differences between the integrated circuit 1700 and the integrated circuit 1900 are to be discussed in further detail below.

The integrated circuit 1900 the substrate 1702, the second flip chip package 1706, and a first flip chip package 1904. The first flip chip package 1904 is substantially similar to the first flip chip package 1704; however, the first flip chip package 1904 may additionally include a transmission line 1908 for routing the information and/or the power from other electrical, mechanical, and/or electro-mechanical circuits that are communicatively coupled to the integrated circuit 1900 to the second flip chip package 1706. The transmission line 1908 may additionally be used to route the information and/or the power from these electrical, mechanical, and/or electro-mechanical circuits to the first flip chip package 1904. The configuration and arrangement of the transmission line 1908 as shown in FIG. 18 is for illustrative purposes only. Those skilled in the relevant art(s) will recognize that the transmission line 1908 may traverse any suitable path through the first flip chip package 1904 without departing from the spirit and scope of the present invention. Those skilled in the relevant art(s) will also recognize that the first flip chip package 1904 may include more than one transmission line 1908 for routing other power signals and/or other information to the second flip chip package 1706 without departing from the spirit and scope of the present invention.

The second flip chip package 1706 may route the power signals and/or the information to the substrate 1702. The first flip chip package 1904 further includes interconnections 1906 to form an interconnections between other electrical, mechanical, and/or electro-mechanical circuits. The interconnection 1906 is substantially similar to the interconnections 1716.1 through 1716.*b* and will not be described in further detail.

Those skilled in the relevant art(s) will recognize that other exemplary configurations and arrangements of the integrated circuit are possible that use features of the integrated circuit 1700, integrated circuit 1800, and/or integrated circuit 1900 without departing from the sprit and scope of the present invention. Each of these other exemplary configurations and arrangements of the integrated circuit may include one or more functional modules that are configured and arranged onto a first flip chip package that is coupled to an integrated antenna that is configured and arranged onto a second flip chip package. These other exemplary configurations and arrangements of the integrated circuit may include electrical components, mechanical components, electro-mechanical components, or any other suitable components that will be apparent to those skilled in the relevant art(s) that are formed onto their respective substrates to provide power signals and/or information, such as data and/or one or more commands. These other exemplary configurations and arrangements of the integrated circuit may include one or more transmission lines for routing of the power signals and/or the information from other electrical, mechanical, and/or electro-mechanical circuits to the first flip chip package and/or the second flip chip package.

Sixth Exemplary Configuration and Arrangement of the Integrated Circuit

Figure 20:
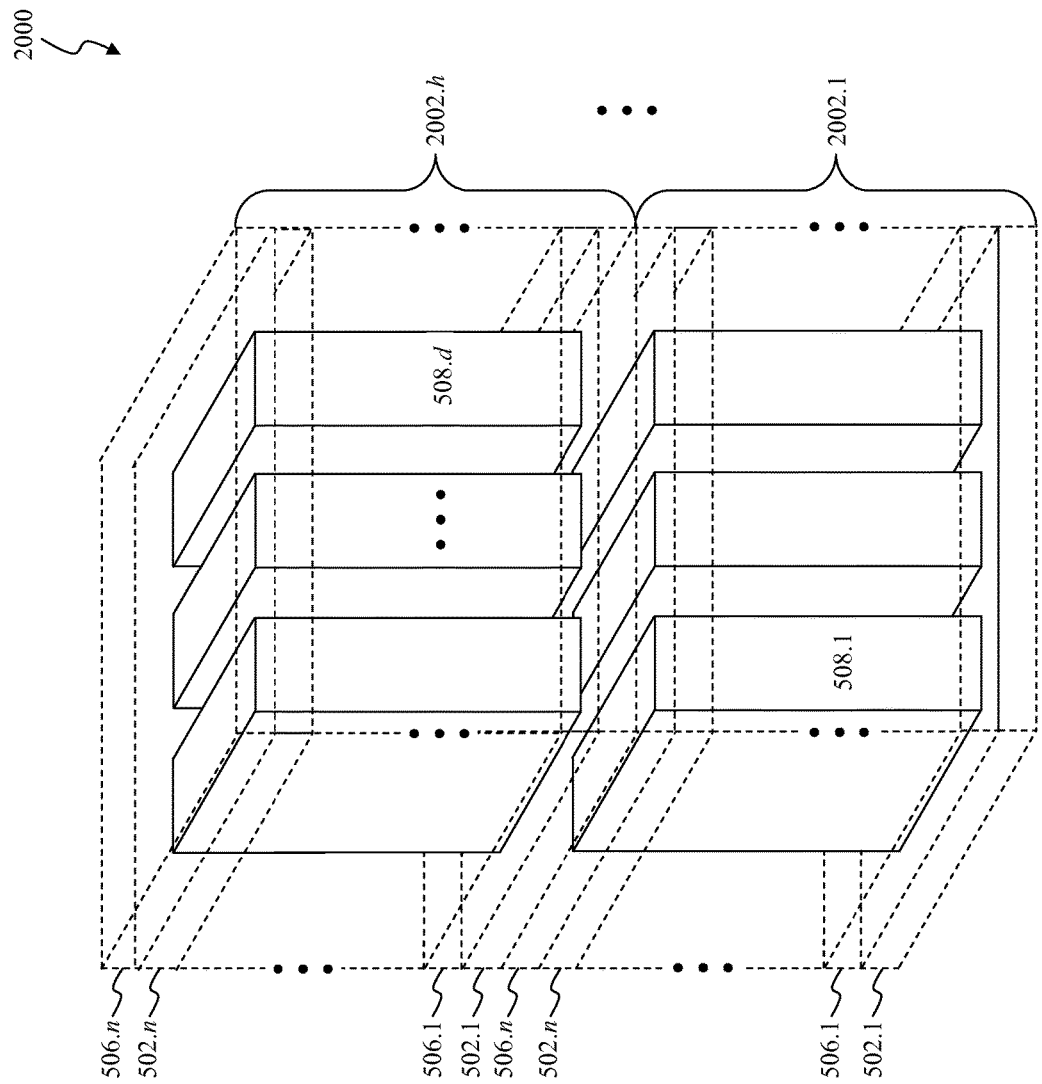
FIG. 20 illustrates a first exemplary configuration and arrangement of one or more functional modules of the integrated circuit according to an exemplary embodiment of the present invention.

FIG. 20 illustrates a first exemplary configuration and arrangement of one or more functional modules of the integrated circuit according to an exemplary embodiment of the present invention. A semiconductor device fabrication operation uses a predetermined sequence of photographic and/or chemical processing steps to form one or more functional modules onto a semiconductor substrate. The semiconductor substrate is coupled to other semiconductor substrates having other functional modules to form a vertical arrangement 2000. The vertical arrangement 2000 includes functional modules 2002.1 through 2002.*h*. The functional modules 2002.1 through 2002.*h* may represent exemplary embodiments of one or more of the one or more functional modules 202.1 through 202.*i*, the one or more functional modules 302.1 through 302.*i*, and/or the functional module 400.

The semiconductor device fabrication operation forms a first group of the functional modules 508.1 through 508.*d* onto a first arrangement of the first group of the useable fabrication layers 502.1 through 502.*n* of a first semiconductor substrate to form the functional module 2002.1. Similarly, the semiconductor device fabrication operation forms an $h^{th}$ group of the functional modules 508.1 through 508.*d* onto an $h^{th}$ arrangement of the useable fabrication layers 502.1 through 502.*n* of a $h^{th}$ semiconductor substrate to form the functional module 2002.1. The configuration and arrangement of the functional modules 508.1 through 508.*d* as shown in FIG. 20 is for illustrative purposes only. Those skilled in the relevant art(s) will recognize that the functional modules 508.1 through 508.*d* may be configured and arranged differently without departing from the spirit and scope of the present invention. For example, those skilled in the relevant art(s) will recognize that the functional modules 2002.1 through 2002.*h* may include a similar and/or dissimilar number of functional modules from among the functional modules 508.1 through 508.*d* without departing from the spirit and scope of the present invention. As another example, those skilled in the relevant art(s) will recognize that the first arrangement through the $h^{th}$ arrangement of the useable fabrication layers 502.1 through 502.*n* may include a similar and/or dissimilar number of useable fabrication layers without departing from the spirit and scope of the present invention.

The functional modules 2002.1 through 2002.*h* are coupled to each other to form the vertical arrangement 2000. For example, the first semiconductor substrate is coupled to the h$^{th}$ semiconductor substrate to couple the functional modules 2002.1 through 2002.h. The functional modules 2002.1 through 2002.h are coupled using physical connections such as bond wires solder bumps, or any other suitable physical connection that will be apparent to those skilled in the relevant art(s) without departing from the spirit and scope of the present invention. Specifically, a last useable fabrication from among the useable fabrication layers 502.1 through 502.n of a first functional module from among the functional modules 2002.1 through 2002.h is coupled to a first insulation layer from among the insulation layers 506.1 through 506.p of a second functional module from among the functional modules 2002.1 through 2002.h to form the vertical arrangement 2000. For example, the useable fabrication layer 502.n of the functional module 2002.1 is coupled to the insulation layer 506.1 of the functional module 2002.1.

Figure 21:
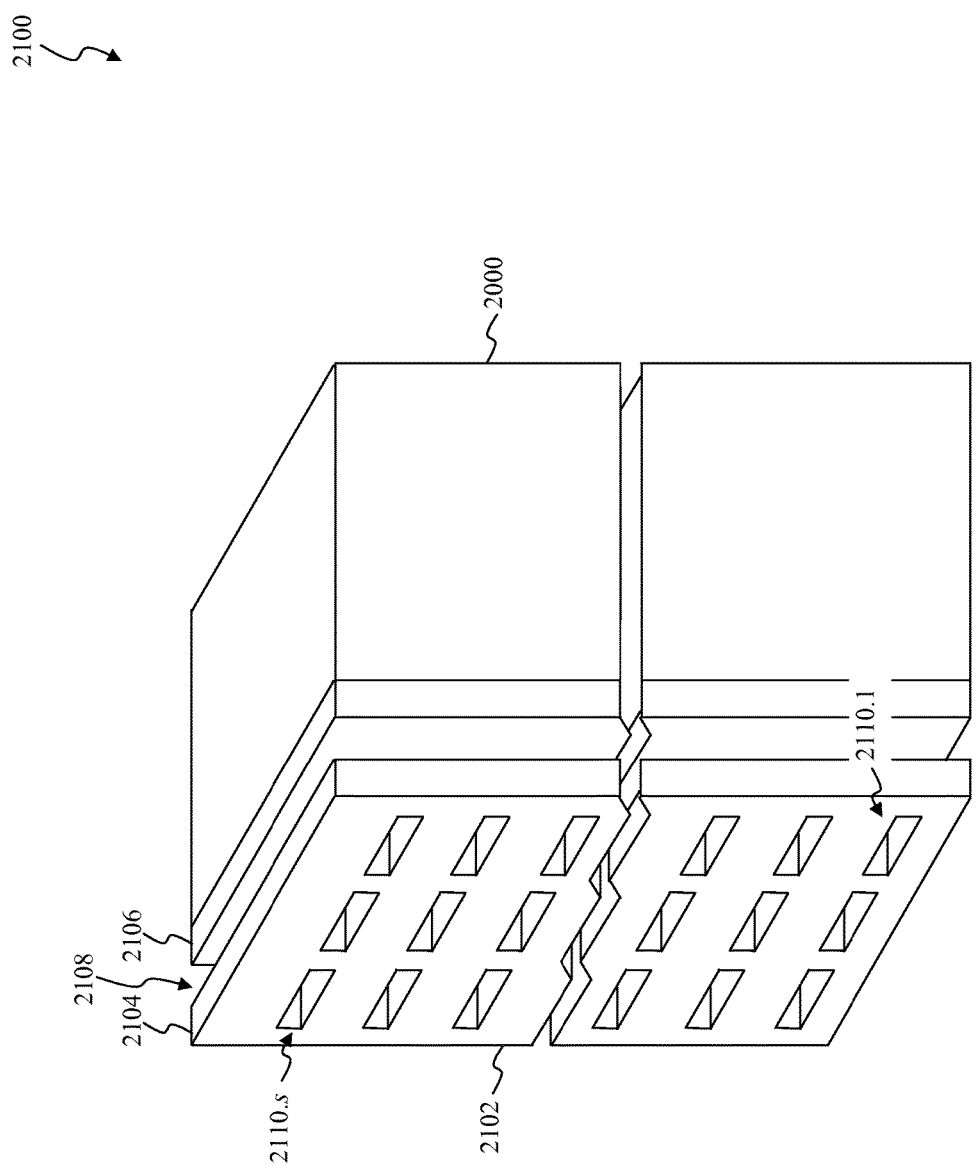
FIG. 21 illustrates a sixth exemplary configuration and arrangement of the integrated circuit according to an exemplary embodiment of the present invention.

FIG. 21 illustrates a sixth exemplary configuration and arrangement of the integrated circuit according to an exemplary embodiment of the present invention. A semiconductor device fabrication operation uses a predetermined sequence of photographic and/or chemical processing steps to form an integrated waveguide onto a semiconductor substrate. The integrated waveguide is coupled to a vertical arrangement of one or functional modules to communicatively couple these functional modules to form an integrated circuit 2100. The integrated circuit 500 may represent an exemplary embodiment of the integrated circuit 200 and/or the integrated circuit 300.

The integrated waveguide is coupled to the vertical arrangement 2000 to form the integrated circuit 2100. However, those skilled in the relevant art(s) will also recognize that the vertical arrangement 2000 may be coupled to other antennas such as a monopole antenna, a dipole antenna, a phased array, a patch antenna, or any other suitable device which converts electric currents into electromagnetic waves that will be apparent to those skilled in the relevant art(s) without departing from the spirit and scope of the present invention to form the integrated circuit 2100.

The integrated waveguide 2102 includes a first conductive element 2104 and a second conductive element 2106 between a cavity region 2108 that are configured and arranged to form a parallel plate waveguide. However, this example are not limiting, those skilled in the relevant art(s) will recognize that other configurations and arrangements of the integrated waveguide 2102 are possible without departing from the spirit and scope of the present invention. For example, the first conductive element 2104 and the second conductive element 2106 may be configured and arranged to form any other suitable multi-conductor waveguide. As another example, the first conductive element 2104 may be coupled to the second conductive element 2106 to form a single conductor waveguide, such as a rectangular waveguide, a circular waveguide, or an elliptical waveguide to provide some examples. The integrated waveguide 2102 shares many substantially similar features with the integrated waveguide 600 and/or the integrated waveguide 1100; therefore only differences between the integrated waveguide 600 and/or the integrated waveguide 1100 and the integrated waveguide 2102 only differences between the integrated waveguide 900 and the integrated waveguide 1000 are to be discussed in further detail below.

The first conductive element 2104 and/or the second conductive element 2106 may include phase openings 2108.1 through 2108.s. The phase openings 2108.1 through 2108.s may be implemented in a substantially similar manner as the static phase openings 606.1 through 606.s and/or the dynamic phase openings 1204.1 through 1204.t and will not be discussed in further detail. In some situations, at least one of the functional modules from among the functional modules 508.1 through 508.d is configured and arranged to form a waveguide controller module to configure and/or operate the integrated waveguide 2102 as discussed above in FIG. 11 through FIG. 12. In these situations, the integrated waveguide 2102 may include one or more electro-mechanical devices, as discussed above in FIG. 13A, FIG. 13B, FIG. 14A, and/or FIG. 14B, to open, close, and/or partially open or partially close the phase openings 2108.1 through 2108.s to dynamically configure operating characteristics of the integrated waveguide 2102.

The functional modules 2002.1 through 2002.h of the vertical arrangement 2000 may be coupled to radiating elements that are substantially similar to radiating elements 802.1 through 802.d to communicate with each other as well as to other electrical, mechanical, and/or electro-mechanical circuits that are communicatively coupled to the integrated circuit 2100 in accordance with the multiple access transmission scheme. In an exemplary embodiment, each of the functional modules 2002.1 through 2002.h may be coupled to a corresponding radiating element from among the radiating elements. In another exemplary embodiment, each of the functional modules 508.1 through 508.d may be coupled to a corresponding radiating element from among the radiating elements. In a further exemplary embodiment, some of the functional modules 2002.1 through 2002.h may be coupled to their corresponding radiating elements from among the radiating elements and some of the functional modules 508.1 through 508.d may be coupled to their corresponding radiating element from among the radiating elements. Although not illustrated in FIG. 21, the radiating elements may be formed within the second conductive element 2106 in a substantially similar manner as described in FIG. 8.

Seventh Exemplary Configuration and Arrangement of the Integrated Circuit

Figure 22:
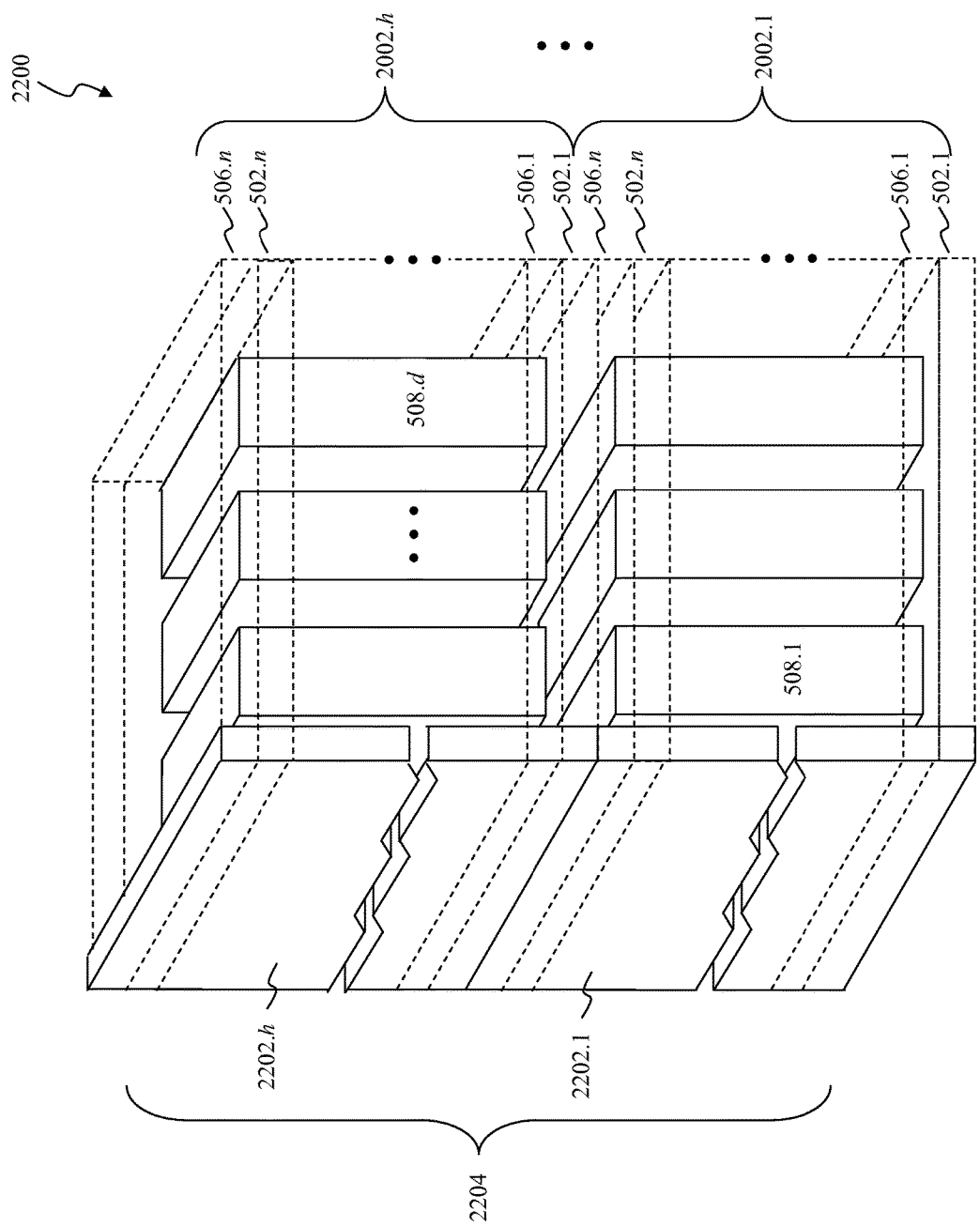
FIG. 22 illustrates a second exemplary configuration and arrangement of one or more functional modules of the integrated circuit according to an exemplary embodiment of the present invention.

FIG. 22 illustrates a second exemplary configuration and arrangement of one or more functional modules of the integrated circuit according to an exemplary embodiment of the present invention. A semiconductor device fabrication operation uses a predetermined sequence of photographic and/or chemical processing steps to one or more functional modules onto a semiconductor substrate. The semiconductor substrate is coupled to other semiconductor substrates having other functional modules to form a vertical arrangement of functional modules. The semiconductor device fabrication operation forms a first conductive element for an integrated waveguide within the vertical arrangement of functional modules to form a vertical arrangement 2200. The vertical arrangement 2200 shares many substantially similar features with the vertical arrangement 2000; therefore, only differences between the vertical arrangement 2000 and the vertical arrangement 2200 are to be discussed in further detail below.

The semiconductor device fabrication operation forms groups of the functional modules 508.1 through 508.d onto arrangements of the useable fabrication layers 502.1 through 502.n to form the functional modules 2002.1 through 2002.h as discussed above in FIG. 20.

The semiconductor device fabrication operation forms a first conductive element 2202.1 within the useable fabrication layers 502.1 through 502.n and/or the insulation layers 506.1 through 506.n of the functional module 2002.1. Similarly, the semiconductor device fabrication operation forms an h$^{th}$ conductive element 2202.h within the useable fabrication layers 502.1 through 502.*n* and/or the insulation layers 506.1 through 506.*n* of the functional module 2002.*h*. The configuration and arrangement of the conductive elements 2202.1 through 2202.*h* within their useable fabrication layers 502.1 through 502.*n* and/or their insulation layers 506.1 through 506.*n* as shown in FIG. 22 is for illustrative purposes only. Those skilled in the relevant art(s) will recognize that the conductive elements 2202.1 through 2202.*h* may be configured and arranged differently within the useable fabrication layers 502.1 through 502.*n* and/or the insulation layers 506.1 through 506.*n* of the functional modules 2002.1 through 2002.*h* without departing from the spirit and scope of the present invention. The conductive elements 2202.1 through 2202.*h* may be implemented using a conductive material, such as copper or copper-based materials to provide some examples, or any other suitable material that may reflect a cavity wave that propagates through the integrated waveguide 600 that will be apparent to those skilled in the relevant art(s) without departing from the spirit and scope of the present invention. Additionally, although not illustrated in FIG. 22, the conductive elements 2202.1 through 2202.*h* may include one or more phase openings such as the static phase openings 606.1 through 606.*s* and/or the dynamic phase openings 1204.1 through 1204.*t*.

The conductive elements 2202.1 through 2202.*h* are coupled to each other to form a conductive element 2204 of an integrated waveguide. However, this example is not limiting, those skilled in the relevant art(s) will recognize that conductive elements 2202.1 through 2202.*h* may be configured and arranged to form components of a monopole antenna, a dipole antenna, a phased array, a patch antenna, a waveguide and/or any other suitable device which converts electric currents into electromagnetic waves that will be apparent to those skilled in the relevant art(s) without departing from the spirit and scope of the present invention. The conductive elements 2202.1 through 2202.*h* are coupled using physical connections such as bond wires solder bumps, or any other suitable physical connection that will be apparent to those skilled in the relevant art(s) without departing from the spirit and scope of the present invention.

The functional modules 2002.1 through 2002.*h* of the vertical arrangement 2000 may be coupled to radiating elements that are substantially similar to radiating elements 802.1 through 802.*d* to communicate with each other as well as to other electrical, mechanical, and/or electro-mechanical circuits that are communicatively coupled to the integrated circuit 2100 in accordance with the multiple access transmission scheme. Although not illustrated in FIG. 22, the radiating elements may be formed within the conductive element 2204 in a substantially similar manner as described in FIG. 8.

Figure 23:
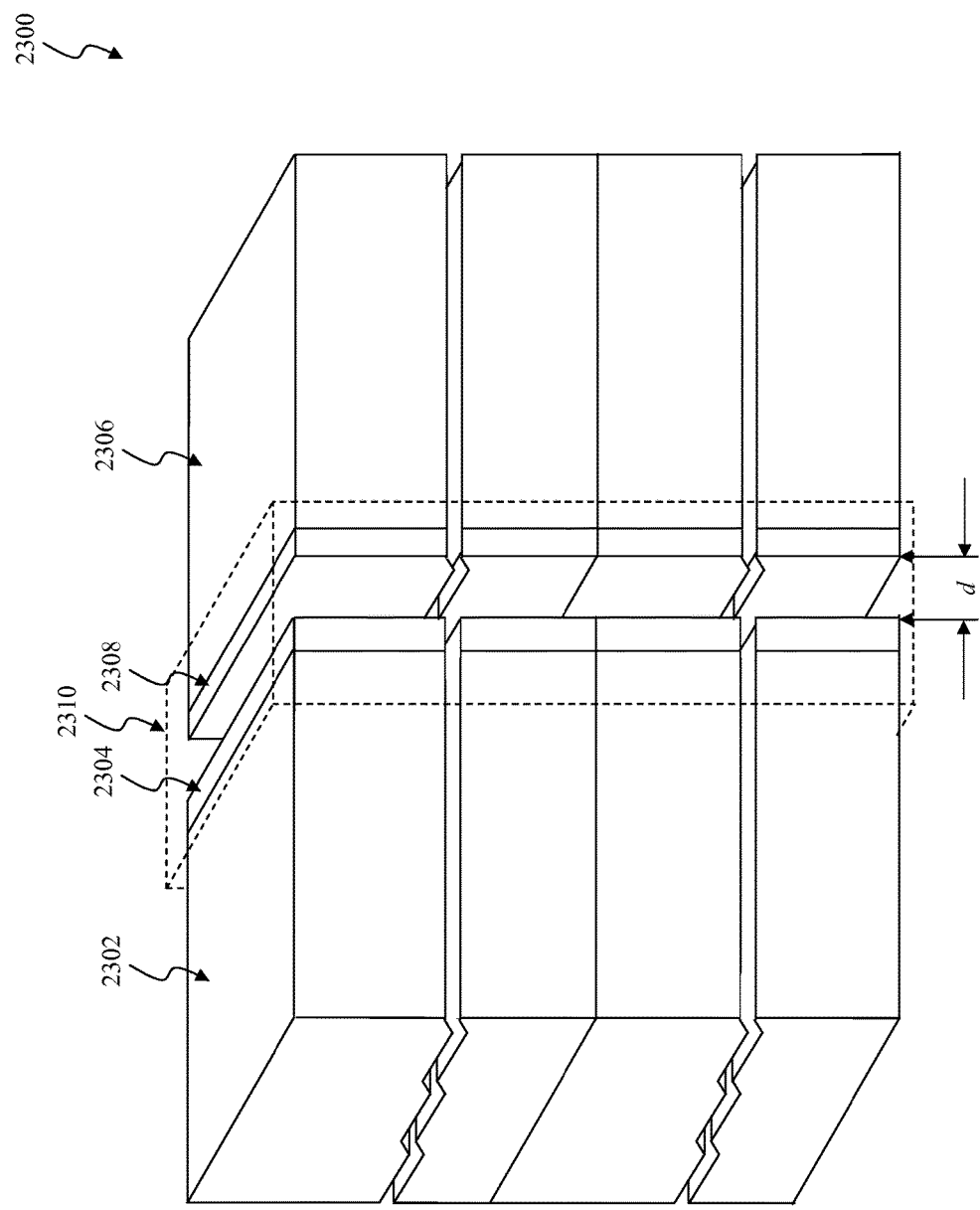
FIG. 23 illustrates a seventh exemplary configuration and arrangement of the integrated circuit according to an exemplary embodiment of the present invention.

FIG. 23 illustrates a seventh exemplary configuration and arrangement of the integrated circuit according to an exemplary embodiment of the present invention. A first vertical arrangement having a first conductive element is displaced from second vertical arrangement having a second conductive element. The first vertical arrangement is displaced from the second vertical arrangement such that first conductive element and the second conductive element are configured and arranged to form an integrated waveguide to communicatively couple functional modules of the first vertical arrangement and functional modules of the second vertical arrangement to form an integrated circuit 2300. The integrated circuit 2300 may represent an exemplary embodiment of the integrated circuit 200 and/or the integrated circuit 300.

One or more functional modules of the first vertical arrangement 2302 and/or the second vertical arrangement 2302 communicate with each other as well as to other electrical, mechanical, and/or electro-mechanical circuits that are communicatively coupled to the integrated circuit 2300 in accordance with the multiple access transmission scheme using an integrated waveguide 2310. The integrated circuit 2300 includes a first vertical arrangement 2302 having a first conductive element 2304 and a second vertical arrangement 2306 having a second conductive element 2306. The first vertical arrangement 2302 and/or the second vertical arrangement 2302 may represent an exemplary embodiment of the vertical arrangement 2200. The first vertical arrangement 2302 is displaced from the second vertical arrangement 2306 by a distance d to form the integrated waveguide 2310. In an exemplary embodiment, the first vertical arrangement 2302 and the second vertical arrangement 2306 are coupled to a semiconductor substrate or a printed circuit board at the distance d to form the integrated waveguide 2310.

However, this example is not limiting, those skilled in the relevant art(s) will recognize that other components of other antennas may be formed within the first vertical arrangement 2302 and/or the second vertical arrangement 2302 without departing from the spirit and scope of the present invention. These other components when displaced the d from each other may be configured and arranged to form a monopole antenna, a dipole antenna, a phased array, a patch antenna, a waveguide and/or any other suitable device which converts electric currents into electromagnetic waves that will be apparent to those skilled in the relevant art(s) without departing from the spirit and scope of the present invention.

Exemplary Multichip Module (MCM)

Figure 24:
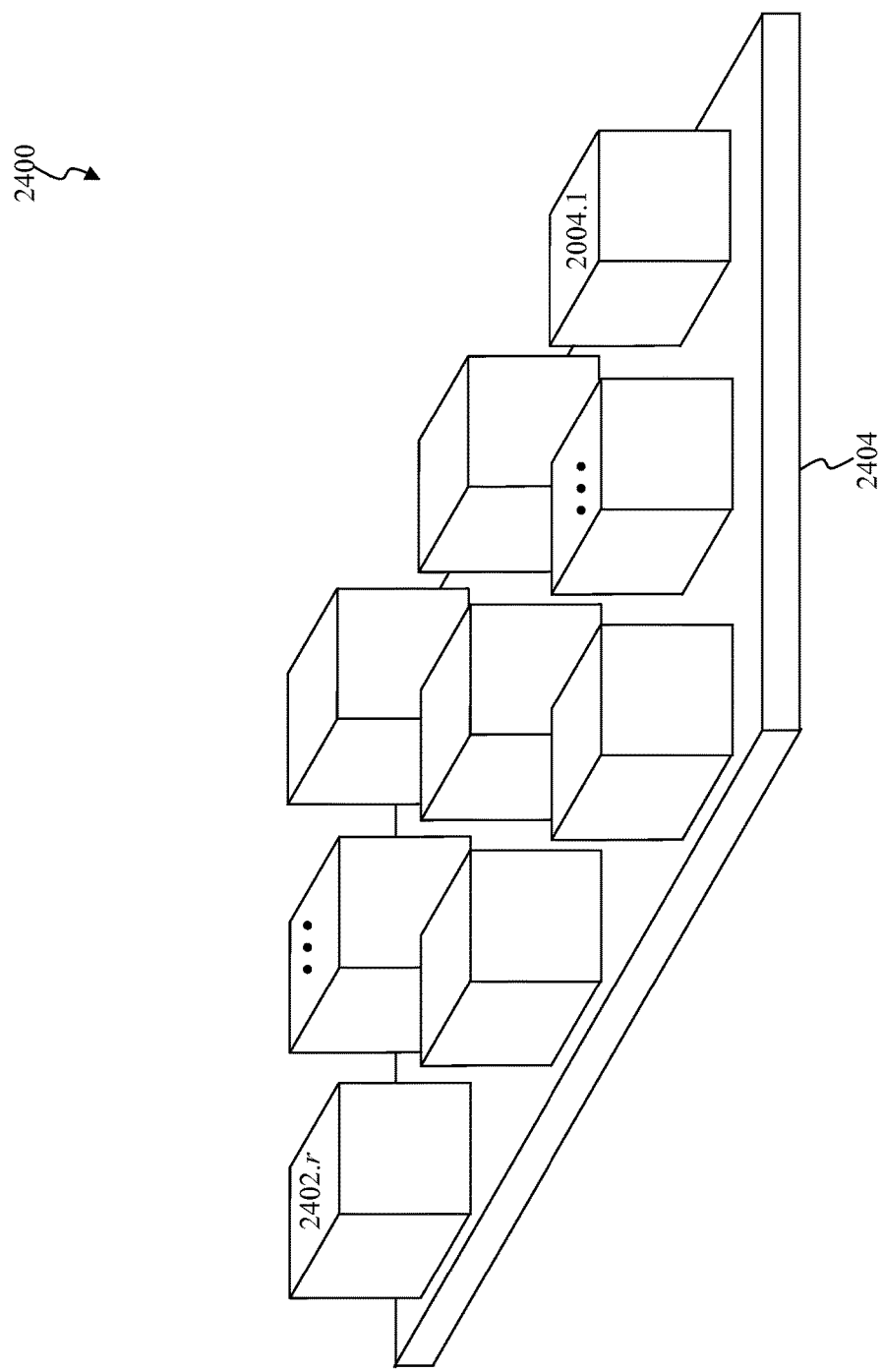
FIG. 24 illustrates an exemplary Multichip Module (MCM) according to an exemplary embodiment of the present invention.

FIG. 24 illustrates an exemplary Multichip Module (MCM) according to an exemplary embodiment of the present invention. One or more integrated circuits may be coupled to an integrated circuit carrier, such as a semiconductor substrate or a printed circuit board (PCB) to provide some examples, to form a Multichip Module (MCM) 2400. The MCM 2400 includes integrated circuits 2402.1 through 2402.*r* and an integrated circuit carrier 2404. The integrated circuits 2402.1 through 2402.*r* may represent exemplary embodiments of one or more of the integrated circuit 500, the integrated circuit 1100, the integrated circuit 1700, the integrated circuit 1800, the integrated circuit 1900, the integrated circuit 2100, and/or the integrated circuit 2300 to provide some examples.

The integrated circuits 2402.1 through 2402.*r* are coupled onto the integrated circuit carrier 2404. The configuration and arrangement of the integrated circuits 2402.1 through 2402.*r* as shown in FIG. 24 is for illustrative purposes only. Those skilled in the relevant art(s) will recognize that the integrated circuits 2402.1 through 2402.*r* may be configured and arranged differently without departing from the spirit and scope of the present invention. Those skilled in the relevant art(s) will also recognize that the integrated circuits 2402.1 through 2402.*r* may include any suitable number of integrated circuits without departing from the spirit and scope of the present invention.

The integrated circuit carrier 2404 represents a carrier substrate, such as a semiconductor substrate or a printed circuit board (PCB) to provide some examples, for coupling of the integrated circuits 2402.1 through 2402.*r* onto. For example, the integrated circuits 2402.1 through 2402.*r* may include a ball grid array (BGA) having one or more solder bumps, a lead frame having one or more leads, one or more bonding pads, and/or any other suitable means for coupling the integrated circuits 2402.1 through 2402.r to the integrated circuit carrier 2404 that will be apparent to those skilled in the relevant art(s) without departing from the spirit and scope of the present invention. In this example, the integrated circuit carrier 2404 may include one or more bonding pads that are configured and arranged to couple to the integrated circuits 2402.1 through 2402.r. and/or any other suitable means for coupling the integrated circuits 2402.1 through 2402.r to the integrated circuit carrier 2404 that will be apparent to those skilled in the relevant art(s) without departing from the spirit and scope of the present invention. The one or more bonding pads of the integrated circuit carrier 2404 may be coupled to integrated circuits 2402.1 through 2402.r by melting the one or more solder bumps of the BGA, by coupling the one or more leads of the lead frame, and/or by wire bonding to the one or more bonding pads of the integrated circuits 2402.1 through 2402.r.

The integrated circuit carrier 2404 may form interconnections between the integrated circuits 2402.1 through 2402.r. For example, the integrated circuit carrier 2404 may include a power source, such as an internal battery to provide an example, to provide power signals to the integrated circuits 2402.1 through 2402.r. As another example, the integrated circuit carrier 2404 may include one or more voltage regulators to regulate this power source or any other suitable power source to provide the power signals to the integrated circuits 2402.1 through 2402.r. As a further example, the integrated circuit carrier 2404 may include a controller module for controlling overall operation of the integrated circuits 2402.1 through 2402.r.

Collectively, the integrated circuits 2402.1 through 2402.r are configured to wirelessly communicate with each other as well to other electrical, mechanical, and/or electro-mechanical circuits that are communicatively coupled to the MCM 2400 in accordance with the multiple access transmission scheme. The integrated circuit carrier 2404 may include a substantially similar transceiver and antenna as one of the integrated circuits 2402.1 through 2402.r to wirelessly communicate with the integrated circuits 2402.1 through 2402.r as well to other electrical, mechanical, and/or electro-mechanical circuits that are communicatively coupled to the MCM 2400. The integrated circuit carrier 2404 may additionally communicate with one or more of the integrated circuits 2402.1 through 2402.r using wired communications. The wired communications may be implemented using one or more transmission lines that are coupled to one or more of the integrated circuits 2402.1 through 2402.r. Typically, the wired communication is used for low frequency communications and/or low data rate communications; whereas, the wireless communication is used for high frequency communications and/or high data rate communications. For example, the wired communication may be used to transfer commands between the integrated circuit carrier 2404 and one or more of the integrated circuits 2402.1 through 2402.r and the wireless communication may be used to transfer data between the integrated circuit carrier 2404 and one or more of the integrated circuits 2402.1 through 2402.r.

Although not illustrated in FIG. 24, the MCM 2400 may be coupled to a semiconductor package to form a packaged integrated circuit. Typically, the semiconductor package is configured and arranged to encase the MCM 2400 within a non-conductive material such as plastic though any other suitable non-conductive material may be used that will be apparent to those skilled in the relevant art(s) without departing from the spirit and scope of the present invention. The semiconductor package may additionally include one or more couplings, such as one or more pins and/or solder bumps to provide some examples, which are coupled to the MCM 2400 for coupling the packaged integrated circuit to other electrical, mechanical, and/or electro-mechanical circuits.

First Exemplary Wireless Component Testing Environment

Figure 25:
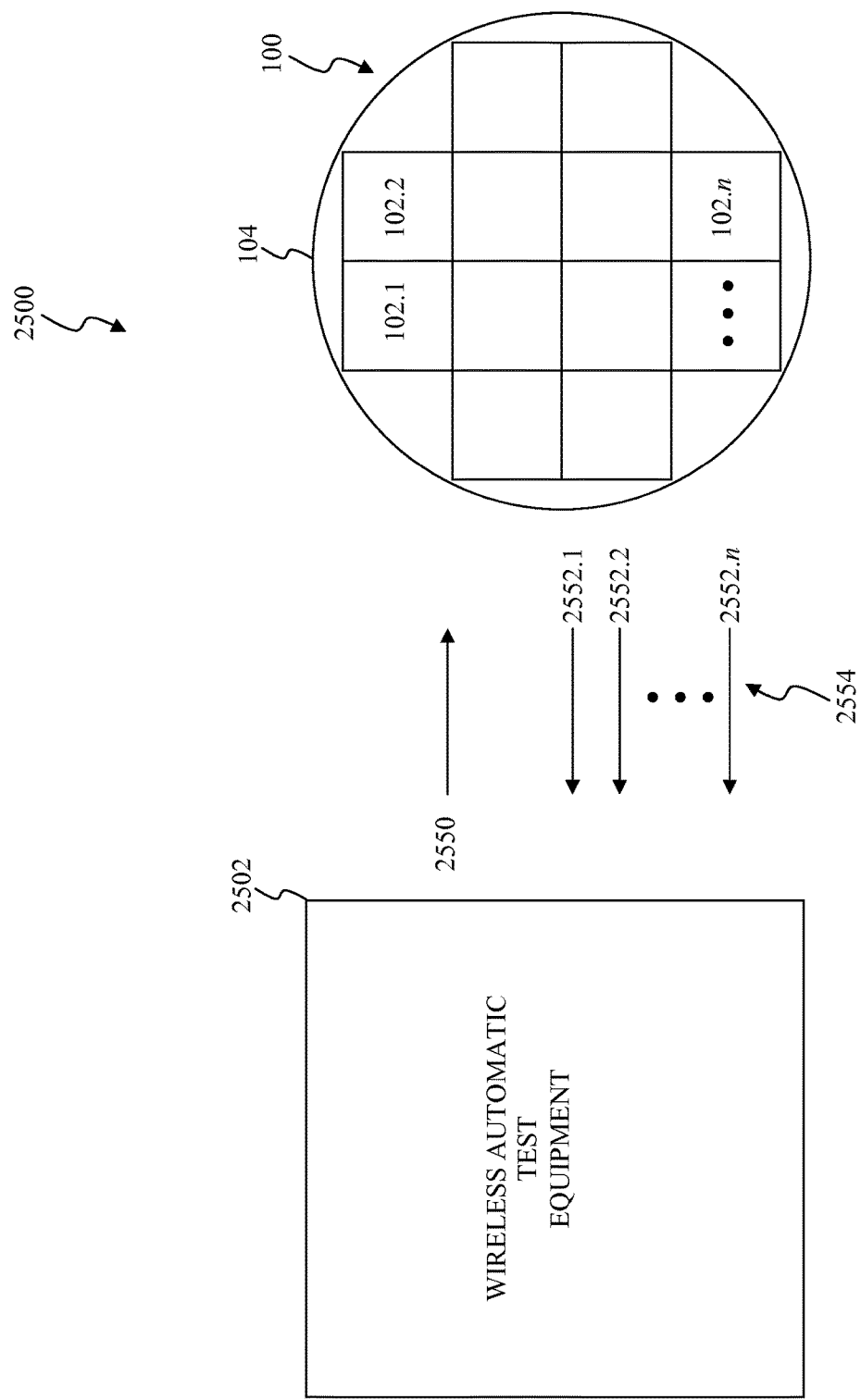
FIG. 25 illustrates a schematic block diagram of a wireless integrated circuit testing environment according to an exemplary embodiment of the present invention.

FIG. 25 illustrates a schematic block diagram of a wireless integrated circuit testing environment according to an exemplary embodiment of the present invention. As discussed above, each of the integrated circuits 102.1 through 102.n may include one or more functional modules, such as the functional modules 202.1 through 202.i and/or the functional modules 302.1 through 302.i to provide some examples, are communicative coupled to other electrical, mechanical, and/or electro-mechanical circuits, such as wireless automatic test equipment to provide an example. The wireless automatic test equipment verifies that the one or more of the integrated circuits 102.1 through 102.n operate as expected.

A wireless testing environment 100 allows for simultaneous testing of the integrated circuits 102.1 through 102.n by wireless automatic test equipment 2502. The wireless automatic test equipment 2502 wirelessly tests one or more of the integrated circuits 102.1 through 102.n simultaneously to verify that these integrated circuits 102.1 through 102.n operate as expected. The wireless automatic test equipment 2502 provides an initiate testing operation signal 2550 to the integrated circuits 102.1 through 102.n. The initiate testing operation signal 2550 represents a radio communication signal that is wirelessly transmitted to the integrated circuits 102.1 through 102.n.

The initiate testing operation signal 2550 is simultaneously observed by one or more of the integrated circuits 102.1 through 102.n. The integrated circuits 102.1 through 102.n that received the initiate testing operation signal 2550 enter into a testing mode of operation, whereby these integrated circuits 102.1 through 102.n execute a self-contained testing operation. The self-contained testing operation may utilize a first set of parameters provided by the initiate testing operation signal 2550 to be used by a first set of instructions that are stored within the integrated circuits 102.1 through 102.n. Alternatively, the self-contained testing operation may execute a second set of instructions provided by the initiate testing operation signal 2550 and/or a second set of parameters to be used by the second set of instructions that are provided by the initiate testing operation signal 2550. In another alternate, the self-contained testing operation may include any combination of the first set of instructions, the second set of instructions, the first set of parameters and/or the second set of parameters. The wireless automatic test equipment 2502 may provide the initiate testing operation signal 2550 during the self-contained testing operation to provide additional parameters and/or instructions to the integrated circuits 102.1 through 102.n.

After completion of the self-contained testing operation, the integrated circuits 102.1 through 102.n wirelessly transmit testing operation outcomes 2552.1 through 2552.n to the wireless automatic test equipment 2502 via a common communication channel 2554. The common communication channel 2554 represents a communication channel that is be simultaneously utilized or shared by the integrated circuits 102.1 through 102.n. Collectively, the integrated circuits 102.1 through 102.n communicate the testing operation outcomes 2552.1 through 2552.*n* over the common communication channel 2554 using the multiple access transmission scheme.

The wireless automatic test equipment 2502 observes the testing operation outcomes 2552.1 through 2552.*n* as they pass through the common communication channel 2554 using one or more receiving antennas positioned in three-dimensional space. The wireless automatic test equipment 2502 determines one or more signal metrics, such as a mean, a total energy, an average power, a mean square, an instantaneous power, a root mean square, a variance, a norm, a voltage level and/or any other suitable signal metric that will be apparent by those skilled in the relevant art(s) provide some examples, of the testing operation outcomes 2552.1 through 2552.*n* as observed by the one or more receiving antennas.

The wireless automatic test equipment 2502 uses the one or more signal metrics to map the testing operation outcomes 2552.1 through 2552.*n* to the integrated circuits 102.1 through 102.*n*. The wireless automatic test equipment 2502 determines a first group of integrated circuits from among the integrated circuits 102.1 through 102.*n* that operate as expected, and optionally their location within the semiconductor wafer 104, based upon the testing operation outcomes 2552.1 through 2552.*n* as observed by the one or more receiving antennas. Alternatively, the wireless automatic test equipment 2502 may determine a second group of integrated circuits from among the integrated circuits 102.1 through 102.*n* that operate unexpectedly based upon the testing operation outcomes 2552.1 through 2552.*n* as observed by the one or more multiple receiving antennas. The wireless automatic test equipment 2502 may, optionally, provide a location of the second group of integrated circuits within the semiconductor wafer 104. In another alternate, the wireless automatic test equipment 2502 may determine any combination of the first group of integrated circuits and the second group of integrated circuits and, optionally, provide their corresponding locations within the semiconductor wafer 104. The wireless automatic test equipment 2502 is further described in U.S. patent application Ser. No. 13/025,657, filed on Feb. 11, 2011, which is incorporated herein by reference in its entirety.

The wireless automatic test equipment 2502 may additionally be used to simultaneously test other integrated circuits, such as the integrated circuit 200, integrated circuit 300, the integrated circuit 500, the integrated circuit 1100, the integrated circuit 1700, the integrated circuit 1800, the integrated circuit 1900, the integrated circuit 2100, and/or the integrated circuit 2300 to provide some examples, in a substantially similar manner. The wireless automatic test equipment 2502 may further be used to simultaneously test functional modules of these other integrated circuits, such as the functional modules 202.1 through 202.*i*, the functional modules 302.1 through 302.*i*, the functional module 400, and/or the functional modules 508.1 through 508.*d* to provide some examples, in a substantially similar manner.

Exemplary Wireless Automatic Test Equipment

FIG. 26 illustrates a schematic block diagram of wireless automatic test equipment that is implemented within the wireless integrated circuit testing environment according to an exemplary embodiment of the present invention. The integrated circuits 102.1 through 102.*n* transmit the testing operation outcomes 152 to the wireless automatic test equipment 2600 via the common communication channel 2554. The wireless automatic test equipment 2600 includes one or more receiving antennas to observe the testing operation outcomes 2552.1 through 2552.*n* from one or more directions in three dimensional space. The wireless automatic test equipment 2600 may determine whether one or more of the integrated circuits 102.1 through 102.*n* operate as expected and, optionally, may use properties of the three dimensional space, such as distance between each of multiple receiving antennas and/or the integrated circuits 102.1 through 102.*n* to provide an example, to determine a location of the one or more of the integrated circuits 102.1 through 102.*n* within the semiconductor wafer 100. The wireless automatic test equipment 2600 represents an exemplary embodiment of the wireless automatic test equipment 2502.

The wireless automatic test equipment 2600 includes receiving antennas 2602.1 through 2602.*i*, a receiver module 2604, a metric measurement module 2606, a testing processor 2608, an operator interface module 2610, a transmitter module 2612, and a transmitting antenna 2614. The receiving antennas 2602.1 through 2602.*i* are positioned at corresponding positions in the three dimensional space. The receiving antennas 2602 observe testing operation outcomes 2652.1 through 2652.*i* to provide one or more observed testing operation outcomes 2654.1 through 2654.*i*. The testing operation outcomes 2652.1 through 2652.*i* represent the testing operation outcomes 2552.1 through 2552.*n* as they propagate through the common communication channel 2554 as observed by the receiving antennas 2602 at their corresponding positions in the three-dimensional space. For example, the observed testing operation outcome 2654.1 represents the testing operation outcomes 2652.1 through 2652.*i* as they propagate through the common communication channel 2554 as observed by the receiving antenna 2602.1 at a first position in the three-dimensional space. Likewise, the observed testing operation outcome 2654.2 represents the testing operation outcomes 2652.1 through 2652.*i* as they propagate through the common communication channel 2554 as observed by the receiving antenna 2602.2 at a second corresponding position in the three-dimensional space.

The receiver module 2604 downconverts, demodulates, and/or decodes the observed testing operation outcomes 2654.1 through 2654.*i* to provide recovered testing outcomes 2656.1 through 2656.*k* in accordance with the multiple access transmission scheme. More specifically, the wireless automatic test equipment 2600 includes i receiving antennas 2602.1 through 2602.*i* to observe the testing operation outcomes 2552.1 through 2552.*n* as they propagate through the common communication channel 2554 to provide i observed testing operation outcomes 2654.1 through 2654.*i*. Each of the observed testing operation outcomes 2654.1 through 2654.*i* includes the testing operation outcomes 2552.1 through 2552.*n* as observed by its corresponding receiving antenna 2602.1 through 2602.*i*. For example, the observed testing operation outcomes 2654.1 includes the testing operation outcomes 2552.1 through 2552.*n* as observed the receiving antenna 2602.1 and the observed testing operation outcomes 2654.*i* includes the testing operation outcomes 2552.1 through 2552.*n* as observed the receiving antenna 2602.*i*.

The receiver module 2604 downconverts, demodulates, and/or decodes the observed testing operation outcomes 2654 to provide a corresponding recovered testing outcome 2656.1 through 2656.*k* for each of the n testing operation outcomes 2552.1 through 2552.*n* for each of the i testing operation outcomes 2656.1 through 2656.*k* for a total of n*i=k recovered testing outcomes 2656.1 through 2656.*k*. In an exemplary embodiment, the testing operation outcome 2656.1 represents the testing operation outcome 2552.1 as observed by the receiving antenna 2602.1, the testing operation outcome 2656.2 represents the testing operation outcome 2552.2 as observed by the receiving antenna 2602.1. In this exemplary embodiment, the testing operation outcome 2656.k represents the testing operation outcome 2552.n as observed by the receiving antenna 2602.i.

The metric measurement module 2606 determines one or more signal metrics of the recovered testing outcomes 2656.1 through 2656.k to provide measured signal metrics 2658.1 through 2658.k. The one or more signal metrics may include a mean, a total energy, an average power, a mean square, an instantaneous power, a root mean square, a variance, a norm, a voltage level and/or any other suitable signal metric of the recovered testing outcomes 2656 that will be apparent by those skilled in the relevant art(s) without departing from the spirit and scope of the present invention.

The testing processor 2608 may determine a first group of integrated circuits from among the integrated circuits 102.1 through 102.n that operate as expected based upon the recovered testing outcomes 2656.1 through 2656.k. The testing processor 2608 evaluates the recovered testing outcomes 2656.1 through 2656.k for each of the unique identification numbers to determine whether its corresponding integrated circuit 102.1 through 102.n is part of the first group of integrated circuits. Alternatively, the testing processor 2608 may determine the first group of integrated circuits based upon the recovered testing outcomes 2656.1 through 2656.i that correspond to the first receiving antenna 2602.1, based upon the recovered testing outcomes 2656.(k-i) through 2656.k that correspond to the $i^{th}$ receiving antenna 2602.i, or any suitable combination of antennas that will be apparent to those skilled in the relevant art(s) without departing from the spirit and scope of the present invention. Alternatively, the testing processor 2608 may determine a second group of integrated circuits from among the integrated circuits 102.1 through 102.n that operate unexpectedly based upon the recovered testing outcomes 2656.1 through 2656.k. In another alternate, the testing processor 2608 may determine any combination of the first group of integrated circuits and the second group of integrated circuits.

The testing processor 2608 may, optionally, determine a location of the integrated circuits 102.1 through 102.n within the semiconductor wafer 100 based upon the measured signal metrics 2658.1 through 2658.k. The testing processor 2608 assigns the recovered testing outcomes 2658.1 through 2658.k to corresponding coordinates from among i sets of coordinates in the three dimensional space to determine the location of the integrated circuits 102.1 through 102.n within the semiconductor wafer 100. For example, in an embodiment of the wireless automatic test equipment 2600 having a first receiving antenna 2602.1 and a second receiving antenna 2602.2, the first receiving antenna 2602.1 and the second receiving antenna 2602.2 observe the testing operation outcome 2652.1 and the testing operation outcome 2652.2, correspondingly. In this example, the testing processor 2608 designates the measured signal metrics 2658.1 and 2658.i that correspond to the first receiving antenna 2602.1 as a first coordinate for each of the i sets of coordinates in the three dimensional space. Similarly, the testing processor 2608 designates the measured signal metrics 2658.(i+1) and 2658.k that correspond to the second receiving antenna 2602.2 as a second coordinate for each of the i sets of coordinates in the three dimensional space.

The testing processor 2608 assigns the unique identification number for each of the integrated circuits 102.1 through 102.n that is embedded within the testing operation outcomes 2652.1 through to the i sets of coordinates. The testing processor 2608 extracts the unique identification number for each of the 102.1 through 102.n from the recovered testing outcomes 2656, or a subset of, from the recovered testing outcomes 2656.1 through 2656.k, such as the recovered testing outcomes 2656.1 through 2656.i to provide an example.

The testing processor 2608 maps the unique identification numbers to their corresponding integrated circuit 102.1 through 102.n to determine the location of the integrated circuits 102.1 through 102.n within the semiconductor wafer 100. The testing processor 2608 may determine the location of the integrated circuits 102.1 through 102.n within the semiconductor wafer 100 by comparing the measured signal metrics 2658.1 through 2658.k corresponding to each of the unique identification number to predetermined signal metrics for each of the integrated circuits 102.1 through 102.n. The predetermined signal metrics represent expected values of the measured signal metrics 2658.1 through 2658.k. For example, one or more predetermined signal metrics, or range of signal metrics, for each of the integrated circuits 102.1 through 102.n are determined prior to the testing operation. The testing processor 2608 may compare the i sets of coordinates for the unique identification numbers to the one or more predetermined signal metric for each of the integrated circuits 102.1 through 102.n to effectively map the unique identification numbers to the integrated circuits 102.1 through 102.n.

Alternatively, the testing processor 2608 may iteratively interpolate the location of the unique identification numbers to the integrated circuits 102.1 through 102.n within the semiconductor wafer 100 based upon relationships between their corresponding measured signal metrics 2658.1 through 2658.k. For example, if a first coordinate from among a first set of coordinates that is assigned to a first unique identification number is greater than a first coordinate from among a second set of coordinates that is assigned to a second unique number, then the integrated circuit 102.1 through 102.n that provided the first unique identification number is closer to the first receiving antenna 2602.1 when compared to the integrated circuit 102.1 through 102.n that provided the second unique number. As another example, if the first coordinate from among the first set of coordinates is less than a first coordinate from among a third set of coordinates that is assigned to a third unique identification number, then the integrated circuit 102.1 through 102.n that provided the first unique identification number is further from the first receiving antenna 2602.1 when compared to the integrated circuit 102.1 through 102.n that provided the third unique identification number.

The testing processor 2608 may provide a listing of testing results 2660 to the operator interface module 261. The listing of testing results 2660 may indicate whether at least one the integrated circuits 102.1 through 102.n operate as expected, and optionally their location within the semiconductor wafer 100, whether at least one of the integrated circuits 102.1 through 102.n operate unexpected, and optionally their location within the semiconductor wafer 100, or any combination thereof. Alternatively, the testing processor 2608 may store the listing of test results 2660 within an internal memory. In another alternate, the listing of testing results 2660 may include a first indication that all of the integrated circuits 102.1 through 102.n that operate as expected and/or a second indication that indicates at least one of the integrated circuits 102.1 through 102.n operate unexpectedly.

The operator interface module 2610 may further process the listing of testing results 2660 for display on a graphical user interface. For example, the operator interface module 2610 may display the listing of testing results 2660 on a video monitor for interpretation by an end user. Alternatively, the operator interface module 2610 may provide the listing of testing results 2660 to the end user. For example, the operator interface module 2610 may record the listing of testing results 2660 onto a digital recording medium. In another alternate, the operator interface module 2610 may store the listing of testing results 2660 for future recovery by the end user.

The operator interface module 2610 additionally observes an indication from the end user the initiate the self-contained testing operation, whereby the operator interface module sends an initiate self-contained testing operation 2662 to the testing processor 2608 to initiate the self-contained testing operation. The end user may additionally specify the second set of instructions to be performed and/or the second set of parameters to be used by the second set of instructions prior to initiating the self-contained testing operation. Alternatively, the testing processor 2608 may load the second set of instructions and/or the second set of parameters from the internal memory. The operator interface module 2610 provides the second set of instructions and/or the second set of parameters to the testing processor 2608 as part of the initiate self-contained testing operation 2662.

The transmitter module 2612 receives the initiate self-contained testing operation 2662 from the testing processor 2608 via an initiate self-contained testing operation 2664. The transmitter module 2612 encodes, modulates and/or upconverts the initiate self-contained testing operation 2664 to provide an initiate testing operation signal 2666 to the semiconductor wafer 100 via a transmitting antenna 2614. In an exemplary embodiment, the transmitter module 2612 wirelessly sends the initiate testing operation signal 2666 to all of the integrated circuits 102.1 through 102.n within the semiconductor wafer 100. However, this example is not limiting, those skilled in the relevant art(s) will recognize that the initiate testing operation signal 2666 may be sent to a lesser number of the integrated circuits 102.1 through 102.n within the semiconductor wafer 100 without departing from the spirit and scope of the present invention. The initiate testing operation signal 2666 represents an exemplary embodiment of the initiate testing operation signal 2550.

The wireless automatic test equipment 2600 is further described in U.S. patent application Ser. No. 13/025,657, filed on Feb. 11, 2011, which is incorporated herein by reference in its entirety.

FIG. 27 illustrates block diagram of receiving antennas that are implemented as part of the wireless automatic test equipment to an exemplary embodiment of the present invention. A wireless integrated circuit testing environment 2700 includes integrated circuits from among a semiconductor wafer that are configurable to execute a self-contained testing operation to verify their operation. The integrated circuits include coupling elements in various locations for passing various signals before, during, and/or after the self-contained testing operation. Wireless automatic test equipment includes at least one coupling antenna that is configured and arranged to passively observe these signals without any substantial interruption in the self-contained testing operation. The wireless integrated circuit testing environment 2700 includes a semiconductor wafer 2702 and wireless automatic test equipment 2710. The wireless integrated circuit testing environment 2700 may represent an exemplary embodiment of the wireless integrated circuit testing environment 2500.

As shown in exploded view 2710, the semiconductor wafer 2702 includes integrated circuits 2704.1 through 2704.n that are formed onto a semiconductor substrate 2706. The integrated circuits 2704.1 through 2704.n include coupling elements 2708.1 through 2708.n for passing various signals before, during, and/or after the self-contained testing operation. For example, the coupling elements 2708.1 through 2708.n may be used to pass various analog signals, digital signals, power signals, and/or any other suitable electrical signal that will be apparent to those skilled in the relevant art(s) without departing from the spirit and scope of the present invention throughout the integrated circuits 2704.1 through 2704.n. The coupling elements 2708.1 through 2708.n may be implemented using one or more conductive wires and/or traces within the integrated circuits 2704.1 through 2704.n such as an analog signal line, a digital signal line, a power signal line, and/or any other suitable conductive element that may pass an electrical signal that will be apparent to those skilled in the relevant art(s) without departing from the spirit and scope of the present invention. Those skilled in the relevant art(s) will recognize that the coupling elements 2708.1 through 2708.n may each include more than one coupling element that are coupled to various locations within a corresponding integrated circuit 2704.1 through 2704.n without departing from the spirit and scope of the present invention. The semiconductor wafer 2702 may represent an exemplary embodiment of the semiconductor wafer 100.

The wireless automatic test equipment 2710 shares many substantially similar features with the wireless automatic test equipment 2502; therefore, only differences between the wireless automatic test equipment 2502 and the wireless automatic test equipment 2710 are to be discussed in further detail below.

The wireless automatic test equipment 2710 is coupled to at least one coupling element 2174. The coupling element 2174 passively observes or probes locations within the integrated circuits 2704.1 through 2704.n before, during, and/or after the self-contained testing operation without any substantial interruption in the self-contained testing operation. The coupling element 2174 is configured and arranged to be approximately a distance d from the coupling elements 2708.1 through 2708.n to proximity couple to the coupling elements 2708.1 through 2708.n. For example, the coupling element 2174 may passively observe various analog signals, digital signals, power signals, and/or any other suitable electrical signal that will be apparent to those skilled in the relevant art(s) without departing from the spirit and scope of the present invention passing through the coupling elements 2708.1 through 2708.n through inductive and/or capacitive coupling.

The wireless automatic test equipment 2710 may selectively activate and/or deactivate each of the integrated circuits 2704.1 through 2704.n to passively observe locations within those integrated circuits 2704.1 through 2704.n that are active. For example, the coupling element 2174 may activate a first group of the one or more of the integrated circuits 2704.1 through 2704.n that operate unexpectedly and a second group of the deactivate one or more of the integrated circuits 2704.1 through 2704.n that operate as expected. The coupling element 2174 may passively observe locations within the first group of the one or more of the integrated circuits 2704.1 through 2704.*n* to determine a location within those integrated circuits that operates unexpectedly.

As shown in exploded view 2716, the coupling element 2714 includes sub-coupling elements 2718.1 through 2718.*m* that are configured and arranged to form a matrix. The sub-coupling elements 2718.1 through 2718.*m* may be implemented using one or more conductive wires and/or traces and/or any other suitable device, or devices, that may be used for proximity coupling of electromagnetic waves that will be apparent to those skilled in the relevant art(s) without departing from the spirit and scope of the present invention. The sub-coupling elements 2718.1 through 2718.*m* may be similar and/or dissimilar to each other. The configuration and arrangement of the sub-coupling elements 2718.1 through 2718.*m* as shown in FIG. 27 is for illustrative purposes only. Those skilled in the relevant art(s) will recognize that the sub-coupling elements 2718.1 through 2718.*m* may be configured and arranged within the coupling element 2714 differently without departing from the spirit and scope of the present invention.

The sub-coupling elements 2718.1 through 2718.*m* substantially increase likelihood that the coupling element 2714 will proximity couple to the coupling elements 2708.1 through 2708.*n* by providing diversity to the coupling element 2714. For example, at least two of the sub-coupling elements 2718.1 through 2718.*m* are physically separated from each other to provide spatial diversity to the coupling element 2714. As another example, at least two of the sub-coupling elements 2718.1 through 2718.*m* may be characterized as having different radiation patterns to provide pattern diversity to the coupling element 2714. As a further example, at least two of the sub-coupling elements 2718.1 through 2718.*m* may be characterized as having different polarizations, such as orthogonal polarizations to provide an example, to provide polarization diversity to the coupling element 2714. As a yet further example, at least two of the sub-coupling elements 2718.1 through 2718.*m* may include any combination of the aforementioned features to provide spatial diversity, pattern diversity, and/or polarization diversity to the coupling element 2714

The coupling element 2174 provides the various analog signals, digital signals, power signals, and/or any other suitable electrical signal that will be apparent to those skilled in the relevant art(s) without departing from the spirit and scope of the present invention as observed to the wireless automatic test equipment 2710 for processing. For example, the wireless automatic test equipment 2710 may determine various signal metrics, such as a mean voltage and/or current level, an average voltage and/or current level, an instantaneous voltage and/or current level, a root mean square voltage and/or current level, a mean power, an average power, an instantaneous power, a root mean square power, a frequency, a phase and/or any other suitable signal metric that will be apparent to those skilled in the relevant art(s) without departing from the spirit and scope of the invention, of the various signals as observed by the coupling element 2174.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. An integrated circuit, comprising:
    a first group of functional modules formed onto a first arrangement of useable fabrication layers in a horizontal direction;
    a second group of functional modules formed onto a second arrangement of useable fabrication layers in the horizontal direction, wherein the first arrangement of useable fabrication layers and the second arrangement of useable fabrication layers are stacked in a vertical direction to form a vertical arrangement, the vertical direction being normal to the horizontal direction; and
    a first conductive element formed within the first arrangement of useable fabrication layers and extending in the vertical direction, the first conductive element extending through the first arrangement of useable fabrication layers, and
    a second conductive element formed within the second arrangement of useable fabrication layers and extending in the vertical direction, the second conductive element contacting the first conductive element and extending through the second arrangement of useable fabrication layers,
    wherein the integrated circuit is configured and arranged to be displaced from a second integrated circuit having a third conductive element such that the first conductive element, the second conductive element, and the third conductive element are configured and arranged to form an integrated waveguide.

2. The integrated circuit of claim 1, wherein the first and the second arrangements of useable fabrication layers comprise:
    a diffusion layer and a polysilicon layer to form components of the first group of functional modules; and
    a conductive layer to form interconnections between the components.

3. The integrated circuit of claim 1, wherein the first arrangement of useable fabrication layers is interdigitated with a plurality of insulation layers, and
    wherein an insulation layer from among the plurality of insulation layers is coupled to a useable fabrication layer from among the second arrangement of useable fabrication layers to form the vertical arrangement.

4. The integrated circuit of claim 1, wherein the first and the second arrangements of useable fabrication layers are coupled together using a physical connection.

5. The integrated circuit of claim 1, wherein a first portion of the first conductive element is formed within the first arrangement of useable fabrication layers and a second portion of the first conductive element is formed within the first arrangement of useable fabrication layers, the first portion being coupled to the second portion to form the first conductive element.

6. An integrated circuit, comprising:
   a first group of functional modules formed onto a first arrangement of useable fabrication layers of a first semiconductor substrate;
   a second group of functional modules formed onto a second arrangement of useable fabrication layers of a second semiconductor substrate, the first arrangement of useable fabrication layers being coupled to the second arrangement of useable fabrication layers to form a vertical arrangement; and
   an integrated waveguide, formed laterally adjacent to the first and the second groups of functional modules and extending through the vertical arrangement in a vertical direction parallel to the first arrangement of useable fabrication layers and the second arrangement of useable fabrication layers of the vertical arrangement, configured to communicatively couple the first and the second groups of functional modules.

7. The integrated circuit of claim 6, wherein the integrated waveguide comprises:
   a first conductive element communicatively coupled to the first group of functional modules; and
   a second conductive element communicatively coupled to the second group of functional modules.

8. The integrated circuit of claim 7, wherein the first and the second conductive elements are configured and arranged to form a first parallel plate and a second parallel plate, respectively, and
   wherein the first parallel plate and the second parallel plate are configured and arranged to form a parallel plate waveguide.

9. The integrated circuit of claim 8, wherein the first conductive element comprises:
   a plurality of phase openings.

10. The integrated circuit of claim 9, wherein the plurality of phase openings are configurable to be opened or closed to dynamically configure operating characteristics of the integrated waveguide.

11. The integrated circuit of claim 10, wherein the first group of functional modules comprises:
   a waveguide controller module configured to control whether each of the plurality of phase openings are to be opened or closed.

12. The integrated circuit of claim 7, wherein the first and the second conductive elements are characterized as being separated by a cavity region.

13. The integrated circuit of claim 7, wherein the cavity region is a region between the first conductive element and the second conductive element that is free of conductive material.

14. A Multichip Module (MCM), comprising:
   a first integrated circuit including a first group of functional modules formed in a horizontal direction onto a first arrangement of useable fabrication layers of the first integrated circuit and a first conductive element, the first conductive element being formed in a vertical direction, normal to the horizontal direction, within the first arrangement of useable fabrication layers of the first integrated circuit; and
   a second integrated circuit including a second conductive element, the second conductive element being vertically formed in the vertical direction within a second arrangement of useable fabrication layers of the second integrated circuit,
   wherein the first integrated circuit is configured and arranged to be displaced from the second integrated circuit such that the first conductive element is communicatively coupled to the second conductive element to form an integrated waveguide.

15. The MCM of claim 14, wherein the first arrangement of useable fabrication layers comprises a first set of useable fabrication layers and a second set of useable fabrication layers,
   wherein the first group of functional modules is formed onto the first set of useable fabrication layers of the first arrangement of useable fabrication layers; and
   wherein the first integrated circuit further includes:
      a second group of functional modules formed onto the second set of useable fabrication layers of the first arrangement of useable fabrication layers, the first set of useable fabrication layers being coupled to the second set of useable fabrication layers to form a vertical arrangement.

16. The MCM of claim 15, wherein a first portion of the first conductive element is formed within the first arrangement of useable fabrication layers and a second portion of the first conductive element is formed within the first arrangement of useable fabrication layers, the first portion being coupled to the second portion to form the first conductive element.

17. The MCM of claim 14, wherein the first and the second integrated circuits are configured to communicate with each other using a multiple access transmission scheme.

18. The MCM of claim 14, wherein the first and the second integrated circuits are configured to wirelessly communicate with each other using the integrated waveguide.

* * * * *